(12) United States Patent
Tümer et al.

(10) Patent No.: US 7,868,665 B2
(45) Date of Patent: Jan. 11, 2011

(54) INTEGRATED CIRCUIT AND SENSOR FOR IMAGING

(75) Inventors: Tumay O Tumer, Riverside, CA (US); Martin Clajus, Los Angeles, CA (US); Robert F Calderwood, Riverside, CA (US); Gerard Visser, Bloomington, IN (US)

(73) Assignee: Nova R&D, Inc., Riverside, CA (US)

( * ) Notice: Subject to any disclaimer, the term of this patent is extended or adjusted under 35 U.S.C. 154(b) by 839 days.

(21) Appl. No.: 10/378,664

(22) Filed: Mar. 5, 2003

(65) Prior Publication Data
US 2004/0017224 A1 Jan. 29, 2004

Related U.S. Application Data

(60) Provisional application No. 60/361,330, filed on Mar. 5, 2002.

(51) Int. Cl.
*H03B 17/00* (2006.01)
*G06F 11/00* (2006.01)

(52) U.S. Cl. .............................. 327/70; 327/51; 327/69; 327/509

(58) Field of Classification Search .................... 327/70, 327/71, 51, 77, 80, 94, 69, 18, 509–515; 250/328
See application file for complete search history.

(56) References Cited

U.S. PATENT DOCUMENTS 4,131,798 A * 12/1978 Reddy et al. ................. 250/328
4,751,390 A * 6/1988 Kopp ..................... 250/370.06
5,696,458 A 12/1997 Tümer et al.
6,150,849 A * 11/2000 Tumer ......................... 327/70
6,333,648 B1 12/2001 Tümer
6,737,627 B2 * 5/2004 Moses et al. ............. 250/208.1

FOREIGN PATENT DOCUMENTS

JP 409005445 A * 1/1997

OTHER PUBLICATIONS

He, Z., et al., "3-D position sensitive CdZnTe gamma-ray spectrometers," *Nuclear Instruments & Methods in Physics Research*, A 422, 1999, pp. 173-178.

(Continued)

*Primary Examiner*—Dinh T. Le
(74) *Attorney, Agent, or Firm*—Fish & Associates, PC

(57) ABSTRACT

New sensors and different embodiments of multi-channel integrated circuit are provided. The new high energy and spatial resolution sensors use both solid state and scintillator detectors. Each channel of the readout chip employs low noise charge sensitive preamplifier(s) at its input followed by other circuitry. The different embodiments of the sensors and the integrated circuit are designed to produce high energy and/or spatial resolution two-dimensional and three-dimensional imaging for widely different applications. Some of these applications may require fast data acquisition, some others may need ultra high energy resolution, and a separate portion may require very high contrast. The embodiments described herein addresses all these issues and also other issues that may be useful in two and three dimensional medical and industrial imaging. The applications of the new sensors and integrated circuits addresses a broad range of applications such as medical and industrial imaging, NDE and NDI, security, baggage scanning, astrophysics, nuclear physics and medicine.

36 Claims, 32 Drawing Sheets

OTHER PUBLICATIONS

Kravis, Scott D., et. al., "A multichannel readout electronics for nuclear application RENA) chip developed for position sensitive solid state detectors," *Nuclear Instruments & Methods in Physics Research*, A 422, 1999, pp. 352-356.

Mainprize, James G., et al., "Image Quality of a Prototype Direct Conversion Detector for Digital Mammography," *Society of Photo-Optical Instrumentation Engineers*, 1999.

Yin, Shi et al., "Hybrid Direct Conversion Detectors for Digital Mammography," Presented at IEEE Nuclear Science Symposium in 1998 Published Dec. 1999.

Mainprize, James et al., "Design Consideration sfor a CDZNTE Digital mammography System," Presented at the International Workshop on digital mammography, Nijmegen, Netherlands, Jun. 1998.

Kravis, Scott D., et al., "Test Results of the Readout Electronics for Nuclear Applications (RENA) Chip Developed for Position-Sensitive Solid State Detectors," *SPIE* (Society of Photo-Optical Instrumentation Engineers), vol. 3445, Jul. 1998, pp. 374-382.

Matteson, James L., "Position-sensitive CZT detector module," *SPIE* (Society of Photo-Optical Instrumentation Engineers), vol. 3446, Jul. 1998, pp. 192-201.

Yin, Shi et al., "A Low-Dose High Contrast Digital Mammography System (DigiMAM)," Presented at IEEE meeting, Toronto, Canada, Nov. 1998.

Henry, Justin, et al., Solid State X-Ray Detectors for Digital mammography,: *Physics of Medical Imaging*, (Presented at SPIE—The International Society for Optical Engineering, Feb. 1995, pp. 392-401, vol. 2432.

Bird, A.J., et al., "Images obtained with a compact gamma camera," *Nuclear Instruments & Methods in Physics Research*, A 499, 1990, pp. 480-483.

* cited by examiner

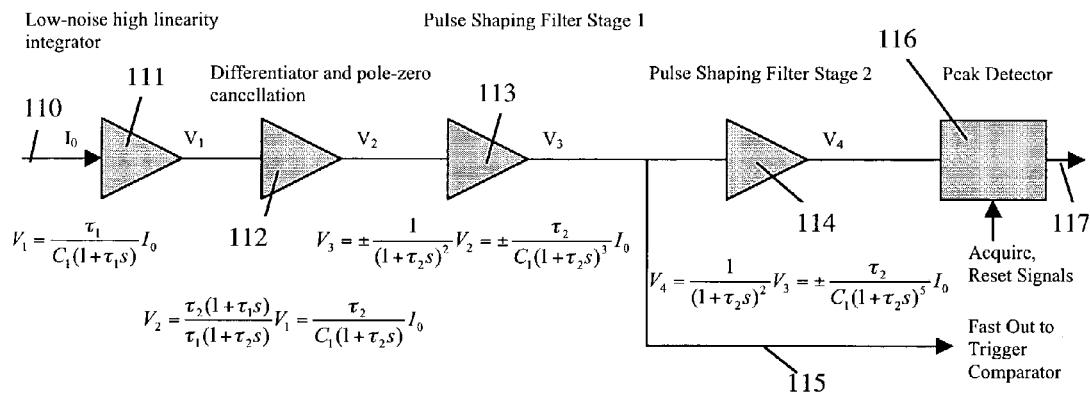

Input Signal Characteristics (One Typical Case):
$I_0 = I_{dc} + I_n + I_s$
$-100$ pA $< \pm I_{dc} < 5$ nA
$I_n$ : white noise, amplitude $< 20$ fA/√Hz
$I_s = \pm ( (\varepsilon Q/\tau_e)(\Theta(t-t_0) - \Theta(t-t_0-\tau_e)) + ((1-\varepsilon)Q/\tau_h)(\Theta(t-t_0) - \Theta(t-t_0-\tau_h)) )$ *(this is the signal for a single event occuring at time $t_0$)*
$\tau_e$ (electron collection time constant) ≈ 50 ns *(a 2mm planar CdZnTe detector @ 300 V)*
$\tau_h$ (hole collection time constant) ≈ 550 ns *(a 2mm planar CdZnTe detector @ 300 V)*
$\varepsilon$ (electron fraction of signal charge) : independent random number $0 < \varepsilon < 1$, approximately uniform distribution *(worst case)*
$t_0$ (time of event) : these are random (following a Poisson process), average rate $\lambda < 10$ kHz per channel
$Q$ (signal charge) : $0 < Q < $ FSR; *the purpose of the ASIC is to measure this $Q$ for each event, as best as possible*

Notes:
1. At $V_1$ (and other internal nodes of the first two stages, the signal components due to $I_{dc}$ and $I_n$ may be comparable to or larger than that due to $I_s$). Therefore linearity is critical.
2. The input node is loaded with a capacitance $C_d$ to ground, $0 < C_d < 50$ pF.
3. Signal polarity selection is shown in the third stage, for example. It could be elsewhere, before the peak detector and trigger pick-off.
4. The purpose of this ASIC is to measure Q for each event, in so far as possible producing an answer independent of $I_{dc}$, $t_0$, $\varepsilon$, $\lambda$, and the noise sources, including $I_n$ as well as any internal noise sources.
5. Measurement of Q proceeds by read-out of the peak detector at some time after the event time $t_0$ (followed by reset of the peak detector as promptly as feasible).

FIG. 11

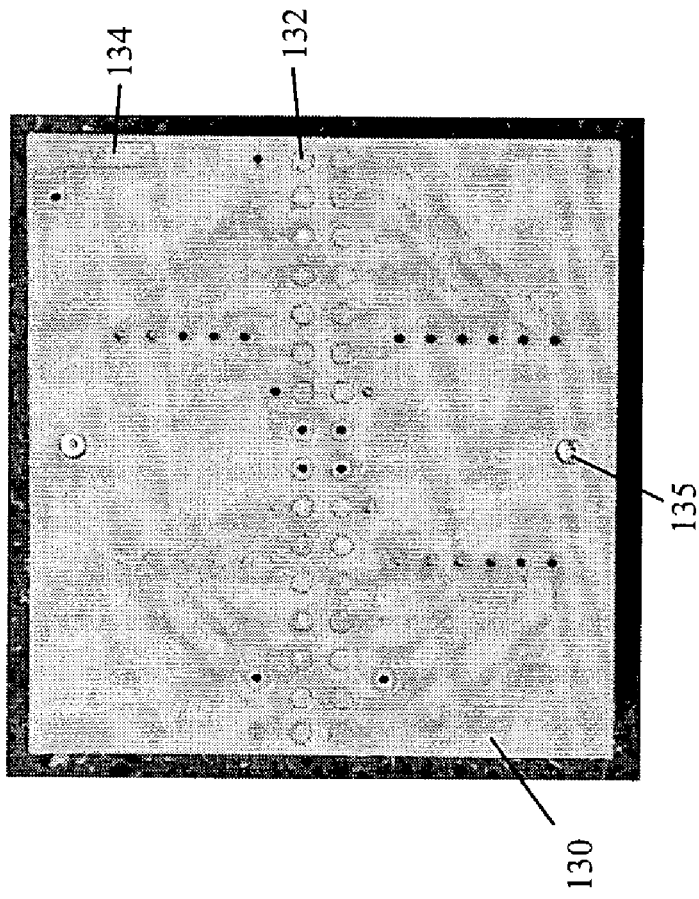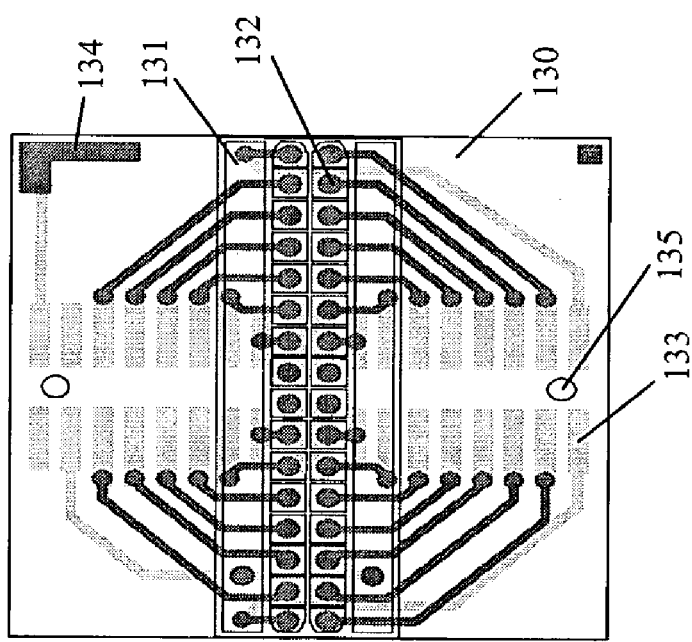
FIG. 14

US 7,868,665 B2

INTEGRATED CIRCUIT AND SENSOR FOR IMAGING

CROSS REFERENCE TO PROVISIONAL PATENT APPLICATION

This application claims the benefit of the filing date of U.S. Provisional Patent Application No. 60/361,330 filed Mar. 5, 2002, the disclosure of which is incorporated herein by reference. It also references previous U.S. Pat. Nos. 5,696,458, 6,150,849 and 6,333,648 by the inventor. The entire disclosure of those related applications are incorporated herein by reference for all purposes.

GOVERNMENT RIGHTS NOTICE

There invention was made with U.S. Government support under Contract Numbers DAMD 17-98-8137, DAAE30-02-C-1015 and DAAE30-02-C-10270, which are awarded by Department of Defense. The U.S. Government has certain rights in the invention.

FIELD OF THE INVENTION

There is need for high spatial and energy resolution photonic sensors and integrated circuits (IC) are needed to produce imaging. Scintillation counters read out by individual photomultiplier tubes has limitations in both spatial and energy resolution. Therefore, there is need for high resolution imaging solid state sensors, as increasingly sophisticated and higher resolution detectors are needed. These new imaging sensors with large number of channels require monolithic, compact, low noise and multi-channel integrated circuits for reading out the sensors. The integrated circuit needs to be capable of matching the energy resolution coming from the detectors. A new low noise multi-channel integrated circuit has been developed which can read out high-resolution, position-sensitive sensor arrays. The developed integrated circuits have low noise, an accurate timing output and a wide dynamic range. A new embodiment is also used to produce two-dimensional detector for producing ultra high resolution imaging. The new integrated circuit and the sensor can be used in astrophysics, nuclear medicine and physics, radiography, radiology, security, nondestructive testing (NDT), nondestructive evaluation (NDE), nondestructive inspection (NDI), medical and industrial imaging, etc.

The technical viability of this approach has already been demonstrated by NOVA R&D, Inc., through its current RENA (Readout Electronics for Nuclear Application) and MARY (MAmmogRaphY) chip which have been used successfully with detectors such as CdZnTe (CZT), CdTe, GaAs, Se, Si, and Si(Li) detectors as well as gas microstrip detectors. The new Integrated Circuits (ICs) also called Application Specific Integrated Circuits (ASICs) and sensors have several different embodiments and through these new embodiments brings the state-of-the-art to a new much more advanced level. It also achieves ultra high energy and spatial resolution.

The demand for high-performance integrated, multichannel front-end and readout electronics is commensurate with the increasingly stringent detection requirements of many new NASA missions and experiments. Important instrumentation segments that the developed new Application Specific Integrated Circuits (ASICs) and sensors hope to serve are those of advanced hard x-ray and gamma-ray telescopes and x-ray and gamma ray astrophysics in general. Certain experiments in cosmic ray astrophysics would also benefit from specific design features of the new ICs and the sensor arrays.

The new ASICs and sensors can be used in NASA missions such as the planned Advanced Compton Telescope (ACT), a high-priority space-based instrument, is intended to achieve significantly enhanced sensitivities for gamma rays in the 200 keV-30 MeV range. Others are the Minute-of-Arc Resolution Gamma Imaging Experiment (MARGIE) and the Energetic X-ray Imaging Survey Telescope (EXIST).

The new versatile ASICs with wide range of features can help in advancing the present knowledge of the fluxes of energetic charged particles in space and their production mechanisms and understanding the ways in which these particles are energized and transported throughout the universe. This is fundamentally important for understanding how the cosmos functions. The new ASIC will both enable and enhance new investigations of energetic charged particles by NASA's science missions. Instruments incorporating the new sensors and the ICs will be much less resource-intensive than their present-day predecessors. Replacement of the usual many strings of charge amplifier circuitry with a single chip saves volume, weight, and power. New missions, such as the miniaturized spacecraft being planned, will be greatly enhanced in their ability to measure energetic particles using the new technology. Instruments with superior measurement capabilities will also be enabled. The new chips and sensors will allow a new generation of space flight instruments to have a large impact on imaging and understanding of x-rays, gamma rays and energetic charged particle fluxes in space.

The new chips and sensors discussed in this report can also be used for many other applications such as nuclear physics; nuclear chemistry; nuclear medicine; medical and industrial radiography; x-ray and gamma ray imaging; nondestructive evaluation (NDE) and nondestructive inspection (NDI) applications; and baggage, container, vehicle, mail, etc. scanning for security and other reasons. Medical imaging applications include high resolution solid state gamma camera, molecular imaging systems, biological imaging, living tissue and cell imaging, Positron Emission Tomography (PET) and Single Photon Emission Computed Tomography (SPECT) based on the solid state gamma camera concept and other embodiments. Other medical imaging applications include small compact gamma camera and SPECT for small organ imaging such as breast and thyroid and/or metabolic imaging of small animals. Industrial applications include mainly NDE and NDI. Security applications include high resolution baggage, container and vehicle imaging.

The new sensors can also be fabricated using scintillators, such as CsI, CsI(TI), CsI(Na), NaI(TI), NaI, BGO, LSO, etc. This new embodiment increases the usefulness of these sensors and enlarge their range of application. The new embodiments for the sensors may use the same or a modified version of the ASICs developed.

BACKGROUND OF THE INVENTION

Over the past several years, solid state detectors such as silicon strip detectors have revolutionized high energy and nuclear physics research. The progress and demand for silicon strip detectors also increased in other fields where their potential high resolution detection capability became apparent. Silicon is an excellent high resolution detector for lower energy photons, such as a few eV to about 50,000 eV. Although an excellent detector, silicon, with an atomic number (Z) of 14, does not have good quantum efficiency for higher energy x-rays and gamma rays. Therefore, recently a significant amount of research has been carried out to develop high-Z strip and pixel detectors for use with applications, which need to image photons and particles with energies 1,000 eV to 10,000,000 eV. Out of this work, six detector materials have become the potential front runners, Germanium (needs cryogenic cooling), CdZnTe, CdTe, HgI$_2$, Se, and GaAs (both can be used at or near room temperature). A newcomer to the field, with very high Z, is PbI$_2$. These materials provide high detection efficiency for x-ray energies in the 10 to 1,000 keV range with detector thickness of about 0.5 to 15 mm. One positive effect of this small thickness is that depth effects, which degrade position resolution for radiation coming in at an angle, are minimized. Consequently, these high-Z detectors are now routinely manufactured with strip or pixel sizes in the mm to sub-mm-range. Such high spatial and energy resolution two-dimensional x-ray and gamma ray sensors are expected to become the standard in the future.

Although strongly promising high-Z position sensitive solid state detectors were developed, an essential component to make them viable instruments for detecting and imaging x-rays, gamma rays and particles has been missing. Such detectors have many channels with small pitch, and reading them out with conventional discrete or hybrid electronics is not a viable option. These detectors require monolithic multichannel readout electronics to handle both the high number of channels and small pitch. Such ASIC chips, e.g., the Amplex (CERN) and SVX (LBNL) chips, have been developed for accelerator-based high energy physics experiments. However, these chips lack two major functions, which are not needed for those experiments but render the chips mostly unsuitable for use in nuclear physics, astrophysics, and medical and industrial imaging:

1. They do not have a self trigger output. In high energy physics experiments, an external machine trigger is available to inform the data acquisition (DAQ) system about the exact time of an event for reading out the chips. In addition, the event trigger is typically based on the overall event topology rather than the signal levels in individual channels, which precludes its implementation on the readout chip.

2. The solid-state detectors for which these ASICs were developed provide position information only; the energy information is largely irrelevant as the particles of interest are all minimum ionizing. Consequently, such chips do not need to have low noise and thus high energy resolution capability.

By contrast, in space-based (high-energy) astrophysics as well as most medical and industrial imaging, the x-ray and gamma-ray photons and charged particles come randomly. In many applications, it is also important to measure the x-ray, gamma ray and particle energies with as high accuracy as possible. Therefore, the application of position sensitive solid state detectors to nuclear and astrophysics and to medical and industrial imaging was largely delayed as a suitable ASIC readout chip was not available. There have only been few exceptions such as the ACE chip used with silicon strip detectors on board the Advanced Composition Explorer (ACE) space mission. It is thus important to develop versatile ASICs for reading out solid state sensors for application to the above mentioned fields.

Previously we have developed a chip, called RENA (Readout Electronics for Nuclear Application) for a new scintimammography system. The RENA chip has been patented (U.S. Pat. Nos. 5,696,458, 6,150,849 and 6,333,648). This chip has reached a level where it was useful for imaging as well as physics research applications using various kinds of solid-state detectors; for example, it has been used successfully with silicon strip and CdZnTe pad detectors. The RENA chip is a 32-channel, mixed signal, low-noise, general purpose monolithic application specific integrated circuit (ASIC). It was developed as the front-end electronics chip for medical imaging such as gamma camera and SPECT (Kravis et al., 1999). Its dynamic range is 50,000 electrons. The chip has a self-trigger output so that random signals without an external trigger can be processed. It offers several different externally selectable integration (peaking) times to accommodate different charge collection times for different detectors. It has several readout and data acquisition modes for versatile implementation and for detailed diagnostic testing. The output signals from the 32 channels are multiplexed to a single analog output buffer under the control of the chip's readout section. Significant effort was spent to make RENA low noise ($\approx$150 e rms @ 0 pF input capacitance), but tests performed have indicated there are new ways to improve the noise. Also the RENA chip could only partially answer the requirements of many applications listed above. Therefore, a new ASIC, RENA-2, is developed, which can have different dynamic ranges and shaping (peaking) times, fast timing, low power consumption, lower noise, simplified user interface, and reduced channel-to-channel mismatch of the trigger levels, etc.

We describe here the new RENA-2 front-end readout ASIC designed to address these concerns and, also bring significantly more functionality. The RENA-2 ASIC can have different embodiments for different applications. We also describe new high resolution sensors that may use the new RENA-2 ASIC and its many different embodiments. The new sensors and new ASIC are designed to be versatile and, therefore, easy to be modified and optimized for different applications, have much lower noise and thus much improved energy and spatial resolution, enabling users to take advantage of the exceptional potential for high energy resolution that new sensors and detectors offer. Below the new sensors and the design and specifications of the new ASIC with its many embodiments will be discussed in detail.

SUMMARY OF THE INVENTION

The design of the ASIC is guided by two principal goals. The first goal was to make the chip applicable to as wide a variety of applications as possible; this called for a flexible yet easy to use design. It has the ability to combine, on the same chip, signals that differ in terms of their polarity, rise time, threshold requirements, etc. This option, which is not available on the present RENA chip, enables users to optimize their system layout for the shortest possible signal connections, without regard to signal type. This contributed to achieving the second goal, which is equal in importance to the first, namely performance, for example, to obtain the best resolution possible for the combined detector-readout system. To reach this goal, we have designed the RENA-2 ASIC to achieve the lowest possible noise consistent with the characteristics of the detectors with which the ASIC is intended to be used.

The RENA-2 ASIC can be used with Low atomic number (Z) detectors such as silicon and carbon (diamond) as well as high atomic number (Z) semiconductor detectors such as Ge, GaAs, Selenium, CdTe, CdZnTe, PbI$_2$, HgI$_2$, in multi-channel strip or pixel or other geometries to detect and image x-rays, gamma-rays and particles in the range of 100 eV to 100 MeV. Other applications include reading out detectors or instruments such as Photo Diodes, Avalanche Photo Diodes (APDs), amorphous silicon detector arrays, PMTs, multi anode PMTs (MAPMTs) and VLPCs.

The features include low-noise performance, self-trigger capability, several different peaking times, different readout modes, and the daisy-chain option. New innovative features, such as user-selectable dynamic ranges and the ability to provide channel-by-channel timing information, were added.

These new features, as well as the significant performance improvements required a completely new design for the new developed ASIC. The design goal for the noise performance, in particular, represents a significant improvement over the present RENA chip and substantial innovation was required in order to reach this goal. Innovation was even more urgently needed to achieve improved noise performance while reducing the chip's power consumption.

Some key specification requirements for the RENA-2 chip are shown in Table 1. For comparison, we also list the corresponding characteristics of the RENA chip. These requirements and proposed solutions for implementing the features listed in Table 1 are discussed below. Based on these requirements and solutions, a top-level design for the chip is drawn and shown in FIG. 1.

Table 1 shows the main specifications for RENA-2 ASICs. These features include the chip's low-noise performance, its self-trigger capability, and the versatility it offers by providing several different peaking times, different readout modes, and the daisy-chain option. New, innovative features include low noise, self resetting charge sensitive input amplifier, selectable multi-range shaper, user-selectable dynamic ranges, fast trigger output for coincident event detection and the ability to provide channel-by-channel time difference information. The comparator thresholds will be individually adjustable through an 8 bit DAC on each channel. This will allow accurate and uniform threshold setting throughout the detector. Two very important new features for space deployment are the adjustable power consumption by limiting the current flow to the input transistor and the radiation hardness inherent to the 0.5 micron CMOS process. The peaking times were made adjustable from about 0.4 to 40 microseconds, which makes the chip suitable for a wide range of detectors, from CdZnTe to $HgI_2$ as listed above. The new chip incorporates a pole zero cancellation circuit to handle large rates without significant pileup. The functionality of the new RENA ASIC is dramatically improved by eliminating unnecessary connections and interface. Another important new feature is the inclusion of 4 extra channels to allow the connection of the cathode side into the same ASIC. The input amplifier is made tolerant to leakage current so that the ASIC can be used DC coupled which eliminates the need to use capacitive coupling.

The RENA chip offers the user some flexibility by providing a variety of readout modes—sparse, nearest neighbor, and global readout. The nearest neighbor mode is quite useful to account for charge sharing in strip detectors or other essentially one-dimensional detector arrays. However, its successful application requires a monotonic mapping of detector strips to RENA channels, which is not always optimal from the point of view of interconnect capacitance or mechanical constraints. In addition, extension of the nearest neighbor mode to two-dimensional arrays, though equally desirable, is not possible, simply because there is no "natural" mapping from the four to eight nearest neighbors of a given pixel to the sequence of channels on the readout chip. Instead, RENA-2 provides the user with high flexibility that is the ability to specify which channels are to be read on a case-by-case basis. In this scenario, the readout pattern is controlled by a serial shift register with one bit per channel; if a bit is set, the corresponding channel is read out. Initially, when a channel triggers, the corresponding bit in the readout register is set. Before reading out the detector data, the control logic can inspect the trigger pattern and, if necessary, replace it with a different readout pattern. This operation can be completed in 2.3 µs (for 36 channel ASIC), regardless of the total system channel count, with a suitably designed external controller FPGA; it need not significantly compromise the dead time specification. The readout pattern can be a nearest neighbor pattern customized to the particular experimental setup. This gives significant flexibility for application to a variety of detectors of different configurations such as pixel and strip detectors.

TABLE 1

Key requirements and suggested features for the design of the RENA-2 ASIC. For comparison, the corresponding characteristics of the existing RENA ASIC are also listed.

| Specification | RENA-2 ASIC | RENA ASIC |
|---|---|---|
| Signal range | Two full-scale ranges; 50 and 250 ke, selectable for each channel (Other ranges are possible.) | Fixed, typically 50 ke full scale |
| Input polarity | + or − (Selectable channel-by-channel) | + or − (Selectable for the whole ASIC) |
| Number of channels | 36 Channels (Extra channels added to allow connection of the cathode electrode) | 32 Channels |
| Noise | Minimize noise (18 aC (112 e) rms in the 9 fC signal range and 45 aC (280 e) rms in the 53 fC range) | Minimize noise |
| Noise optimization | 2 pF and 9 pF detector capacitance | 6 pF detector capacitance |
| DC leakage current | Minimize effects and to be tolerant | Not allowed above pico Amps region |
| Power consumption | Adjustable. (Minimize power through adjustments to the current supplied to parts of the circuit) | Not adjustable but designed to be reasonable |
| Fast timing output | Low jitter (Minimize jitter as far as possible) | Not available |
| Channel-to-channel time difference | Implemented | Not implemented |
| Input amplifier resistive feedback | Fixed resistance with or without resistance multiplier and/or MosFET based resistance | None |
| Trigger comparator thresholds | Individually adjustable by internal 8 Bit DACs for each channel | Externally adjustable for the whole chip |
| Peaking times | 0.4 to 40 microseconds in 16 steps | 0.4 to 6 microseconds in 8 steps |
| Fast count rates | Using pole zero cancellation | Not available |
| Detector structure | Heterogeneous (or homogeneous) | Homogeneous |
| Key gamma signals | 1 keV, 6 keV, 14 keV, 60 keV, 141 keV, 511 keV, 662 keV, 1.33 MeV and up to 10 MeV | 14 keV, 60 keV, 141 keV |
| System components | Pipeline A/D converter, FPGA state machine controller, data FIFO | A/D converter or PC-based A/D board, control software on PC or microcontroller |
| Interface | Minimum pin count and support component count | Simple protocol |
| Readout mode | Maximum flexibility through hit register | Simple protocol |
| Dead time per event | Minimize as far as reasonable (Reset is much faster.) | Not minimized |
| Radiation tolerance | Minimize radiation damage effect about 0.1 to 1 MRad | Not considered |

BRIEF DESCRIPTION OF THE DRAWINGS

FIG. 11 is a block diagram of the typical signal characteristics and analog signal processing of the RENA-2 chip.

FIG. 14 is a detector carrier substrate design: layout drawing (left) and photograph of the top (detector) side of the substrate (right). In the layout, the dark color represents the top substrate metal and the light color represents the bottom substrate metal and connector solder pads as viewed from the top. The crystal outline and its bottom metallization are also clearly seen.

DESCRIPTION OF THE PREFERRED EMBODIMENTS

Figure 1:
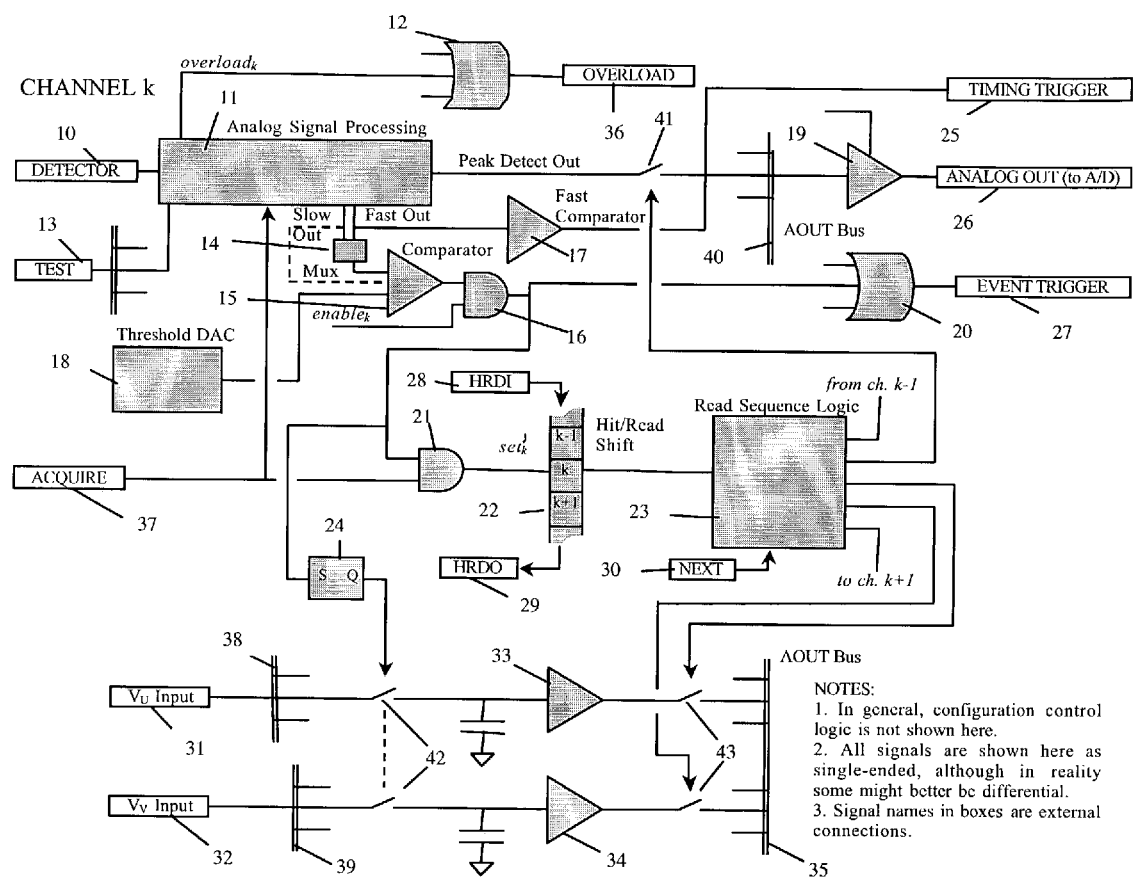
FIG. 1 is a preliminary block diagram of the developed new ASIC. Only one channel (channel k) is shown; connections to adjacent channels are indicated where applicable; the slow and fast signals are shown multiplexed here but in one embodiment separate comparators can be used for the slow and fast signals from the analog section.

Referring to the ASIC described in FIG. 1 a detector 10 is connected to the input of the ASIC and the input goes to an analog signal processing unit 11. The FIG. 1 shows only one of the analog channels of the ASIC, the k channel. Analog processing unit is described below. Peak detector output of the analog signal processing unit 11 goes to analog output buffer amplifier 19 through a switch 41 controlled by read sequence logic 23. The peak detect output is also attached onto a bus 40 before it enters analog output buffer 19. Analog output is made available to the outside world as an output 26 of the ASIC. A test input 13 is used to test the analog signal processing unit. An overload sensing element 12 is connected to the analog signal processing unit 11. Output of the overload sensor 36 is provided to outside world as an output of the ASIC.

Analog signal processing unit 11 outputs a slow and fast shaper signal during processing of the signal from the detector 10 which go into a multiplexer 14. Output of the multiplexer 14 goes into a comparator 15. In another embodiment shown in dotted lines the fast shaper output goes separately into a fast comparator 17, whose output goes out to the outside world as the timing trigger output 25. Similarly the slow shaper output from the analog processing unit 11 goes separately to the comparator 15. The threshold of comparator 15 is adjusted through threshold DAC 18. The threshold DAC 18 is set by the external control computer through the configuration control logic, not shown. The output of the comparator 15 is gated (or AND circuit) 16 by using an enable$_k$ signal. The output of the gate 16 goes to an OR circuit 20. The gated comparator 16 outputs from other analog channels also come to the OR circuit 20. The output of the OR circuit is send outside the ASIC as the event trigger 27. The output of the gate 16 also goes to the gate 21 and flip flop 24 which controls the switches 42.

An acquire 37 signal is sent by the data acquisition computer to the ASIC. This signal is routed inside the ASIC to analog signal processing unit 11 and to hit/read shift register 22 through a gate 21. The gate or AND circuit 21 is controlled by the output of the gated comparator 16. The output of the gate 21 is used to set the $k^{th}$ channel of hit/read shift register (signal is called $set_k$) when there is signal in that channel from the detector 10 which has produced a trigger signal comparator 15 and gate 16. The hit/read shift register is controlled by external signals HRDI 28 (hit/read data input) and HRDO 29 (hit/read data output). The output of the hit/read shift register 22 goes to read sequence logic 23. The read sequence logic circuit is controlled externally through an external signal NEXT 30 and also in general through configuration control logic not shown. Read sequence logic controls all the other channels similar to the $k^{th}$ channel shown in FIG. 1. Read sequence logic 23 also controls the switches 43 which control the output of the time difference measurement circuit as explained below.

There is a time difference measurement circuit, which measures the difference of the arrival time of detector 10 signals at each channel. This circuit has two sign wave inputs $V_U$ Input 31 and $V_V$ Input 32. The phase of these two sign waves are at an angle, such as 90 degrees, to each other. These inputs are common to all channels and enter a bus 38 for $V_U$ Input 31 and bus 39 for $V_V$ Input 32. This bus distributes the sign waves to all the channels. At each channel flip flop 24 controls the switches 42 which allow the sign waves to charge separate capacitors at the input of amplifiers 33 and 34. The amplifier circuits 33 and 34 produce a voltage level at its output depending on the time the switches 42 are closed. If voltage levels from different channels which had data output by the amplifiers 33 and 34 for each channel are compared then a relative arrival time difference between the ASIC channels can be determined. The output of the amplifiers 33 and 34 go to a readout bust 35 through switches 43 controlled by the read sequence logic circuit 23.

In FIG. 1 the configuration control logic circuit 23 is not shown. This is a digital circuit which controls the ASIC analog data readout. All the signals shown in FIG. 1 are single ended. However, in the ASIC some of these are made differential when ever necessary.

Figure 2:
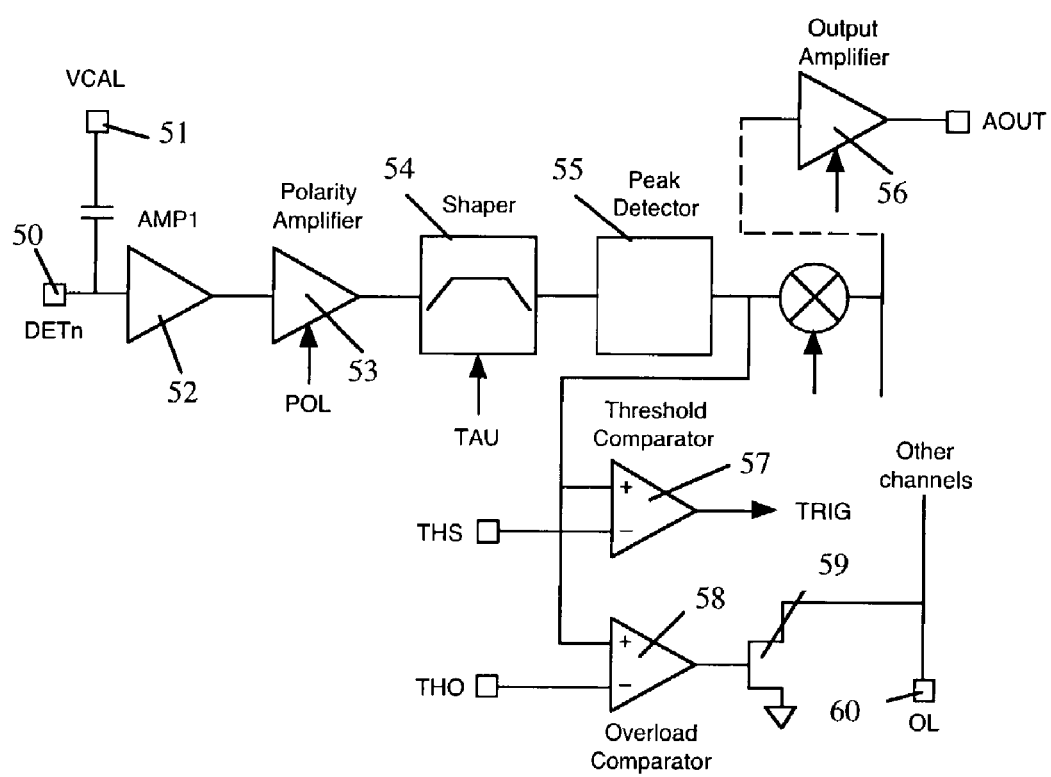
FIG. 2 is a block diagram of the analog section of the RENA chip

The analog circuit inside the analog signal processing unit 11 is similar to given in FIG. 2. It contains a detector input 50, test input 51, shaper 54, peak detector 55, overload comparator 58. The other comparators 15 and 17 are already discussed above. There may be a polarity amplifier 53 or other buffer amplifiers such as polarity amplifier 53. There is also a pole zero circuit after input amplifier 52 or anywhere else in the chain if better, not shown. The pole zero circuit can be switched on or off as necessary. Pole zero circuit reduces the pile up effect and thus increases the ASIC throughput rate.

Figure 3:
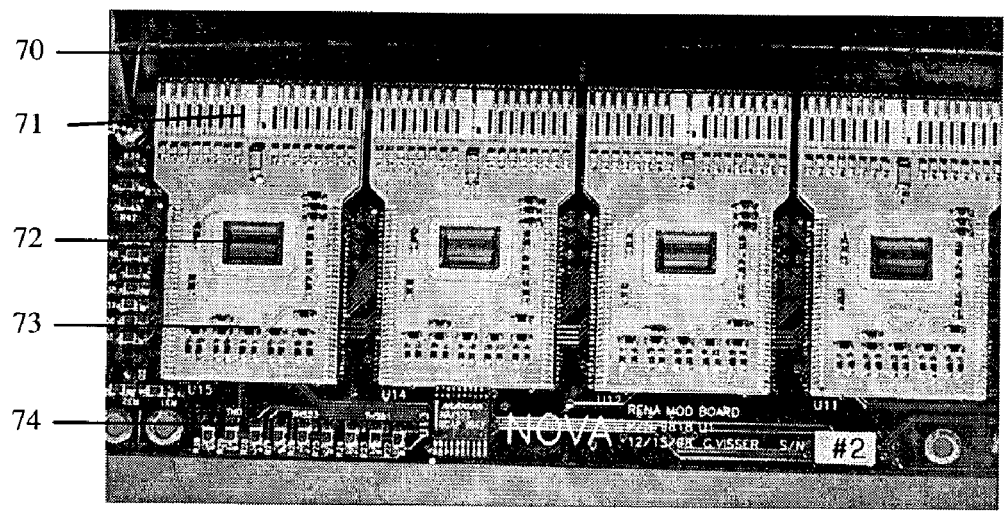
FIG. 3 is four RENA hybrids mounted onto a printed circuit board. The resistors and capacitors are mounted onto or fabricated on the ceramic carrier to produce high quality AC coupling to the detector channels.

The RENA chips are shown in FIG. 3. The detectors 70 are mounted on the end of the chip carrier 73 through coupling capacitors 71. The RENA chip 72 is mounted on the chip carrier 73. The chip carrier is mounted on top of the printed circuit board 74. The whole system shown in FIG. 3 forms a imaging detector unit with a total of 128 pixels, 4×32 array.

Figure 4:
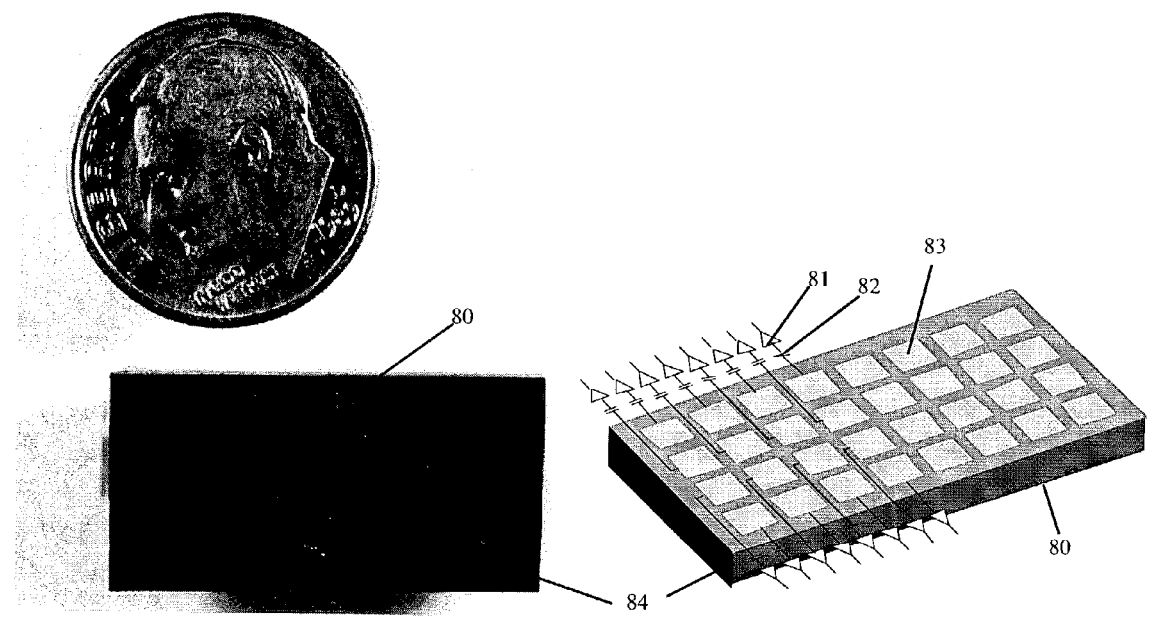
FIG. 4 is a CdZnTe 8×4 two dimensional pad detector array used to obtain the x-ray spectra as described in the text. Pad pitch is 3×3 mm.

FIG. 4 shows the CdZnTe 84 detector 80 used. The 4×8 array of pixels 83 are shown. The pixels are connected to the input of the ASIC input amplifier 81 through capacitive coupling 82. In RENA-2 due to self resetting type of input amplifier there will be no need for capacitive coupling 82 for most detectors and DC coupling will be used.

The signal range needs to be adjusted to meet the requirements of the various sensors that we intend to use with the RENA-2 chip. Different experiments may need widely varying energy ranges. We have implemented an adjustable signal range on the RENA-2 chip. One way to do this is to make the circuit components that control the signal range to be switchable. The two ranges built in are 9 fC and 53 fC, corresponding to photon energies of 250 keV and 1.5 MeV in CdZnTe (CZT), respectively (based on the typical energy of 4.4 eV required to create one electron-hole pair in CZT). The switching between the two ranges will be controlled, on a channel-by-channel basis, by an on-chip control register.

The RENA-2 readout chip is designed to have significantly lower noise and thus much improved energy resolution compared to the present RENA. This is an important and essential improvement that will significantly enhance the chip's usefulness for all kinds of applications. We designed for input-referred noise values of approximately 18 aC (112 e) rms in the 9 fC signal range and 45 aC (280 e) rms in the 53 fC range, for dynamic ranges of 500 and 1200, respectively. In order to accomplish the latter goal over the wide range of detector capacitances, we incorporated into the design two selectable different widths for the input transistor, for the noise optimization, using a control bit (again on a channel-by-channel basis). The new chip is optimized for the noise level for detector capacitances of 2 pF and 9 pF, respectively. With the lower detector capacitance, we expect to achieve a somewhat improved noise performance in the 53 fC range compared to the value given above, possibly 35 aC (220 e) rms.

We have performed the following steps in the effort to optimize the energy resolution of the new ASIC.

1. Low-noise CMOS process with low 1/f noise is used.
2. The noise that may be injected by the peak/hold and digital electronics sections are minimized.
3. The design of the input amplifier and the shaper amplifiers are improved.
4. Reducing the gain of the input amplifier also can improve its tolerance of DC input current.
5. A self resetting type input amplifier is designed to increase tolerance to detector leakage current. This eliminates the need for AC coupling and consequently higher capacitance (and therefore higher noise), as well as errors due to recovery of the AC coupling network from prior events.
6. The silicon layout is improved so that it would make the analog section less susceptible to cross talk from the rest of the circuit and also to external noise pickup.
7. To further remedy the effect of baseline differences, we have used a DAC on each channel to set the threshold. The full-scale range of the threshold DACs is given by a reference voltage common to all channels (VTR in FIG. 1). This adds flexibility by allowing the DAC range and resolution to be adjusted to the requirements of specific experiments.

The dynamic range is adjustable or selectable to meet the requirements of the various sensors that we intend to use with the new readout chip. Different experiments may need different energy ranges. The dynamic range is made adjustable for the new chip. One way to do this is to make the circuit components that control the dynamic range to be switchable. Other options, such as controlling the dynamic range through an externally supplied voltage or current, is also possible.

One factor that currently limits the RENA chip's dynamic range more than the noise itself is the lack of any possibility to adjust baseline levels between the channels or alternatively adjust the trigger thresholds to compensate for any baseline difference. This means that the effective trigger threshold, in terms of photon energy, will differ from channel to channel and will be limited by the channel with the highest baseline level. A significant contribution to the baseline differences could come from variations in charge injection in the process of resetting the signal channels after an event. The levels clamped to during the reset process have been found to vary significantly less from channel to channel than those observed after the release of the reset switches. By improving the reset circuitry, the variability of baseline levels will be reduced.

To further remedy the effect of baseline differences, we used a DAC on each channel to set the trigger comparator threshold. The full-scale range of the threshold DACs is given by a reference voltage common to all channels. This adds flexibility by allowing the DAC range and resolution to be adjusted to the requirements of different experiments. Similarly DACs will be used to set the thresholds for the fast trigger comparators, which will give the fast or time accurate low jitter trigger and/or timing signal output.

An important application field for the developed ASIC chip will be space-based astrophysics experiments, where power consumption is an important issue. The major part of the power is consumed in the input transistor. Therefore, the current flow into the input transistor is made externally adjustable, thus allowing the capability of reducing the power of the ASIC. A large current flowing in the input transistor is essential for the low noise response of the new chip. However, our design and layout changes aimed at further noise reduction (discussed above) do not involve increasing that current flow. Thus, developing the highest possible energy resolution for the new ASIC chip will allow us more room for compromise in cases where ultra-low noise is less important than low power consumption.

Throughout the rest of the analog and digital circuits, where lowering the power consumption will not affect the noise performance of the chip, we will develop circuits with lowest possible power consumption for the selected fabrication process. This will allow the development of the new ASIC specifically for space-based astrophysics and other power-critical applications.

Many sections of the chip such as each channel, channel to channel time difference circuit, fast trigger circuit are designed so that user can externally power down the unused sections of the circuit, that is their power can be cut to reduce the power dissipated by the chip. All these are essential for power critical applications such as space based detectors, where all unused features can be turned off to reduce the power consumption of the new ASIC.

Information about the signal timing is important in many experiments, especially when coincidence measurements (between separate interactions in different parts of the instrument or between signals from different electrodes of the same detector) are required. Therefore, we plan to record information related to signal timing and make it available for readout together with the pulse height data. Since we anticipate a wide variety of range and resolution requirements for the time information, it will not be practical to incorporate full-fledged time-to-digital (or time-to-amplitude) converters on the ASIC. We made each channel to produce a low jitter fast trigger signal output 25 using a fast comparator (discriminator), which is multiplexed to produce a single timing output or they may even be made available separately for each channel although this would require large number of signal pads. To take full advantage of this new feature, the trigger output jitter is improved to achieve high resolution signal timing. We did this by adding to the signal path a second, fast shaper with low jitter optimized for timing rather than energy resolution and using this shaper to generate the trigger signal. Alternatively, to avoid the increased die space and power consumption that this solution would require, the timing resolution can be improved by tapping the trigger signal off of the first shaper stage(s).

We have also incorporated into the design a channel to channel event arrival time difference measurement circuit. Two inputs are provided for two user-provided analog signals ($V_U$ and $V_V$) whose momentary values will be stored for readout in channel-specific sample-and-hold circuits whenever the respective channel's trigger comparator fires. The known time dependence of these external signals, which can be optimized for the specific application, can then be used to reconstruct the actual timing information. Examples of suitable external signals include sinusoidal waveforms, with a 90° phase difference to resolve ambiguities, or linear ramps that are initiated by the first channel trigger for any given event.

In the RENA-2 chip we have designed every channel separately and externally switchable to either input polarity; negative (electrons) or positive (holes). Placement of the polarity switch is changed from just after the charge sensitive amplifier 52 at the input to before, inside or after the peak hold (detect) 55 circuit.

In the RENA-2 chip we have designed several different types of feed back circuit for the charge sensitive input amplifier 52. The different feedback circuits incorporated into every channel can be selected by the user for application to different instruments and devices. These feedback circuits are:

1. Resistance placed internal or external to the ASIC.
2. Resistance multiplier placed internal to the ASIC.
3. Any type of resistance with an integrating capacitor placed internal or external to the ASIC.
4. A MOSFET transistor resistance circuit.
5. Integrating capacitor.
6. Any or all of the above feedback combinations with a reset switch.

The RENA chip offers the user some flexibility by providing a variety of readout modes-sparse, nearest neighbor, and global readout. The nearest neighbor mode is quite useful to account for charge sharing in strip detectors or other essentially one-dimensional detector arrays. However, its successful application requires a monotonic mapping of detector strips to RENA channels, which is not always optimal from the point of view of interconnect capacitance or mechanical constraints. In addition, extension of the nearest neighbor mode to two-dimensional arrays, though equally desirable, is not very practical, simply because there is no "natural" mapping from the four (or six, for a hexagonal detector array) nearest neighbors of a given pixel to the sequence of channels on the readout chip. Other schemes, such as reading out the (single) cathode of a detector whenever one of the anode pixels triggers (or vice-versa), are equally difficult to anticipate.

Instead, in the RENA-2 chip we have provided the user with the ability to specify which channels are to be read on a case-by-case basis. In this innovative new technique, the readout pattern is controlled by a serial shift register 22 with one bit per channel; if a bit is set, the corresponding channel is read out. Initially, when a channel triggers, the corresponding bit in the readout register is set. Before reading out the detector data, the user can then inspect the trigger pattern and, if necessary, replace it with a different readout pattern. This operation can be completed in 2.1 μs (for 32 channel ASICs), regardless of the total system channel count, with a suitably designed external controller FPGA; it need not significantly compromise the dead time specification. The readout pattern can be a nearest neighbor pattern customized to the particular experiment setup, a global readout (by setting every bit in the readout register), or any other pattern that may be needed for the specific situation. While it would seem at first glance that offering this mask read/write capability would increase the complexity of the ASIC's user interface, the opposite is actually true: The logic and interconnect resources required to implement the nearest neighbor mode alone, especially across multiple chips, is more complex than the readout shift register technique.

The RENA-2 chip can be also set up to automatically disable additional triggers about 50 ns or more delay after the initial trigger. This time delay is useful to allow multiple simultaneous or nearly simultaneous input signals of varying pulse height to reach the full pulse height for correct energy measurement.

In addition to the 32+4=36 signal channels, the RENA-2 chip has two analog-only isolation channels, one each on either end of the analog channel group. One or both of these isolation channels, can be used to measure correlated noise during an event and they also have test points where a probe can be used to have access to signals inside the analog channel at critical points.

In summary, we have developed a RENA-2 ASIC readout chip designed to accommodate a wide range of position sensitive or multi array solid-state x-ray and gamma ray detectors to be used in space-based astrophysics and/or in many other commercially important applications. Our main goal is to produce a readout system that will enable its user to take full advantage of the good energy resolution offered by these detectors. The result is a new ASIC chip optimally suited for space-borne astrophysics experiments, and medical and industrial imaging instruments that plan to image x-rays, gamma rays and charged particles with high energy and spatial resolution.

Test Results

The RENA chip is a charge-sensitive 32-channel mixed signal ASIC; its specifications are shown in TABLE 2. The present version has a dynamic range of 50,000 electrons and maximum output swing of 2 V. The input is single-ended with the input amplifier referenced to an external low-noise reference voltage. The output signals from the 32 channels are multiplexed to a single analog output buffer under the control of the chip's readout section.

A block diagram of the analog signal path for one of the 32 channels is shown in FIG. 2. The first stage of the signal path, AMP1, is a switched-reset integrator 52. The input amplifier 52 is designed to have a large open loop gain, to reduce noise and improve the response to high input capacitance sensors. A calibration input 51 to AMP1 allows simple testing of analog channels using an external signal source. The second stage of the signal path is a polarity amplifier 53, which amplifies the signal from the first stage and has a control to select a positive or negative gain. This feature allows RENA to be used with both electron- and hole-collecting detectors. The shaper 54, which follows the polarity amplifier 53, is a first order transconductance-C bandpass filter with programmable bandwidths. These bandwidths are selected through three bits in the chip's configuration shift register. The filtered signal is peak-detected 55 in the following stage. During readout, the peak-detectors 55 are isolated from the shaper by a switch, to avoid spurious signals from late hits.

Two comparators 57 and 58 sense the output level of the peak detector 55. The threshold comparator 57 generates the trigger signal that is then used in the channel logic. The overload comparator 58 may be used, for example, to sense a high-energy event or detect events inside an energy window. The channel outputs from either comparator are OR'ed to pads TRIG and OL 60, respectively; in addition, the individual outputs from the threshold comparator are used by the readout logic to determine which channels need to be read. The thresholds for the two comparators are controlled by the external voltage levels supplied through pads THS and THO. The peak-detected signals from all channels being read are multiplexed to an output amplifier connected to output pad AOUT. This output amplifier is tri-stated when the RENA chip is not being accessed. This allows the output amplifiers of several (daisy-chained) chips to share a common analog output bus. For test purposes, any channel can be continuously connected to AOUT ("Force Enable Mode").

In addition to the 32 signal channels, RENA has two analog-only isolation channels, one each on either end of the analog channel group. Channel 33, the isolation channel at the 'high' end of the chip, can be used to measure correlated noise during an event.

TABLE 2

RENA chip specifications.

| | |
|---|---|
| Number of channels | 32 + two test channels |
| Readout modes | Sparse readout: Readout is limited to channels whose signal level is above the trigger threshold |
| | Neighbor readout: Sparse readout, with additional readout of channels adjacent to triggered ones |
| | Global readout: Read all enabled channels in response to any trigger |
| | Select all: Read all enabled channels on an external trigger pulse |
| Trigger threshold | Voltage input, 1.5 V to 3.5 V |
| Trigger disable | Automatically after a trigger, or in response to an external signal |
| Readout data | Channel and chip addresses, pulse height and high threshold set bit |
| Readout time | ≈800 ns per channel |
| Daisy chain | Up to 16 chips can be daisy chained to be read out as a single chip |
| Power | 200 mW per chip |
| Test output modes | Enable any one channel for continuous output |
| Peaking time | 0.4, 0.73, 1.06, 1.34, 1.73, 3.17, 4.61 or 6.05 µs |
| Dynamic range | ≈1 ke to 50 ke input for 1.5 to 3.5 V output |
| Input referred noise | ≈150 e rms @ 0 pF with 8 e rms/pF slope |
| Die size | $4.9 \times 6.9$ mm$^2$ |

The RENA chip has several different readout modes, as shown in Table 2. In the "sparse" mode, only channels that are triggered (have a signal above the threshold of the low-level comparator) are read out. In the "neighbor" mode, the nearest (adjacent) channels immediately above and below any channel that has valid data are also read out. This mode is important if charge sharing between detector channels is expected to happen with significant probability. In the "global" mode, all channels are read out in response to a trigger. The "select all" mode allows an external trigger to initiate readout of all channels. In all modes, triggering and readout can be disabled for any channel. Once a channel is triggered, any additional triggers on the chip should be disabled during readout in order to avoid spurious coincidences. This is accomplished by an external signal that must be supplied to the TDIS input, after a suitable delay to account for pulse-height dependent time walk and different charge collection times from truly coincident signals. Alternatively, the chip can be set up to automatically disable additional triggers about 50 ns after the initial trigger.

Up to sixteen RENA chips can be daisy-chained together and read out as if they form a single chip with up to 512 channels. This is advantageous for detectors, which have more than 32 channels. For example, a strip detector with 128 strips on each side can be read out by four RENA chips on each side daisy-chained together.

This section describes tests of the RENA chips that have been performed at NOVA. Those tests that required actual x-ray detector signals were carried out using two-dimensional CdZnTe pad detector arrays. Details of the setup and the test results are discussed below.

FIG. 3 shows four RENA chip ceramic hybrids soldered onto a printed circuit board. Detectors (FIG. 4) can be connected to the hybrids via standard connectors. The hybrids were designed to abut with each other so that a long chain of detectors can be made.

The energy resolution for CdZnTe pad detectors is excellent because of the large number of electron-hole (e-h) pairs created. Approximately one e-h pair is produced per 4.4 eV energy deposited. Assuming a Poissonian distribution, the limiting resolution $R_1$ (FWHM), due only to statistical fluctuations in the number of charge carriers, can be calculated according to $$R_1 = \Delta E/E = 2.35\sqrt{N}$$

where N is the number of e-h pairs created (Knoll, 1989). For example, an x-ray photon with an energy of $E_0=100$ keV which is absorbed via the photoelectric effect generates about 22,700 e-h pairs in CdZnTe, from which we obtain $R_1=1.5\%$.

The limiting energy resolution for 60 keV x-rays can be calculated similarly to be ≈2% (or 1.2 keV). This shows that there is room to improve the energy resolution. Charge trapping is the major cause of lower energy resolution, and improving the purity of the materials used has led to significant improved during the last several years. More improvements are expected in the near future.

The energy resolutions discussed above are dramatic improvements over scintillators; with NaI(Tl), for example, one obtains 30% at 60 keV. CdZnTe pad detectors also have small capacitances, at most a few pF per pad, which leads to low noise charge sensitive amplification to preserve the excellent energy resolution. The high energy resolution is important for astrophysics missions and nuclear physics experiments as well as many commercial applications.

A CdZnTe pad detector has been produced from $Cd_{0.9}Zn_{0.1}Te$ wafers. Each detector has 32 pads with a pad area of 3×3 $mm^2$. The 32 pads are arranged in a 4×8 array for a total active area of 12.5 mm×25 mm. The detector is slightly less than 2 mm thick and made from two separate 4×4 sections to increase yield. The bias voltage is supplied in between the two sections to the top of the detectors.

Figure 5:
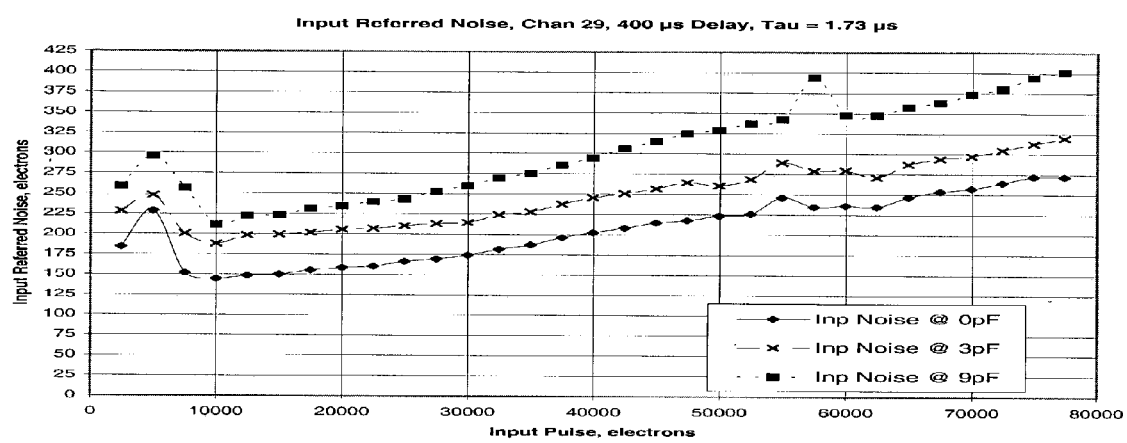
FIG. 5 is a graph of input referred noise vs. input pulse height. Three curves are shown for 0, 3, and 9 pF capacitances. The measurement was performed with the capacitor directly connected to the RENA chip input.

The tests of the RENA chip that have been performed included its functionality and noise characteristics. The noise measurement with respect to input capacitance is shown in FIG. 5. It shows ≈150 e rms noise at 0 pF input with a slope of 8 e rms/pF.

Figure 6:
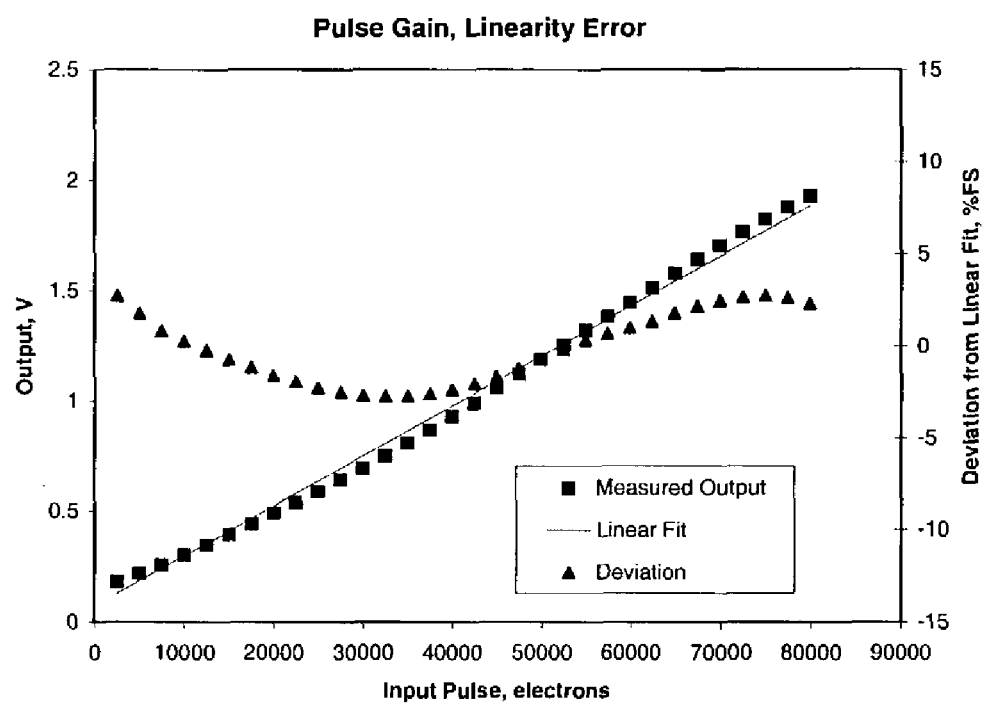
FIG. 6 is a graph of RENA chip linearity measurement. Output voltage vs. input test pulse height. The deviation from a linear fit is indicated by the triangles, with the scale shown on the right hand side.

Measurements of the gain linearity over the entire operating range of the RENA chip have been performed by supplying pulses to the test input of the chip and measuring the voltage output. The results are shown in FIG. 6 and indicate that the linearity of the gain is about a factor of two better than the design specifications and simulations.

Figure 7:
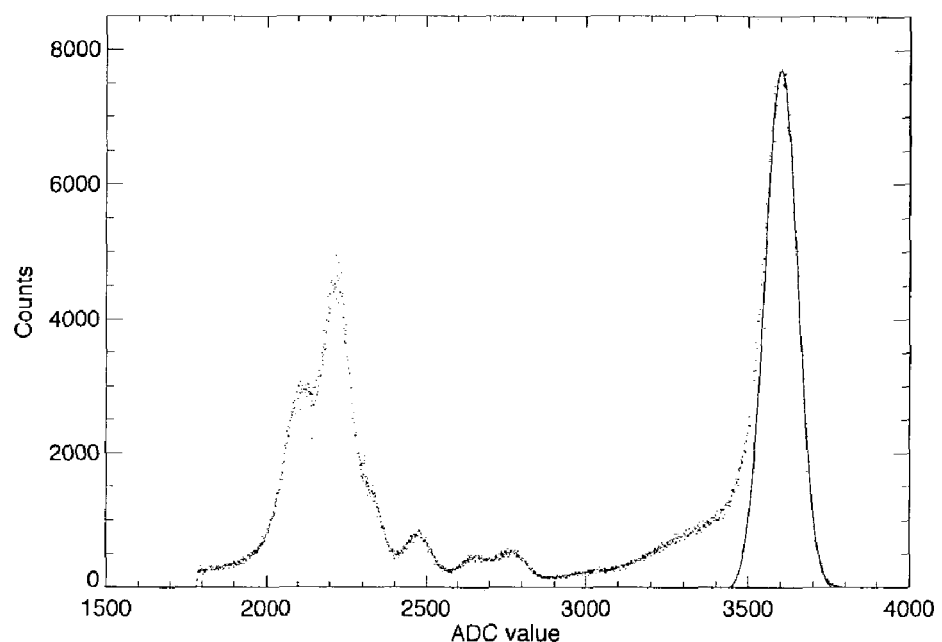
FIG. 7 is a spectrum of $^{241}$Am obtained with a CdZnTe pad detector (FIG. 4) connected to a RENA chip.

The CdZnTe detector described above was used in conjunction with the RENA chip to obtain x-ray spectra of $^{241}$Am, one of which is shown in FIG. 7. To obtain this spectrum, the signal from the RENA chip was digitized using a 14-bit ADC. The detector was operating at a temperature of 12° C. The curve shown in FIG. 7 represents a Gaussian fit to the high-energy side (which should not be affected by charge trapping) of the 59.5 keV peak to determine the energy resolution. The FWHM resolution obtained from this fit is 2.83 keV ($\sigma=1.20$ keV).

Figure 8:
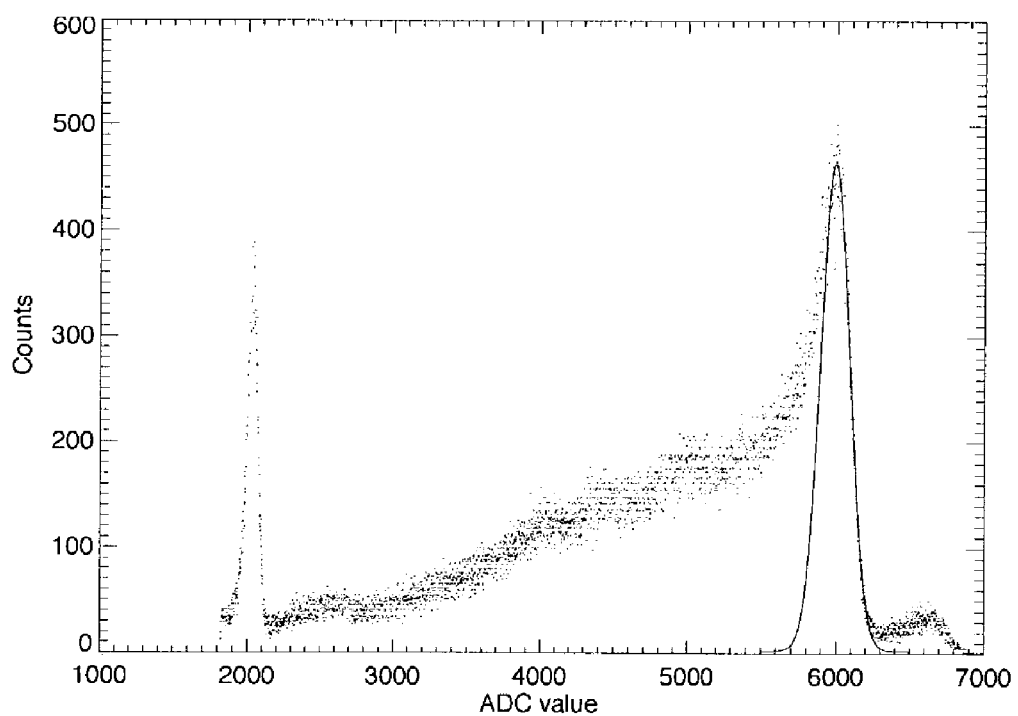
FIG. 8 is a spectrum of $^{57}$Co obtained with a CdZnTe pad detector (FIG. 4) connected to a RENA chip.

The $^{57}$Co spectrum shown in FIG. 8 was obtained under the same conditions. The three γ-lines at 14.41, 122.06, and 136.47 keV are clearly discernible. From the fit to the 122 keV peak which is shown in FIG. 8 we obtain a FWHM resolution of 5.5 keV ($\sigma=2.32$ keV).

To explore the noise limitations of the chip, further tests were performed with a silicon photodiode (Hamamatsu S5972) connected to one of the RENA channels. As in the CZT measurements, the detector was cooled to 12° C. The setup was used to measure the spectrum of $^{241}$Am shown in FIG. 9. The nuclear γ-lines at 26.3 and 59.5 keV are clearly discernible, even though the detection efficiency of silicon is already significantly reduced at the higher energy. The FWHM energy resolution of the 59.5 keV peak is 2.32 keV ($\sigma=0.99$ keV). At lower-energies, we see x-ray lines resulting from transitions in the electron shell of Np, the decay product of 241Am; the two lowest peaks each result from two transitions that are too close in energy to be resolved.

Figure 9:
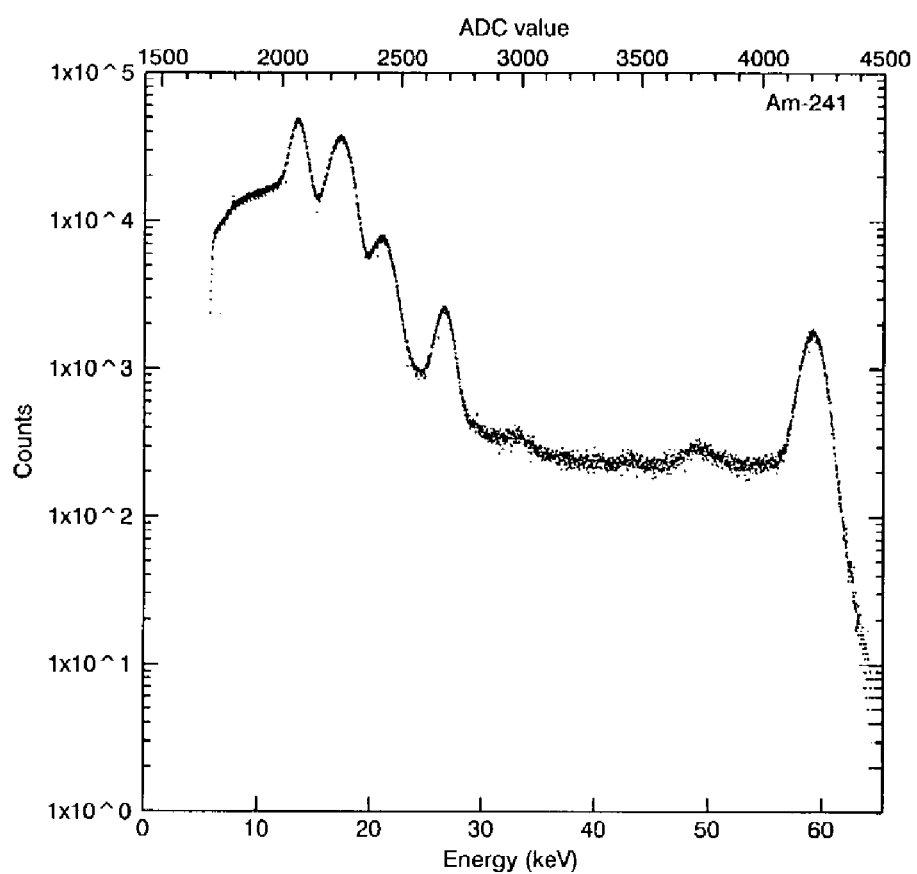
FIG. 9 is a spectrum of $^{241}$Am obtained with a Hamamatsu S5972 Si photodiode mounted onto a prototype RENA chip. The energy scale on the lower x-axis was obtained from the calibration shown in FIG. 10.
Figure 10:
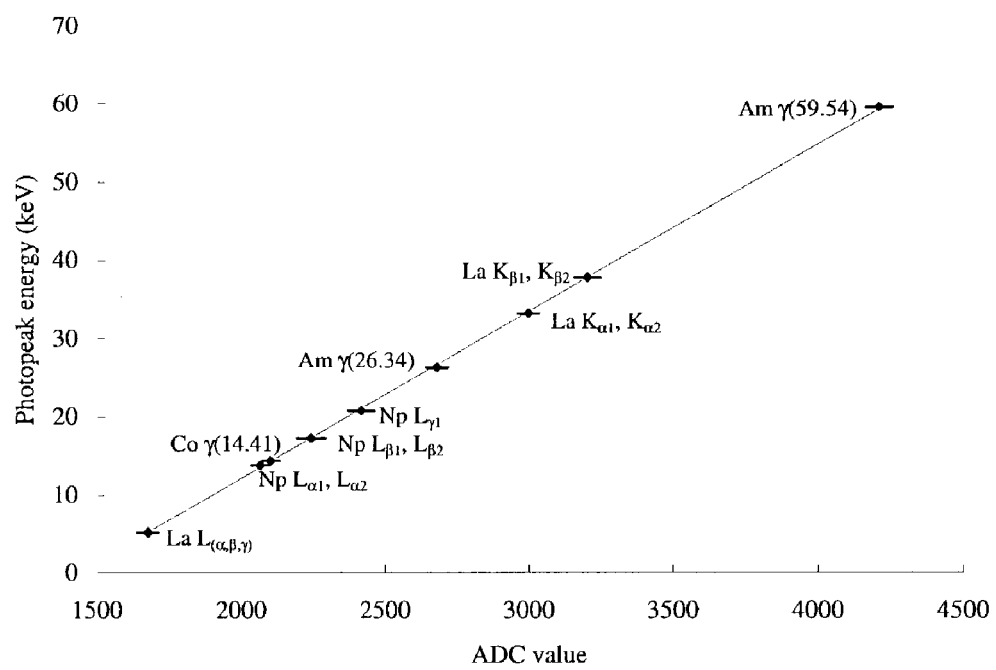
FIG. 10 is an energy calibration of a Hamamatsu S5972 Si photodiode obtained using various x-ray and gamma ray lines of $^{57}$Co, $^{139}$Ce, and $^{241}$Am.

The energy scale shown on the lower x-axis of FIG. 9 was obtained from a calibration that used data from various x-ray lines of $^{57}$Co, $^{139}$Ce, and $^{241}$Am and their decay products. The calibration is shown in FIG. 10. The lines are identified by labels accompanying each point. The horizontal error bars indicate the widths ($\sigma$) of the Gaussian fits used in the calibration. The maximum deviation of the individual data points from the straight-line fit shown in FIG. 10 is 2.1%; this is consistent with the pulsar data shown in FIG. 4. These are all raw spectra without any pulse shape discrimination or correction.

TABLE 3 shows the RENA-2 features and capabilities.

TABLE 3

RENA-2 chip features and capabilities.

1. Dummy or isolation channel structures (with low or no power) at each end of the array, to maintain uniformity.
2. Selectable signal polarity. (For the RENA-2 chip, this is done on a channel-by-channel basis, instead of globally as in RENA.)
3. Capability to monitor in continuous mode the shaper output of any given channel (for diagnostic use).
4. Capability to monitor in continuous mode the peak detector output of any given channel (for diagnostic use).
5. Sparse readout mode.
6. Neighbor readout mode using the new shift register technique, which can also be applied to pixel detectors.
7. Global readout mode (for diagnostic use).
8. Selection of shaping time constants. (For the RENA-2 chip, this is done on a channel-by-channel basis, instead of globally as in the present RENA.). 16 selections cover the charge collection times of most interest. 2 bits for capacitor selections, 2 bits for gm selection.
9. Low-EMI signaling on all digital interfaces which must switch during signal acquisition, e.g., trigger, readout-initiate, reset (if needed). It is critical that these signals do not inject an interfering signal into the inputs.
10. Ability to wire several (at least up to 8) chips with simple scheme to a single controller (realized in an FPGA with 30 or preferably fewer I/O signals) and A/D converter, with no additional buffers or glue logic required (except level translators for the critical signals which do not use CMOS levels). This has been called "daisy-chaining" in the RENA data sheet.
11. Test signal input bussed to all channels, individual enable switch at each channel to connect test signal bus to input of channel via a small capacitor.
12. External delay from trigger to end of hit capture to allow all simultaneously hit channels to cross the trigger threshold and thereby be marked as hit. Another (external) delay from end of hit capture to end of peak detector acquisition to ensure that all channels marked as hit have actually acquired a full peak value in their peak detectors.

TABLE 3-continued

RENA-2 chip features and capabilities.

13. Selection (on a channel-by-channel basis) of one of two full scale signal ranges. See specifications for values. Two ranges would facilitate achieving lower noise for the smaller signals.
14. Lower power operation, insofar as possible. Power dissipation yet to be estimated. Power down bit per channel.
15. Selectable (on a channel-by-channel basis) noise optimization by changing the input transistor width using a control bit. Optimized for two capacitance input values.
16. Generalization of the "neighbor" readout mode using high-speed hit/read register to send hit pattern to and receive read pattern from external controller (FPGA). Sparse mode to work by default if no manipulation of the hit/read register is made during readout.
17. Internal threshold DAC on each channel, instead of external voltage input bussed to all channels in present RENA chip. A single external reference voltage input sets the minimum or maximum threshold level, and an individual DAC at each channel sets the trigger threshold above the baseline by an amount equal to (DAC code/max)*(reference input).
18. The hit/read register contents produces the channel address readout information.
19. The RENA overload comparator, this feature is included in the new ASIC.
20. Add front-end saturation detection comparator (to sense large overload signals, which may effect the normal functioning of the signal channel, and which may produce the effect similar to the present RENA style overload detection). A window comparator is being included. This circuit will respond when the input amplifier is saturated either high or low.
21. Shaper filter to have a fast and a slow signal path. The fast signal is fed to the trigger/timing comparator, the slow signal to the peak detector for pulse amplitude measurement. Both fast 17 and slow 15 shapers are included. A multiplexer 14 is included to select the shapers for the trigger comparator. (See block diagram, FIG. 1.) Or separate fast comparator 17 is used to produce the low jitter timing trigger or signal.
22. Differential analog output (with disable) to allow direct connection between one or more new ASIC's and AD92xx or similar type A/D converters with only passive filter network.
23. Higher speed (relative to present RENA) digital logic interfaces and also for the analog output. One or more analog outputs may be used.
24. Dead time performance is improved to allow for operation at moderate rates, up to 50 kHz/ch on all channels with single-hit events. Continuous mode will help this greatly.
25. Capture and readout of an individual analog timestamp for each channel, to allow for relative timing of hits on different channels to be measured. Must be implemented in such a way that it can be left unused with no significant impact on dead time, pin count, or other important performance parameters. Maximum spread in hit times between initial and final hits of a good event is <1 µs. Timing precision (after suitable time walk correction offline) is 2-30 ns FWHM.
26. Radiation tolerance >20 kRad(Si) and no destructive SEL. SEU is not a concern. Radiation tolerance is improved using standard CMOS technology with good design practice, no special rad-hard technology is used. Attention to radiation performance is given while making the layout. Special rad-hard process may be used in future versions.

Summary of RENA-2 Features and Functionality 1. 32 or 64 Channels+at least 1 channel for detector bias side measurement+2 dummy or isolation channel structures (low or no power) at ends to maintain uniformity. Test pads on the extra channel(s) or dummy channel(s) if powered.

2. Selectable signal polarity on a channel-by-channel basis.

3. Capability to monitor in continuous mode the shaper output of any given channel (for diagnostic testing and evaluation).

4. Capability to monitor in continuous mode the peak detector output of any given channel (for diagnostic testing and evaluation).

5. Sparse readout mode.

6. Generalization of the "neighbor" readout mode where neighbor pixels can be selected in hardware by an FPGA for pixel detectors. Sparse mode will work by default if pixel detector mode is not selected.

7. Global readout mode (for diagnostic testing and evaluation).

8. Selection of shaping time constants. This will be done on a channel-by-channel basis.

9. Low-EMI signaling on all digital interfaces, which must switch during signal acquisition.

10. Ability to wire several (at least up to 8) chips with simple scheme to a single controller. This will enable to use 2 to 8 ASICs as if they were a single ASIC with 64/128 to 256/512 channels, for 32 and 64 channel versions respectively. This could be very useful for low rate detectors where a large saving in peripheral electronics can be achieved.

11. Test signal input bussed to all channels, individual enable switch at each channel to connect test signal bus to input of a channel via a small capacitor. This will enable easy testing of the ASIC without a detector connected.

12. (External) delay from trigger to end of hit capture to allow all simultaneously hit channels to cross the trigger threshold and thereby be marked as hit. Another (external) delay from end of hit capture to end of peak detector acquisition to ensure that all channels marked as hit have actually acquired a full peak value in their peak detectors. This feature is important for astrophysics application as multiple hit from varying energy quanta can be received nearly simultaneously, especially at high rate imaging.

13. Selectable full scale signal range 9 fC, 36 fC or 80 fC.

14. Lower power operation, insofar as possible. The power to the ASIC will be also adjustable externally so that the user can make a trade-off between low-power and low noise.

15. The linearity of the ASIC and the front end noise will be improved significantly.

16. Internal comparator threshold DAC on each channel so that the threshold levels can be independently adjustable.

17. A register will give out address of all the channels that has a hit. This will allow hardware and software control of the readout scheme such as the near neighbor readout for a pixel detector to account for charge sharing between pixels.

18. Design a second "overload" comparator. This is again specifically implemented for astrophysics applications. It is set to a high threshold value. When the output of this comparator goes high then the external circuit will be flagged indicating that there was a hit from a large cosmic ray particle and the readout electronics are shut down by a preset time to allow the detector and the instrument to recover from this large overload event.

19. A trigger pulse output signaling that there is an event recorded in the ASIC.

20. A second fast and low jitter trigger output for timing purposes such as for detectors, which require coincidence timing.

21. Higher speed (relative to present RENA) of digital logic interfaces and also if possible of the analog output.

22. Increase Reset speed to reduce dead time due to resetting the ASIC.

23. Optimize the ASIC input to 2 and 9 pF detector capacitances. The input capacitor is also made easily optimizable for full wafer runs for a specific mission requirement.

24. Capture and readout of an individual analog timestamp for each channel, to allow for relative timing of hits on different channels to be measured.

25. Radiation tolerance >20 kRad (Si) and no destructive SEL. SEU is not a concern. This is achieved using standard CMOS technology with good design practice, no special rad-hard technology is used at this stage. If a mission requires a rad-hard technology than the design will be ported for rad-hard process for that mission's requirements.

Analog Section

Figure 12:
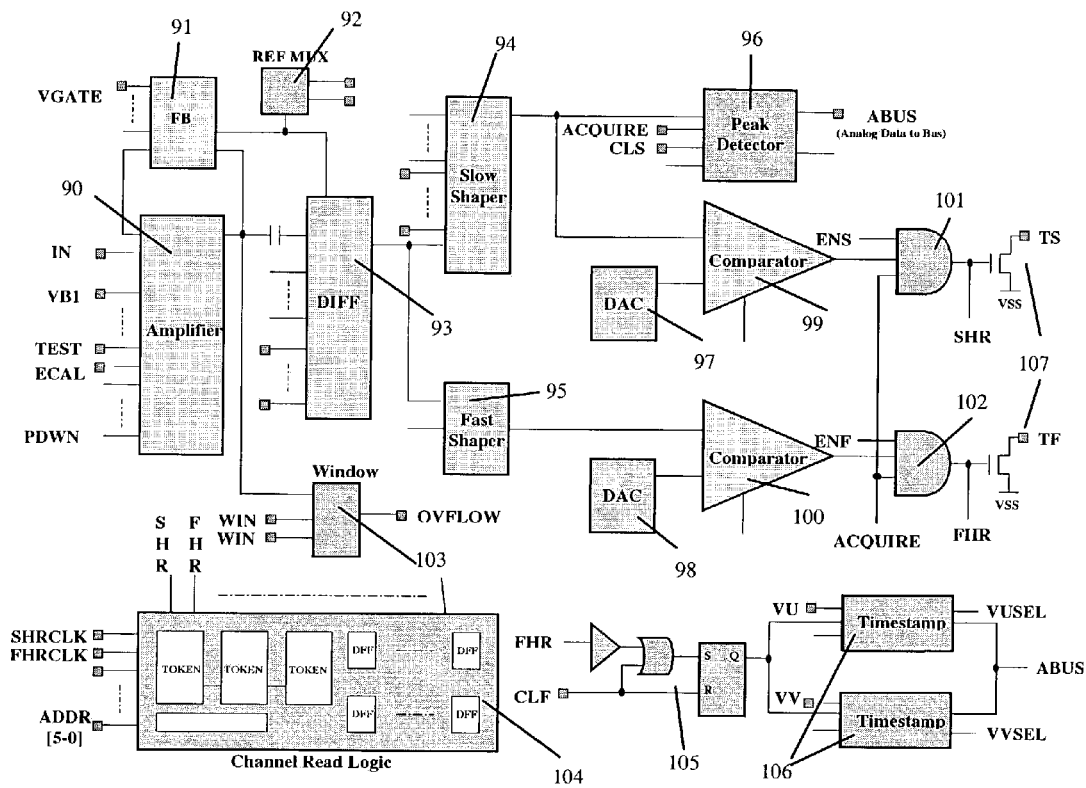
FIG. 12 is a single channel block diagram for the analog section of the RENA-2 integrated circuit.

FIG. 12 is showing a single channel block diagram for the analog section of the RENA-2 integrated circuit in more detail then the FIG. 1. Input IN, test input TEST, energy calibration input ECAL and power down input PDWN enters the input charge sensitive amplifier 90. The input amplifier has a feedback circuit 91. VGATE input enters feedback circuit 91. Feedback circuit's 91 output goes to reference multiplexer 92 and differentiator 93. Output of the input amplifier 90 also comes to differentiator 93 and Window 103 which includes the pole zero circuit. Output of differentiator goes to the slow shaper 94 and fast shaper 95. Output of the slow shaper 94 goes to the peak detector 96 and also to comparator 99. Peak detect have other inputs, acquire ACQUIRE and clear CLS signals also go into the peak detector 96. Output of the peak detector 96 goes to the analog data bus ABUS.

The threshold input of comparator 99 is supplied by digital to analog converter DAC 97. Output of comparator 99 goes to a gate 101 which is controlled by the acquire ACQUIRE and enable slow ENS signals. Output of gate 101 goes to slow trigger TS output 107. Output of the fast shaper 95 goes to comparator 100. The threshold input of comparator 100 is supplied by digital to analog converter DAC 98. Output of comparator 100 goes to a gate 102 which is controlled by the acquire ACQUIRE and enable fast ENF signals. Output of gate 102 goes to fast trigger TF output 107.

The gated 102 output of comparator 100 FHR comes to the time difference measurement circuit or time stamp circuit 105 and 106. Fast clear signal CLF also comes to the time difference measurement circuit. Time difference measurement circuit measures the arrival time difference of the events at each channel with respect to each other. Channel readout logic 104 controls the chip.

FIG. 11 shows the block diagram of the typical signal characteristics and analog signal processing of the RENA-2 chip and develops the formulas required to function correctly. The purpose of the RENA-2 ASIC is to measure the Q (Signal Charge) for each event. The charge Q enters through input 110 into the Low-Noise High Linearity Integrator 111 where the charge is accurately integrated. Output of the integrator 110 enters Differentiator and Pole-Zero Cancellation circuit 112. The output of differentiator and pole-zero cancellation 112 goes into Pulse Shape Filter Stage 1 113. After the first stage of pulse shaping is done the resultant signal goes out both to the Pulse Shaping Filter Stage 2 114 and also as a fast trigger out 115 to a Fast Trigger Comparator (not shown here). The output of the Pulse Shaping Filter Stage 2 defines the output shape of the pulse according to the set shaping or peaking time. This signal goes and the Peak Hold 116, which produces a DC signal level same as or proportional to the pulse height at its output 117. This signal can be digitized by an ADC (Analog to Digital Converter) not shown. The digitized pulse height gives a direct and accurate measurement of the incoming charge signal (Q). FIG. 11 provides all the formulas, which govern the signal as it progresses through the ASIC. It also lists the input signal characteristics for a typical case and explains terms in Notes.

The input amplifier, shown in FIG. 12, has been designed to be tolerant of DC leakage current (FIG. 18) so that detectors may be DC coupled to the chip. The charge produced in the detector 180 when a photon or particle is absorbed or scattered by the detector 180, goes into the input 182 of a charge sensitive integrating amplifier 183. The feedback capacitor 184 integrates the charge and the feedback resistor 185 produces tolerance to the leakage current continuously produced in the detector 180. Leakage current is continuously integrated when there is no real signal is produced. This current is integrated in the integrating charge sensitive amplifier 183 and the output of the charge sensitive amplifier 186 rises. The resistive feedback 185 restores the increase in the output 186 of the amplifier 183 by providing a reverse current which cancels the leakage current coming from the detector 180. The load capacitance 187 is also shown.

Four extra channels have been added to the standard 32 to allow connection of the detector cathode side to the same ASIC. A pole-zero cancellation circuit has been included to handle higher count rates without significant pileup errors. Heeding two important requirements for space deployment, the chip power consumption has been made adjustable by limiting the current flow to the input transistor and a sound level of radiation hardness will be ensured by use of a sub-micron CMOS process to fabricate the ASIC. The functionality of the new ASIC will also be significantly enhanced with an interface made simpler by a reduced pin count. Lastly, while three readout modes (sparse, neighbor, and global) are provided in the present RENA chip, the readout pattern in the new ASIC can be arbitrarily related to the hit pattern, under the control of external logic. Sparse readout (channels are read if and only if they are hit) will be the default).

As explained in the previous report, the feedback element of the RENA-2 is a resistive multiplier circuit which behaves like a simple 200 MΩ resistor, and provides continuous feedback. A simple long FET biased appropriately for use as the feedback element should give a noise performance approaching that of an ideal resistor and improve the linearity of the input amplifier. The resistive multiplier design at the time of the last report, however, generated significantly more noise than the few percent from a simple resistor. Since then, after much study, the following improvements were worked into the design: i) the source of excess noise in the previous resistive multiplier circuit was identified (a constant current drain) and eliminated; and, ii) the option, (channel selectable), of a more conventional MOSFET feedback circuit was introduced into the channel design. The MOSFET feedback can be enabled while at the same time disabling the resistive multiplier circuit by using a signal, which can be programmed on a channel-by-channel basis. Also, a per channel selection circuit to enable/disable the pole-zero circuit has been added. Much more recently, to accommodate the 40 μs peaking time requirement for both feedback circuit selections, a further option of a larger 1.2GΩ resistive multiplier circuit was added.

The shaper design in RENA-2 was updated relative to that of the present RENA from a second-order "semigaussian" response to a fourth-order "semigaussian" response (4 pole gm-C filter). Basically the idea is to have a filter response which produces, for a given peaking time, the flattest top and the quickest return to within a small delta (say 1%) of the baseline. The initial design was to allow for a continuous range of shaper peaking times. However, in the process of the redesign, an unacceptable noise contribution from the shaper circuit was found, especially for the long shaping times. A thorough analysis revealed a nonlinearity intrinsic to the circuit that causes greater noise for larger pulse sizes (the dynamic range "nonlinearity problem" of the old RENA). An alternative shaper circuit, which is lower-noise because it allows more gain in the preamp stage, was then adapted. The new design however does not allow for a continuous range of shaper peaking times. Switches were then put in place to enable digital control of 16 different shaping times (independently on each channel). This relatively straightforward scheme works well for the smaller shaping times. Much design effort was made to approach the desired maximum 40 µs peaking time by using large resistors and capacitors. As implemented, incorporation of these elements led to an increase of the channel length by roughly 1.3 mm (the channel width is now =130 µm). As stated in Table 4 in APPENDIX, the sixteen selections for the peaking time thus achieved are: 0.36, 0.39, 0.41, 0.45, 0.49, 0.54, 0.59, 0.66, 0.91, 1.08, 1.27, 1.69, 1.82, 2.80, 4.46, 38.0 µs. The values are located at approximate log spacings. The 40 µs peaking time selection was added at the expense of die area (a large 800 KOhm resistor was added to make this possible). Table 4 in APPENDIX gives the mapping between selection number and peaking time. Although many of the selections lie in the low shaping time area, this provides at least 8 useful shaping times located on an approximate log curve. Extra shaping times may be ignored if desired.

Inputs are provided for two user-provided analog signals ($V_U$ and $V_V$ in FIG. 1) whose momentary values will be stored for readout in channel-specific sample-and-hold circuits whenever the respective channel's trigger comparator fires. The known time dependence of these external signals, which can be optimized for the specific application, can then be used to reconstruct the actual timing information. Examples of suitable external signals include sinusoidal wave forms, with a 90° phase difference to resolve ambiguities, or linear ramps that are initiated by the first channel trigger for any given event. To take full advantage of this new feature, we added to the signal path a second, fast shaper optimized for timing rather than energy resolution and use this shaper to generate the trigger signal.

The fast signal path was implemented with a second order shaper (2 pole gm-C filter) and fixed peaking time (150 ns). The fast-path uses two differentiations so that pole/zero cancellation errors do not cause a baseline shift on the fast path. The channel trigger is taken either from the slow or fast path as set by a control bit. Ideally, when timing is important, the trigger will be from the fast path; when low-threshold operation is important, trigger will be from the slow path.

The fast trigger should be connected to the readout to assure avoidance of events where the fast channel data, i.e., the timestamp, is present but where that data is in fact from a prior event, or where the fast channel did not trigger, in which case the timestamp data is invalid. The requirements are, at a minimum, for the triggering scheme to allow for channel triggering at least on the slow channel, to mark each channel as being hit or not in the fast channel (and thus having or not having valid timing data), and to allow for independent signaling to the controller (e.g., the FPGA) of the OR of the slow triggers and of the OR of the fast triggers. Hence, the controller can abort and clear any events, which, for instance, had fast-only data that would otherwise potentially contaminate the data for some following event.

To accomplish the above, the scheme adopted in the design includes a second Hit/Read register: there are now two, the slow (SHR) register (101 and 107 goes into) and the fast (FHR) register (102 and 107 goes into) (see FIG. 1). The controller then has complete flexibility to use peak height data only, peak height and timing, or timing data only, and in the case of using peak height and timing, can enforce that the data validly comes from a single event (within reason of course—two events closely separated in time, i.e., <peaking time, can always contaminate each other).

Additional Features & Capabilities

The RENA chip offers the user some flexibility by providing a variety of readout modes—sparse, nearest neighbor, and global readout. The nearest neighbor mode is quite useful to account for charge sharing in strip detectors or other essentially one-dimensional detector arrays. However, its successful application requires a monotonic mapping of detector strips to RENA channels, which is not always optimal from the point of view of interconnect capacitance or mechanical constraints. In addition, extension of the nearest neighbor mode to two-dimensional arrays, though equally desirable, is not very practical, simply because there is no "natural" mapping from the four (or six, for a hexagonal detector array) nearest neighbors of a given pixel to the sequence of channels on the readout chip. In the new ASIC, the user is given the ability to specify which channels are to be read on a case-by-case basis. In this scenario, the readout pattern is controlled by a serial Hit/Read shift register with one bit per channel; if a bit is set, the corresponding channel is read out. Initially, when a channel triggers, the corresponding bit in the readout register is set. Before reading out the detector data, the control logic can then inspect the trigger pattern and, if necessary, replace it with a different readout pattern. This operation can be completed in 2.3 µs, regardless of the total system channel count, with a suitably designed external controller FPGA; it need not significantly compromise the deadtime specification. The readout pattern can be a nearest neighbor pattern customized to the particular experiment setup. The sparse readout mode is the default.

Other features implemented in the logic section are timestamp readout, with an option to disable it, and the configuration registers. The configuration of the new ASIC is done with the use of three signals—CS, CShift, Cin, and a 32 bit shift register whose bits are designated for programming functions in each channel.

The channel configuration is performed by loading in a 32 bit word of data into the serial shift register. These words are divided into address and digital configuration data OR address, and global configuration data. 16 of the 32 bits are for the DACs, 4 are for the shaping time, and the remaining 12 are the miscellaneous functions that the channel can perform. When the readout is performed, selected channels will send analog peak detection data, and time stamp data (if enabled) in succession until all channels have been read. Multiple chips may be tied together with this function efficiently. Pin count was minimized and the readout speed kept fast within reason. A deadtime of <(5 us+N*(330 ns)) for an N-hit event (N typically from 1 to 10 depending on application details) is expected.

The pole-zero circuit enable/disable selection per channel allows for the pole-zero circuit to be disabled for operation at low hit rates. This can help reduce noise slightly, and also removes the DC leakage component from the signal in later stages of the channel.

Two separate, selectable reference levels per channel have been provided, to allow for optimum biasing of the circuit both with the positive and with the negative input signals. The chip output driver is designed to drive an AD92XX type A/D converter. The driver to connect several RENA chips with little circuitry to AD9240 or equivalent ADC has been designed. The peak detector design has been improved by reducing the complexity from the RENA chip. Detection of positive and negative peak signals is now possible.

Noise Performance

The initial aim for input-referred noise values were approximately 18 aC (112 e) rms in the 9 fC signal range and 45 aC (280 e) rms in the 53 fC range, for dynamic ranges of 500 and 1200, respectively. With 1 pF detector capacitance we expect to achieve possibly 35 aC (220 e) rms. In the new ASIC resistive feedback around the input amplifier should improve its tolerance of DC input current; use of a DAC on each channel to set the threshold should also remedy the effect of baseline differences.

Count Rate

The performance of the input amplifier was evaluated at high rates. Using the pole-zero cancellation circuits, count rates as high as 100 kHz can be obtained. However this is limited by the maximum input DC current specification of 5 nA since at high count rates, signal charge cannot be easily rejected by the amplifier/feedback Monte Carlo simulations confirm that the pole-zero cancellation can reject more than 99% of the previous signal at these high hit rates.

Radiation Hardness.

The layout is being carried out employing techniques proven to enhance radiation hardness of the ASIC, e.g., maximizing substrate contacts and providing transistors with guard rings. This in conjunction with properties inherent to the 0.5 μm process to be used for fabrication should ensure meeting the >20krad radiation performance requirement.

Power Consumption.

The major part of the power is consumed in the input transistor, where a large current is essential for the low noise. Throughout the rest of the analog and digital circuits, where lowering the power consumption will not affect the noise performance of the chip, circuits were developed with lowest possible power consumption for the selected fabrication process. Notably, one of the amplifier designs was found to generate excess noise and was replaced by a circuit that was both low power and low noise. Channel power down available on a per channel basis. For a 1 kHz, single-hit event rate, the current estimate for the power consumption is 6 mW/ch with fast trigger path disabled. Disabled channels dissipate <0.5 mW each. It is possible to reduce power in the Diff buffer, the Shaper and the Fast shaper. However, with the fast path disabled, we will dissipate about 4.7 mW per channel. This does not include power dissipation in other external circuits.

Table 4 in the APPENDIX lists the specifications for the RENA-2 chip. These specifications are important in designing, fabricating and testing the RENA-2 chip. Table 5 below lists the additional features of the RENA-2 ASIC.

TABLE 5

Additional features and capabilities of the RENA-2 integrated circuit

1. Low-noise continuous resistive feedback in lieu of switched reset approach to improve deadtime performance, thus allowing for operation at moderate rates, up to 5 kHz/ch on all channels with single-hit events.
2. Dummy channel structures (but no power) at each end of the array, to maintain uniformity
3. Selectable signal polarity on a channel-by-channel basis
4. Ability to wire several (at least up to 8) chips with simple scheme to a single controller (realized in an FPGA with 30 or preferably fewer I/O signals) and A/D converter, with no additional buffers or glue logic required (except level translators for the critical signals which do not use CMOS levels).
5. Test signal input bussed to all channels, individual enable switch at each channel to connect test signal bus to input of channel via a small capacitor.
6. Generalization of the "neighbor" readout mode using high-speed hit/read register to send hit pattern to and receive read pattern from external controller (FPGA). Sparse mode to work by default if no manipulation of the hit/read register is made during readout.
7. Internal threshold DAC on each channel. A single external reference voltage input sets the maximum threshold level, and an individual DAC at each channel sets the trigger threshold above the baseline by an amount equal to (DAC code/max)*(reference input).

TABLE 5-continued

Additional features and capabilities of the RENA-2 integrated circuit

8. Front-end saturation detection comparator to sense large overload signals. A window comparator has been included and this circuit will respond when the input amplifier is saturated either high or low.
9. Shaper filter to have a fast and a slow signal path. The fast signal will be fed to the trigger/timing comparator, the slow signal to the peak detector for pulse amplitude measurement.
10. Differential analog output (with disable) to allow direct connection between one or more new ASICs and AD92xx or similar type A/D converters with only passive filter network.
11. Higher speed (relative to RENA) of digital logic interfaces and the analog output. Max readout rate is 3 Msps for analog samples. 20 MHz clock for digital hit/read shift register.
12. Capture and readout of an individual analog timestamp for each channel, to allow for relative timing of hits on different channels to be measured. Maximum spread in hit times between initial and final hits of a good event will be <1 μs. Timing precision (after suitable time walk correction offline) should be 20-30 ns FWHM.
13. Power dissipation reducible through use of two power down bits for each channel, one for the entire channel, another for the fast shaper.
14. Adjustable power to input amplifier (external bias control). This is provided to allow the user to make the critical tradeoff of power dissipation versus channel noise.

Other Embodiments

Sensor Array Developed for Scanning

Figure 13:
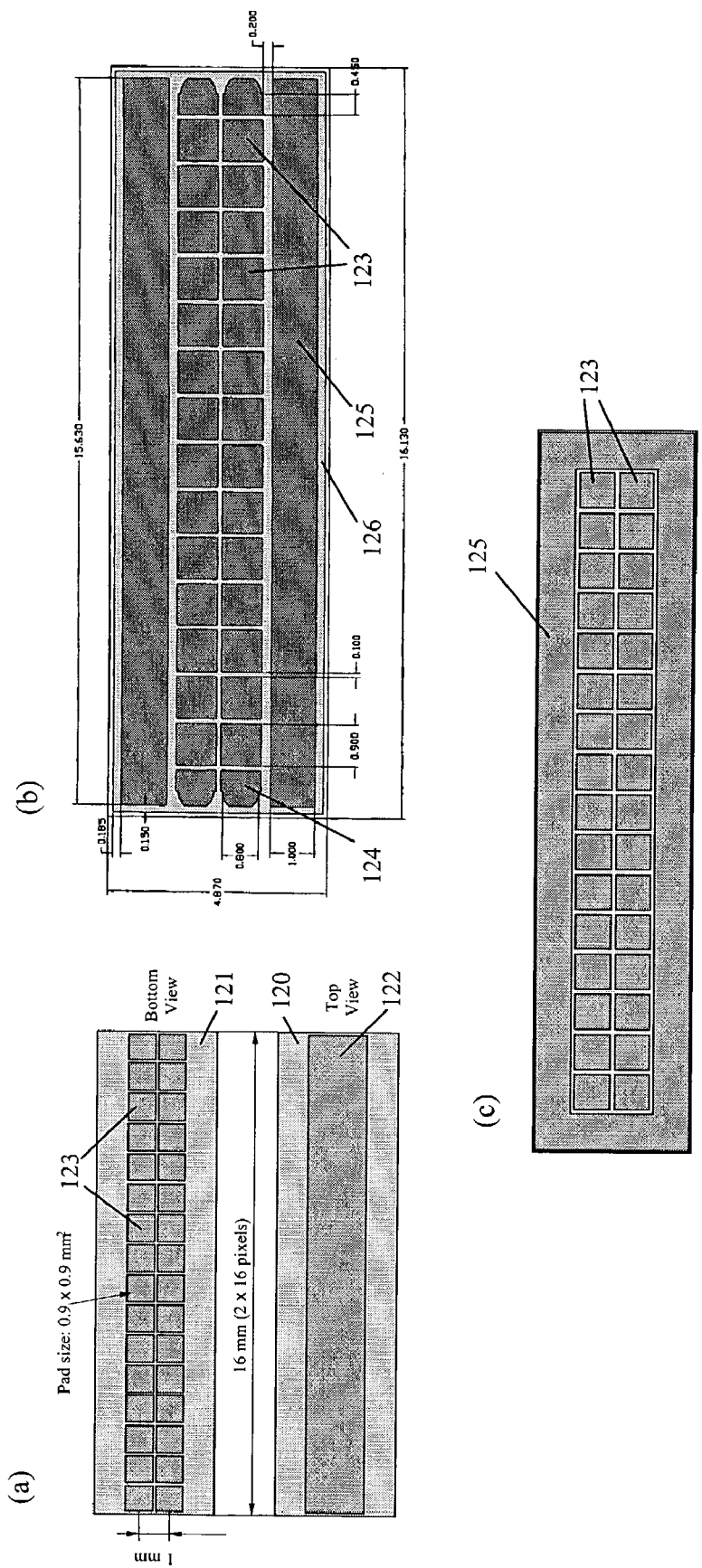
FIG. 13 is a sensor array for scanning type imaging applications. Three different design are shown with varying features and functionality. The figure on top left side is the first detectors designed and fabricated. In these figures, the dark gray areas represent metallization and light gray areas unmetallized solid state detector material. The detector on top right is a newer version. The detector figure at the bottom shows a metallization layout for a detector with full guard ring going completely around the perimeter of the pixel array.

Solid state or scintillator based sensor arrays 120, 121, 126 for scanning type imaging are developed (FIG. 13). A typical sensor array has 32 pixels (123, 124), arranged in two rows of 16 pixels (123), as shown in FIG. 13. The pixel structure is generated by a corresponding pad structure in the metallization on the anode 123 (bottom) side 121 of the detector, where each pad 123, 124 has an area of $0.9 \times 0.9$ mm$^2$, with 0.1 mm pad-to-pad spacing, for an overall pitch of 1 mm. The pixel shape, pitch and spacing can be different from one application to the other. The detector over all size can also have different values depending on the pixel pitch, array size, thickness, cathode size, etc. The pads at the ends of each row 124 are shortened slightly to provide 0.1 mm separation from the edges of the detector material. The cathode 122 consists of a 1.95 mm wide metallization layer spanning the length of the detector. The detector thickness is 1.75 mm, which can be selected from a thickness of about 0.01 mm to 50 mm. The overall width of the detectors is 4 mm, leaving 1 mm wide strips of solid state material acting as guard structures on either side of the two pixel rows. Sensor array is widened to improve the charge collection inside substrate. The cathode 122 metal electrode is also extended over the entire top surface of the array to further improve charge collection of the sensor array. CdZnTe detector material is used for this work. However, other solid state detector materials such as Se, Si, GaAs, Ge, HPGe, CdTe, HgI$_2$ and PbI$_2$ can also be used. Another improvement can be achieved by placing 1 mm wide metallized "guard ring" along all sides of the two pixel rows 125 (as shown in the bottom figure in FIG. 13). The guard ring 125 can be made in sections such as along two long sides as shown in top right figure in FIG. 13. The guard ring can be biased, using dedicated bond pad(s).

Although the array size, pitch, physical dimensions are given here for a specific application, these parameters can be changed for different applications. For example, the thickness of the detector is important for the energy range of the particles and photons observed. It can change from 0.01 mm to 1,000 mm. Larger thicknesses are relevant to higher energy photons and particles. The detector physical dimensions depend on the image area required. It can vary from 1×1 mm² to 10K×10K mm², in any size and geometric shape. The pixel size can also vary greatly depending on the application. For example, it can vary from 2×2 array to 10 M×10 M to produce the image resolution needed. The array can also have any type or shape from square to rectangular, circular, oval, etc. The pixel pitch depends on the image resolution required. It can also vary greatly from application to application. Pixel pitch from 0.001×0.001 mm² to 1K×1K mm² are possible. Significant parts of these ranges have already bean met. The rest will likely follow soon as the technology advances.

The one remaining area of improvement is the pixels at the ends of the detector array. The proximity of these pixels to the crystal surface leads to a deterioration of their performance due to surface leakage, electric field distortions, and surface defects. To solve this problem, we updated the detector design to include a full guard ring 125 around the pixels. The bottom figure in FIG. 13 shows a sketch of the metallization mask layout for the revised design. The new design allows all the pixels to be uniform and have same configuration with respect to the guard ring 125 and the edges of the detector. Details of the design, such as the guard ring and end pixel dimensions can have similar ranges as discussed above.

Figure 17:
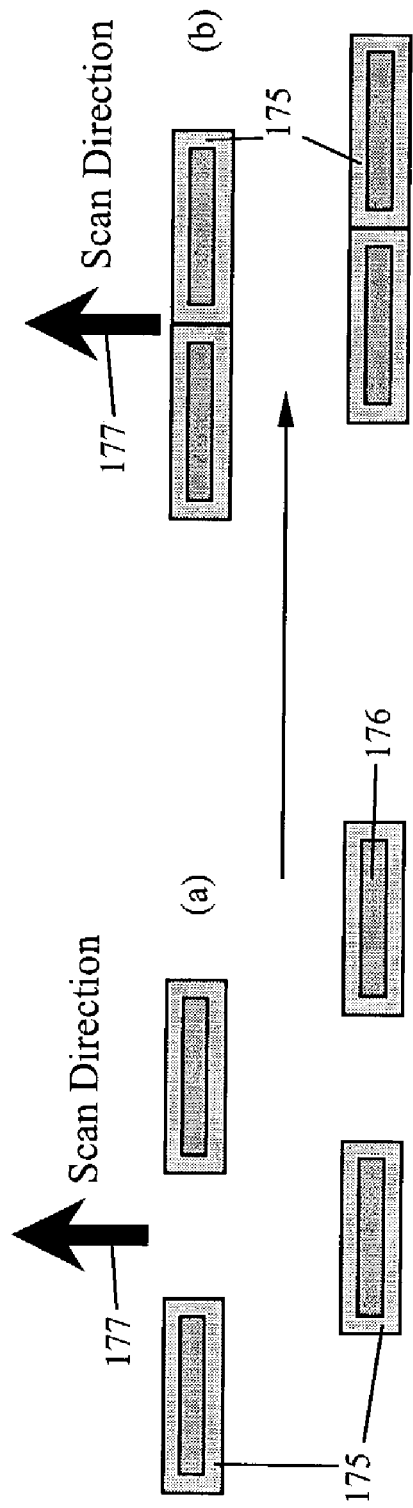
FIG. 17 is a staggered (a) and dual array (b) configurations proposed to achieve full image coverage along the system axis (narrow long arrow) when using detectors with guard rings while scanning in the perpendicular to system axis (thick short arrow) is also shown.
Figure 25:
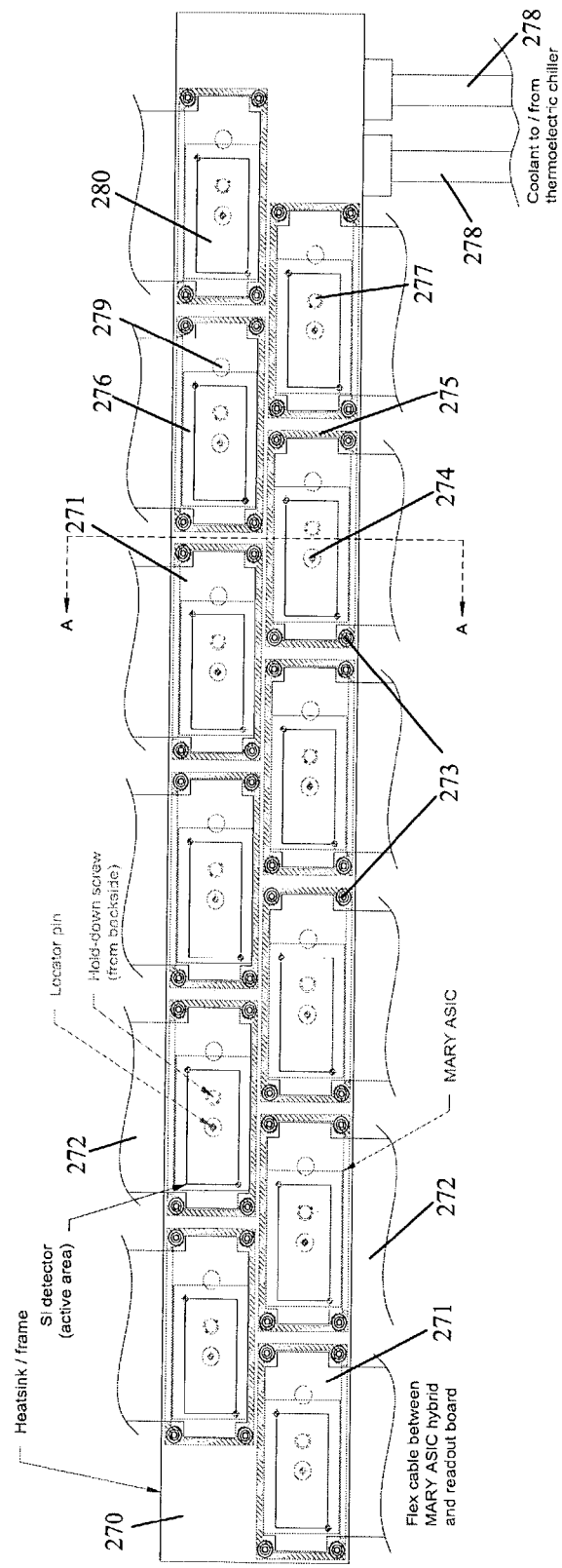
FIG. 25 is a staggered linear array of two-dimensional pixel detectors for scanning applications.

With the full guard ring, it will no longer be possible to directly abut the detector arrays in order to obtain a contiguous pixel array spanning several crystals. To resolve this, we plan to arrange the detectors either in a staggered array or in two linear arrays in which the detectors are offset relative to each other by half a crystal length. FIG. 17 (not drawn to scale) and FIG. 25 show these two options. The figures shows each sensor array 175 and 276 with active pixilated area 176 and 280. The staggered array (FIG. 17(a) and FIG. 25) has the advantage of minimizing the number of detectors and readout channels, and therefore the cost required to cover a given system length; the dual or multiple array (FIG. 17(b)) increases the overall photon rate that can be detected and may lead to a simpler overall system design. There are relative merits for the two options. There are many possible ways on the shape, geometry and size of these arrays of detectors. There could be a single row and/or column or there could be many rows and/or columns in many different sizes and shapes. How to arrange them depends on the application. If the sensor arrays can be made fully abutable then the staggered array option may not useful, however the dual multiple array option can still be useful especially if each sensor array cannot be made to meet required the full length and width of the image alone.

FIG. 25 shows detail of how such a staggered array can be fabricated. The whole system is built on a strong base 270 such as metal which can be cooled if necessary through a cooling system such as 278. The individual pixel detectors 27 are mounted and bonded on a Flex cable 271 and 272 placed on the platform 270 using a positioning pin 274 underneath and secured with a screw(s) 277 and adjusted by 279. Under the pixel detectors and Flex cables there are wedge shaped supports 275 mounted by screws 273 which gives an angle to the pixel detector 276 so that the pixel detector 276 active area 280 is at right angle to the incident x-ray beam. This is necessary as the x-rays coming from an x-ray generator or a source have a conic or fan beam structure and arrives onto the different parts of a long or a large sensor array at different angles. This produces loss of image resolution where the x-rays enter the detector at oblique angle as the photon can interact under a different pixel and smear the position resolution. To minimize this effect the pixel detector active area must be positioned at right angles to the incident photon or particle beam.

Figure 15:
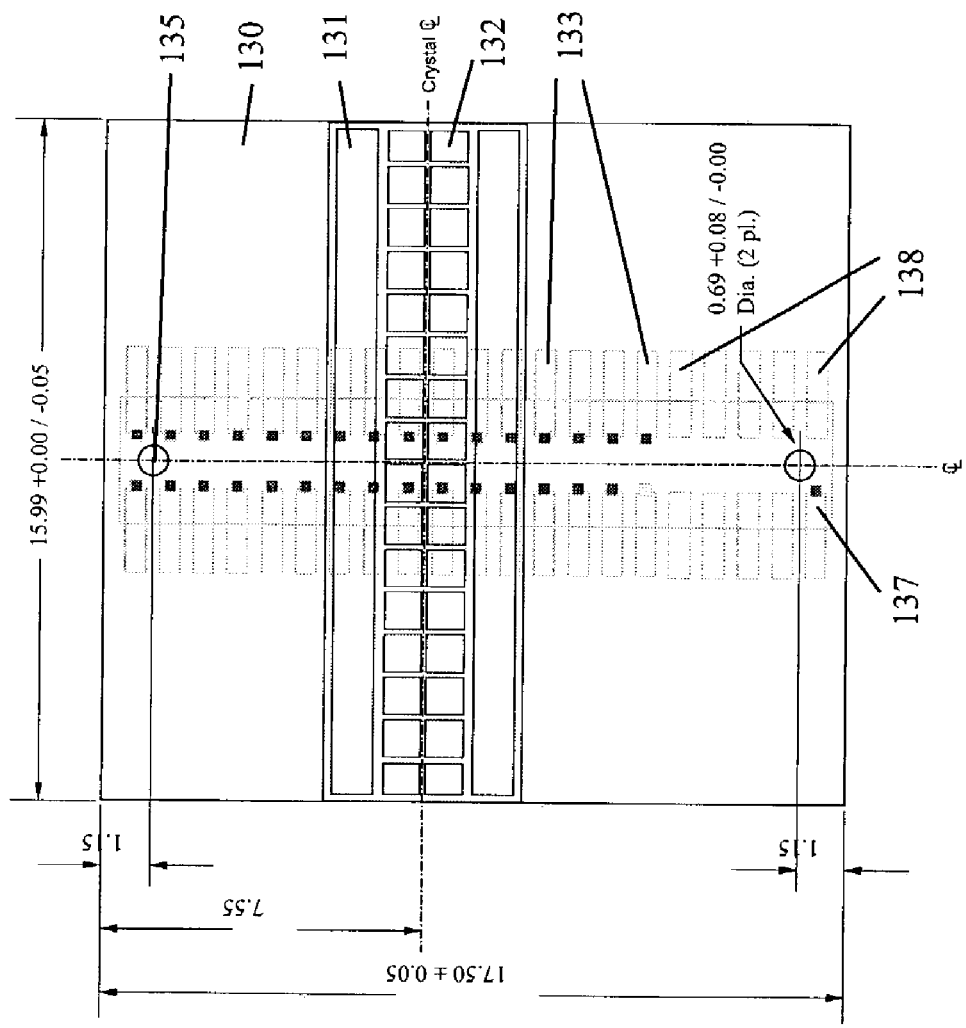
FIG. 15 is a detector carrier substrate design showing the high voltage connection pad and the 4 pairs of pads specifically taken out between the high voltage (HV) pin and the data pins to produce safe creepage distance between the high voltage pin and the data pins. This new design is expected to allow for the use of higher thickness detectors by using varying safe creepage distance between the HV pin and the data pins.

The sensor array needs to be mounted on a carrier 130 for to be useful. FIG. 14 and FIG. 15 show the design of the sensor array carrier 130. In the designs we use all connections between the array and the outside world—readout electronics and bias supply—can be made through wire bond pads, so the detector either had to be wire-bonded to the test fixture or contacted by probe fingers. Both approaches have been used. These have some drawbacks. To avoid these drawbacks, the wire bond pads were replaced with a commercially available connector soldered to the bottom of the substrate onto gold or platinum solder pads 133. The connector type that was selected is Samtec FTE, a dual-row terminal strip connector with 0.8 mm lead pitch as shown in FIG. 14. The connector can be used rotated at 0° to 90° relative to the main detector axis. The 90° position has two advantages compared to if the connector is oriented parallel (0°) to the detector axis: 1. Tracing data pins to the ASIC input will be easier and 2. The inserting and removing and detector from the socket will be feasible.

FIG. 14 is showing the detector carrier substrate design: layout drawing (left) 130 and photograph of the top (detector) side of the substrate (right) 130. In the layout, the dark color represents the top substrate metal 132 and the light color represents the bottom substrate metal and connector solder pads 133 as viewed from the top. The silhouette of the detector 131 is shown. The high Voltage (HV) connector pad 134 is also shown. The Samtec connector has mounting pins for accurate alignment which requires accurate holes 135 in the substrate. The crystal outline and its bottom metallization are also clearly seen.

FIG. 15 is a detector carrier substrate design showing the high voltage connection pad 137 and the 4 pairs of pads 138 specifically taken out to produce safe creepage distance between the high voltage pin 137 and the data pins 133. Here is the specific notes on FIG. 15.

Notes:
1. All dimensions are in millimeters.
2. Substrate outline shown in black.
3. Detector outline and pixel metallization (simplified) shown in gray.
4. Connector body and pins, and solder pads, shown in pink outline. HV bias pin is filled in red, signal pins in yellow (nearest neighbor to HV pin) or green (all others). The connector used is a custom version of Samtec P/N FTE-121-01-G-DV-A, obtained by removing the nine pins closest to the HV pins. The dashed outlines indicate the locations of the solder pads corresponding to these nine removed pins and are shown for information only; the actual substrate will not have these pads.
5. The creepage distance from the HV pin to its nearest neighbor is 3.7 mm, the distance between the corresponding solder pads is 3.492 mm (when using the pad layout recommended by Samtec).
6. Trace layout is still under development and is not shown. However, the detector placement on the substrate was chosen so that all signal traces from the existing, smaller substrate can remain unchanged (subject to other considerations not related to detector placement) and only the bias supply trace would have to be moved.

These detectors are used to produce high resolution images of baggage containing explosive substitutes, agricultural products, mechanical objects, etc. These images were taken under fast data acquisition mode. To acquire fast data, especially with spectroscopic capabilities was done by developing a fast version of the new ASIC. The fast hyperspectral imaging IC is discussed below.

Fast Data Acquisition Sensors and ASICs

The energy resolution and count rate capabilities of solid state and scintillator detectors designed for high-rate applications have recently improved dramatically as a result of our ongoing development efforts. Solid state detectors designed specifically to optimize energy resolution had long been able to provide or even exceed the quality of the spectra shown in FIG. 7, FIG. 8 and FIG. 9. When the design emphasis was put on high count rate capabilities it became a challenge to produce detectors and readout ICs with which can achieve such capability. The detectors are now routinely capable of handling count rates up to at least two million photons per pixel per second, whereas the previous detector generation had typically been limited to a few hundred thousand counts. The count rates in the future are expected to reach 100M counts per pixel per second using fast detectors. All evidence points to the carefully optimized electric field structure inside the detector crystals as the principal reason for these improvements.

The objective of hyperspectral x-ray imaging is to measure the x-ray absorption properties of the object under investigation as a function of position (hence "imaging"), x-ray energy ("hyperspectral"), and possibly time. The position information is obtained by using pixelated detectors and, in the majority of cases, by scanning the object. It is also possible to make these arrays to function in starring array mode where scanning is not required.

In order to obtain the photon or particle energy information for detectors, four methods have commonly been used:
1. Periodically varying the x-ray source spectrum and determining absorption as a function of source energy.
2. Using different types of detectors that are sensitive to different parts of the x-ray spectrum. Typically, this involves using two layers of detectors, possibly separated by an absorber, stacked along the direction of the photon path. Low-energy photons are predominantly absorbed in the first detector, leaving mostly high-energy photons to reach the second layer.
3. Measuring the amplitudes of individual photon signals from the detector and counting the signals in energy bins as a function of amplitude to reconstruct the energy spectrum of the detected photons. This technique may also be used to count the individual photon signals on board the ASIC and produce an on board multi-channel analyzer type data acquisition system. This system can be very fast, but the spectrum will be limited to the number of counting energy channels built in.
4. Measuring the amplitudes of individual photon signals from the detector and recording the signals as a function of amplitude to reconstruct the energy spectrum of the detected photons. In this technique the spectrum is only limited by the energy resolution of the detector. However, the data analysis will be more time consuming and mostly done external to the ASIC. However, it is possible to design and develop new sophisticated ASICs in the future where the data analysis may also be done on board the ASIC or on close by peripheral circuits and ICs.

In the first two options, the only information obtained from the detector signals is the total charge generated in the detector and thus the energy-averaged photon flux detected. This simplifies the processing of the detector signals, but determining the energy dependence of the x-ray absorption depends on additional external information, specifically the time-dependence of the source energy (case 1) or the detector in which the photon signal was detected (case 2). The first two approaches are mainly used for dual energy imaging systems. The energy resolution is low and the separation of the two energy spectra is broad in these techniques.

Figure 16:
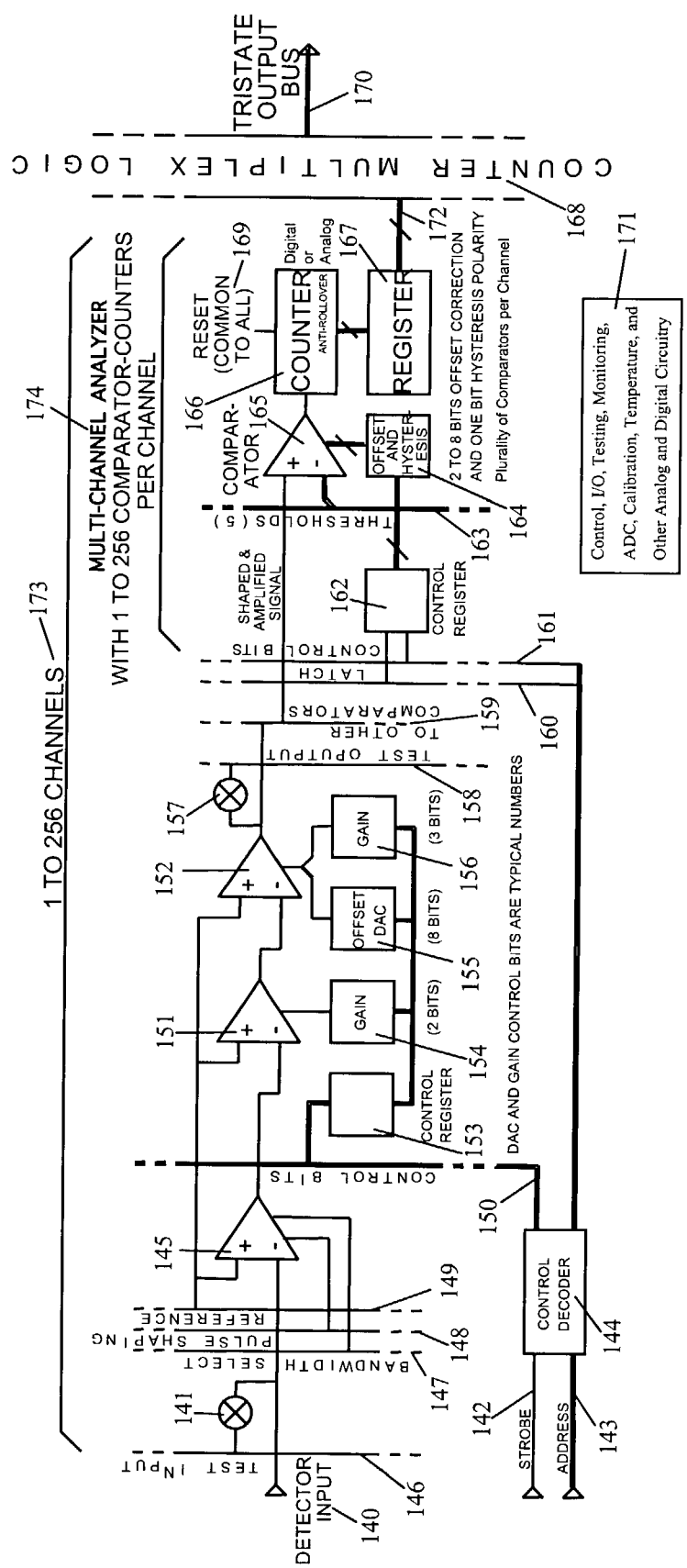
FIG. 16 is a block diagram of the fast hyperspectral imaging embodiment of the new ASIC.

The third approach was implemented in the new fast version of the RENA-2 chip. This chip is called the BETA ASIC. The circuit diagram of this ASIC is shown in FIG. 16. This ASIC combines, on each of its 32 channels 173, a charge sensitive amplifier 145 with a small (five bin) multi-channel analyzer 174. The number of channels 173 and the number of multi-channel analyzer bins 174 can be varied from 1 to 256 or even more depending on the application or the chip design capabilities. The detector 140 sends the signal into charge sensitive amplifier 145. There is a test input 146 goes into the amplifier 145 through a switch 141. The test signal is used to test and calibrate the BETA ASIC. Amplifier 145 has controls inputs such as bandwidth select 147, pulse shaping setting 148 and reference 149. A control decoder 144 uses inputs strobe 142 and address 143 and produces control bits 150 and 161 and latch 160 to the ASIC. Control register 153 in each channel and control register 162 at each multi-channel bin takes these information from the control decoder 144 and controls the gain 154 and 156, offset 155 and offset and hysteresis 164. These settings are important for calibrating the BETA ASIC and also for achieving a uniform response from channel to channel throughout the ASIC and between all the chips in the same sensor and detector array. The control bits 150 and 161 and latch signal 160 are bussed through out the chip to different channels and bins. The output of the charge sensitive amplifier 145 goes to a second amplifier 151. The gain of the amplifier is adjusted by the gain control 154. This has 2 bits at present but it can have any bit size from 1 to 16 bits. A DAC (Digital to Analog Converter) is normally used for the gain, offset and threshold controls. The output of this amplifier goes into a third amplifier 152. Both the gain and offset of this amplifier is adjusted, at 8 and 3 bits each, through the use of the gain 156 and offset 155 adjustments, respectively. The out put of the third amplifier 152 goes to two different sections. One output goes through a switch 157 to a test output 158 which is a analog test output bus running through the chip. The other output of amplifier 152 to the multi-channel analyzer 174 for that channel. It first goes to the comparators 165 in the multi-channel analyzer through a local "to other comparators" 159 bus which local to each channel. BETA chip has 5 multi-channel analyzer energy bins 163. However, the energy bins can have less or many more bins, from 1 to 256 or higher 174. There are 5 comparators 165 in the ASIC where the threshold inputs come through a local threshold bus 163. The threshold input of the comparators are adjusted through the offset and hysteresis 164 control. Either an external comparator 165 threshold level is supplied from outside the ASIC and the adjustments made onto the external threshold supplied or the threshold level is supplied directly from the offset and hysteresis 164 control using a DAC or similar circuitry. Output of the comparator 165 goes into a counter 166. The counter 166 can be digital or analog. The analog counters are described in another section of this application. The counter 166 counts the pulses coming from the detector 140 through the described circuitry in each channel, if the height or the amplitude of the pulse goes over the threshold 163 of each comparator 165 in the multi-channel 174 section of each channel 173 the counter 166 connected to that comparator 165 is incremented or decremented, which ever is the case. The counter 166 has a reset 169 input, which is used to reset the counters after the counts are read out periodically or when ever the external circuit, control system or computer wants to. The output of the counter 166 goes to a register 167 to store the counts. Therefore, in one embodiment the count inside the counter 166 is stored in the register 167, counter 166 is reset and starts counting, while the register 167 is read out by external computer. In another embodiment there is no register and the counters 166 are stopped by an external signal, read out by an external computer and/or control system, reset and then counters 166 start counting again with or without an external start signal, not shown. The register 167 can be an analog or a digital register depending on whether the counter 166 is analog or digital, respectively. The output 172 of the register goes to the counter multiplexer logic 168. If there is no register used then the output of counter 166 goes to the counter multiplexer logic 168. The output 170 of the counter multiplexer logic 168 goes to the external electronics and/or computer and/or control system. The ASIC includes other circuitry 171 to carry out other functions such as control, I/O, testing, monitoring, ADC, calibration, temperature, and other analog and digital circuitry.

The maximum rate capability of the BETA chip is about 2 to 5 million photons per channel per second. The data rate of the ASIC can be increased significantly in the future by using faster foundry processes and faster sensors and detectors.

At pulse rates approaching 5 MHz per channel, a pulse counting chip will require a peaking time of the same order as the electron charge collection time in the detector (≈60 ns for a 1.75 mm CdZnTe detector at 400 V bias). In solid state detectors where the electron and hole transport times are very fast much higher data acquisition times can be achieved. For these fast detectors much faster versions of the BETA chip can be designed.

At high rates above 1.5 MHz per channel pile-up of the hole signals in CdZnTe detector may occur. This may adversely affecting system performance. Advanced detector designs can be used to screen or not use the hole signal contribution and/or only detect the electrons and in these ways improve the rate capability of the detector. The guard strip and/or ring and wide-cathode geometry described above can help. However, for truly high intensity or high rate hyperspectral imaging using an energy resolving detector, one can use a different innovative approach, moving beyond single pulse analysis and accepting pile-up events, even of events separated by a time scale less than the detector charge collection time. This is discussed in next section.

The maximum rate capability of the new CdZnTe pixel detector sensor arrays is not yet known, although it is clearly greater than 2 MHz per pixel, and likely even significantly more, such as 5 Mhz or higher. A high rate readout electronics system was developed for testing, with capability of data rates above 5 Mega counts per second per channel, and determine the maximum rate capability of the CdZnTe pixel detector arrays. As mentioned above solid state detectors with fast electron and hole mobility lifetime product these data rates can be significantly higher reaching over 100 Mega counts per second per pixel. The BETA readout ASIC is a major asset for application of CdZnTe and other solid state and scintillator detectors to hyperspectral imaging of photons, x-rays, gamma rays and particles.

New Fast Readout Technique

A new highly innovative, complementary approach has been developed for fast imaging of photons and particles that is based not on detecting every individual photon and determining its energy to reconstruct the spectrum but on directly measuring suitably selected "global" properties of the spectrum. The use of two of these properties, the DC current level out of the detector and the fluctuation of that signal, are experimentally investigated. The theoretical basis of hyperspectral imaging based on these parameters is explained here. The implementation of the technique in a readout ASIC is also discussed.

A detector is connected to a conventional charge sensitive amplifier, with a feedback resistance $R_0$ and feedback capacitance $C_0$. The time constant $\tau_0 = R_0 C_0$. If $Q_t$ is the total charge output from the detector from time 0 up to time t, then the amplifier output voltage is $$V_t = \frac{Q_t}{C_0} - \frac{1}{\tau_0 C_0} \int_0^t e^{-(t-s)/\tau_0} Q_s \, ds. \tag{1}$$

Events of charge q occur at a rate $\lambda(q)$; a determination of the function $\lambda(q)$ (as a further function of position and time) is the fundamental step in hyperspectral imaging. From $\lambda(q)$ the absorption of the imaged body as a function of energy is determined, since $\lambda(q)$ depends only on this and on the source characteristics (Bremsstrahlung energy spectrum and absorption in any fixed filters) and detector characteristics (photon interaction probabilities and charge generation and transport properties), which are held constant during the imaging.

To be precise, events of charge q occur as a Poisson process at rate $\lambda(q)$, so that the total charge output from the detector may be expressed as $$Q_t = \int_0^\infty q N_{\lambda(q)t}^{(q)} \, dq, \tag{2}$$

where, for each q, $N_t^{(q)}$ is an independent standard Poisson process of rate 1 and jump size 1. The charge sensitive amplifier output voltage $V_t$ is, according to the above assumption, found by inserting the expression for $Q_t$ from Equation (2) into Equation (1) above. When this is done, it is found that the mean output voltage (after decay of turn-on transients) is $$\lim_{t \to \infty} E V_t = R_0 \int_0^\infty q \lambda(q) \, dq, \tag{3}$$

where E indicates the expectation value (of $V_t$) with respect to the probability measure of the Poisson processes. This formula embodies the conventional method of x-ray imaging with a detector operated in current mode; the amplifier output voltage is proportional to the mean rate of charge generation in the detector, and the constant of proportionality is simply the transresistance of the amplifier. Unfortunately, such a measurement on its own is not expected to give information about the functional form of $\lambda(q)$.

Hyperspectral imaging can be achieved by observing not only the mean output voltage but also the statistics of fluctuations about it. For instance, the variance of the output voltage, according to Equations (1) and (2) above, is $$\lim_{t \to \infty} E(V_t^2) - (EV_t)^2 = \frac{R_0^2}{2\tau_0} \int_0^\infty q^2 \lambda(q) \, dq. \tag{4}$$

Therefore, simultaneous measurement of the mean and variance of the charge sensitive amplifier output allows determination of the hyperspectral parameter $$A_{21} = \int_0^\infty q^2 \lambda(q)\, dq \bigg/ \int_0^\infty q\lambda(q)\, dq = 2C_0 \frac{\lim_{t\to\infty} E(V_t^2) - (EV_t)^2}{\lim_{t\to\infty} EV_t}. \quad (5)$$

It is important to note that this method of hyperspectral imaging does not involve any pulse counting, and furthermore that pulse pile-up, which will of course occur at high rates, is explicitly allowed for in these formulas. This offers the potential to combine the advantages of hyperspectral imaging by means of an energy resolving detector system with the advantages of high intensity current mode operation. This technique has been applied in a qualitative manner in nuclear reactor instrumentation, but has not yet been applied in the quantitative manner as discussed here.

Other possible spectral parameters to be measured include, but are not limited to, higher moments of the detector signal or the signal levels that are attributable to different frequency ranges. As discussed above, one obvious advantage of this approach is that parameters that explicitly make use of pulse pile-up can be selected, which is a serious limitation of pulse counting methods, offering the possibility of operating at higher photon fluxes than would otherwise be accessible. Based on the results of the investigations carried out, a new version of the RENA-2 ASIC design and layout are considered.

The circuit for the ASIC is described here to explain how the proposed new readout technique is implemented. The new ASIC implements the measurements carried out. The design can be enhanced with improvements on the basic system discussed here to enhance the hyperspectral response. The pixels of the solid state detector sensor arrays such as CdZnTe detector arrays will be connected to the new readout ASIC input through conductive polymer bonds and ceramic carrier traces as described above. The inputs on the ASIC will go to the input of low noise charge sensitive amplifiers as designed in RENA-2 ASIC (such as FIG. 18) but specifically matched to the solid state detector characteristics. Additionally, the ASIC will feature capabilities for injecting diagnostic test signals to verify functionality and to study the hyperspectral imaging algorithm implementations.

The output of the charge sensitive amplifier will feed into two separate analysis circuits. One circuit will be a low-pass filter followed by a precision analog-to-digital converter; this provides the mean detector current signal. The other circuit involves a bandpass filter followed by a squaring circuit, a lowpass filter and a precision analog-to-digital converter. The analog-to-digital converters will be of the delta-sigma type because of the low power, excellent linearity and resolution, and the modest rate requirements (one conversion per pixel per image point). This is to be contrasted with the traditional pulse processing methods, which require as a minimum one conversion per photon, a considerably higher rate requiring low resolution, high power flash converters. The A/D converters will be multiplexed over several channels, and the digital data outputs merged into a FIFO for transmission to the image processing computer at a convenient later time.

Such an ASIC calculates the time-average of the mean charge-rate and mean charge²-rate, which will provide a good estimate of the expectation values with error bounds that can be determined a priori. Rectangular weighting functions in time would be desirable, especially for a scanning linear array imaging system, and digital post-processing will be applied in software to generate these from the ASIC outputs, which will have a complicated low-frequency time weighting determined by the filter response functions. The filters in the ASIC will be limited to conventional continuous-time filters of low order to ease the implementation and to minimize power dissipation.

Variations on this ASIC design include modification of the bandpass filter to select different portions of the fluctuation spectrum, and possibly the inclusion of programmable gain amplifiers and perhaps even automatic gain control (AGC) in the fluctuation measurement paths, because the dynamic range seen in these paths can be of order one million. AGC would be based on the average detector current signal as observed in the DC signal path of that same channel. Another important addition to the ASIC would be the addition of further signal paths with other translinear circuits replacing the squaring circuit, to calculate higher moments or combinations thereof, providing additional hyperspectral parameters at the output.

The Input Amplifier Stage

Figure 18:
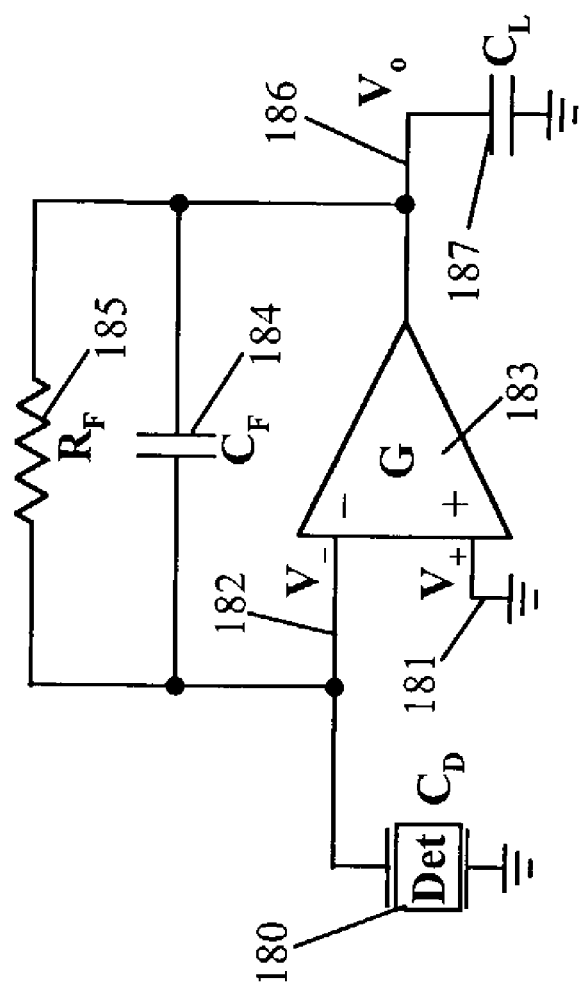
FIG. 18 is a block diagram of the charge sensitive input amplifier of the ASIC.

The input amplifier 183 is derived from the input amplifier of the RENA-2 ASIC, a low-noise charge-sensitive amplifier constructed from a transconductance amplifier 183 with an RC 185, 184 network in feedback. A schematic block diagram is shown in FIG. 18. The detector 180 goes into the input 182. The other input 181 of the amplifier 183 is grounded. The feedback resistor 185 and feedback capacitor 184 are used for the RC feedback. The output 186 of the amplifier goes into a load with capacitance 187.

The transconductance amplifier 183 will be realized by a single-ended folded cascode circuit in the CMOS ASIC. The feedback resistor 185 will also be realized using a transconductance amplifier on the ASIC. The count rate specification of larger than 2 MHz (random) or >2MCounts per sec per pixel is the principal constraint on the preamplifier design. On the one hand, this drives the design toward a fast pulse decay time so that pile-up errors are minimized and near-simultaneous pulses can be distinguished. On the other hand, digital signal processing will require that sufficient samples be taken of each pulse to characterize it, and if the pulse is too narrow this will require unrealistically large sample rates. The sampling interval can be in the range 10 to 100 ns. The desired waveform from the preamplifier would rise rapidly, level off for about 100 to 200 ns, and then quickly decay to zero within 50 to 100 ns. The actual waveform from the circuit of FIG. 18, assuming a δ-function current input, and neglecting the (high-frequency) zero in the response function due to the reverse path through the feedback network, is of the form $$V_0(t) = A \exp\left(-\frac{\omega_0 t}{2Q}\right) \sin\left(\frac{\omega_0 t}{2}\sqrt{4 - \frac{1}{Q^2}}\right),$$

where $$\omega_0 = \sqrt{\frac{G}{R_F(C_D C_L + C_D C_F + C_L C_F)}},$$

and $$Q = \frac{\sqrt{C_D C_L + C_D C_F + C_L C_F}}{\sqrt{GR_F}\, C_F + \frac{C_D + C_L}{\sqrt{GR_F}}},$$

on the assumption that Q ½. We can choose some values for $\omega_0$ and Q which give a response similar to the goal above. A slightly underdamped response is desirable in order to minimize pile-up error.

With a detector and parasitic capacitance of 6 pF, and assuming a load capacitance of at least 0.5 pF, reasonable choices can be made for the circuit parameters of the input stage in these two cases. The implied power dissipation is about 2 mW/channel.

The second major criterion concerning the input amplifier is the noise level. Ideally, the noise should be small enough that it does not contribute significantly to the energy measurement error, that being then dominated by pile-up, quantization error, and charge collection variations in the detector. For the preliminary design described here, the electronics noise sources that we must consider are: input transistor channel thermal noise, feedback resistor thermal noise, and detector leakage current shot noise. The input transistor noise can be modeled as a voltage noise source of variance 8 kT 3G per unit bandwidth. The feedback resistor can be modeled as a current noise source of variance $\xi \cdot 4$ kT/$R_F$ per unit bandwidth. The factor $\xi$ is included as a simplified way of accounting for the fact that the resistor is built from an active transconductor circuit. A value of 4 is used, based on experience with the present version of the BETA chip. The detector leakage current noise is can be modeled as a current noise source of variance 2 qI per unit bandwidth. A detector leakage current of 1 nA per pixel is used. The resulting output noise, integrating from DC-100 MHz, is 1.62 mV RMS and 0.976 mV RMS, the signal gain is 1.02 mV/keV and 0.609 mV/keV, and the input referred noise is 1.58 keV RMS and 1.60 keV RMS for the fast and slow cases, respectively. (Signal gain is determined with reference to peak value at output with a rectangular 100 ns input current pulse, and assumes 4.5 eV per e-h pair for the CdZnTe detector.) This confirms that the noise performance of the input stage is excellent for the required high energy resolution.

Digitization of the Detector Signals

A gain stage and offset adjustment will be used after the preamplifier 183 to bring the preamplifier output 186 within the range of the analog-to-digital converter (ADC). The approach developed places 6-bit-pipeline ADCs, one for each channel, specifically developed for the new ASIC and placed on the new ASIC. Data would be taken out individually from the pipeline stages in a serial bitstream format and rearranged into the proper 6-bit word sequence external to the ASIC. Another approach uses an external 8-bit pipeline ADC, and multiplexes four signal channels to each ADC. The multiplexer would switch channels at 4× the channel sample rate, and the ADC would also run at 4× the channel sample rate. In this way a data stream is obtained which represents interleaved samples of the four channels. Because each channel's data will be processed independently there is no need to have simultaneous samples. Non-multiplexed connection of an off-chip ADC would require too many components and too much real estate on the printed circuit board. The multiplexer output and the ADC have to settle to a full-scale step in times of order 12.5 to 25 ns in the multiplexed approach. This is within the scope of currently available technology. The multiplexer may be integrated into the ASIC. There are tradeoffs between these architectures.

Figure 19:
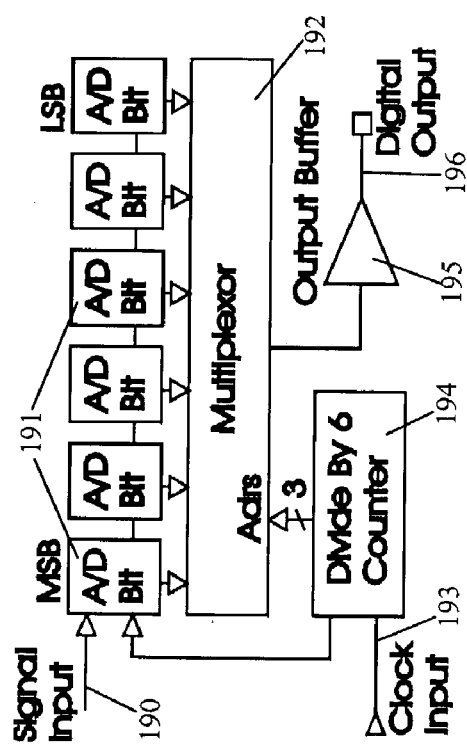
FIG. 19 is an on chip pipeline A/D converter (ADC) architecture.

We elaborate here the architecture for an on-chip 6-bit pipeline ADC (FIG. 19). A pipeline converter features high speed operation at low power dissipation levels. The price paid for this is in terms of silicon area used and latency in receiving the data. For an n stage converter the data comes out n clock cycles after the input is sampled. At any time there are n samples undergoing various stages of conversion. For this application, these latencies (of the order of 300 to 600 ns) will not cause any difficulties. We designed a 6 stage pipeline architecture, a block diagram of which is shown in FIG. 19. The expected power dissipation will be 3.5 mW/bit, or 21 mW/channel. FIG. 19 shows the signal input 190 going into the Most Significant Bit (MSB) of the A/D converter bit 191. Other bits 191 of the ADC follow the MSB to lower bits until the Least Significant Bit (LSB). The outputs of the A/D converter bits 191 goes into the Multiplexer 192. A clock input 193 goes into a divide by 6 counter 194. Two outputs come out of the divide by 6 counter; one goes to the MSB and the other as a 3 bit address goes into the Multiplexer 192. Output of the Multiplexer 192 goes into an output buffer 195. The output buffer 195 provides the digital output 196.

Figure 20:
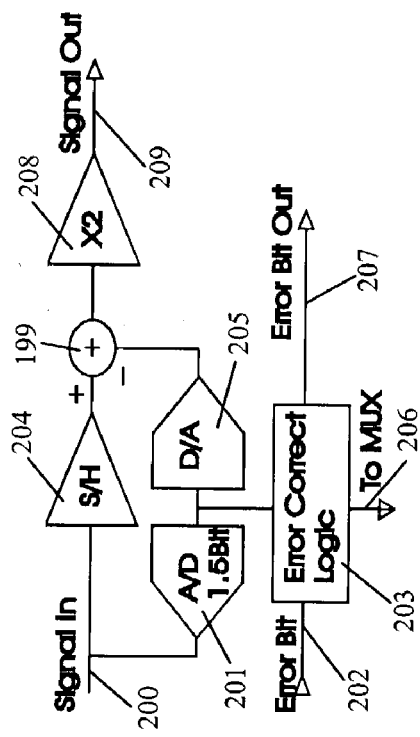
FIG. 20 is a single stage or one bit of the 6-bit pipeline A/D converter.

The A/D converter (ADC) consists of six one-bit sections 191 pipelined in series. Each A/D bit inserts one bit of data each sample time into Multiplexer 192. All six bits are read to the digital output during each sample time. Therefore, the data bit rate is six times the sample rate. Note that the latency time for a conversion is six sample periods, and the bits will have to be reordered off chip to reassociate the bits from each sample period. The circuit timing is controlled by the input clock 193 and a synchronization signal not shown. A block diagram of the pipeline stage is shown in FIG. 20. A single one-bit pipeline stage consists of a 1.5-bit A/D 201 (i.e. 00,01, 10 are valid outputs), which has two simple comparators for detecting one of three levels. The signal 200 enters a sample and hold (S/H) circuit 204 and also A/D 201. The output of the 1.5 bit A/D 201 goes to the D/A 205 and is summed 199 with the sampled and held 204 signal and the signal is output 209 with a gain of two circuit 208 to the following stage. The Error Correction Logic 203 derives the error bit output 206 and 207 from the AID result in combination with an error bit 202 from the previous stage. The error bit out goes to the Error Correct Logic 203 at the next stage, that is the cumulative error between the digital outputs up to and including this stage is sent as one bit of data 207 to the next stage. Although this looks like a large amount of circuitry, all of the S/H and gain 204 can be performed with one switched capacitor amplifier. The 1.5-bit A/D 201 consists of two clocked latches. The Error Correct Logic 203 requires about 10 gates. A second output 206 of the Error Correct Logic 203 goes to the Multiplexer 192. An output of the divide by 6 counter 194 also goes to the MSB A/D bit.

Digital Signal Processing

In order to process the ADC signals and determine the photon rates and spectrum, an algorithm has been developed that can be implemented in a field-programmable gate array at the required rates. The algorithm performs a peak search that is triggered whenever the ADC value increases by more than a preset threshold value from one sample to the next. After such a trigger, the ADC values are tracked for a period (n samples) that is set to safely cover the signal rise time. The difference between the maximum value encountered during that period and the last ADC value before the trigger is taken as the signal amplitude. The pulse amplitudes are used by a multichannel analyzer circuit to increment bins in the channel energy histograms. The histograms may be read out at any time by the data acquisition computer. To avoid being too sensitive to the size of the search window, the peak search can be terminated prematurely if the signal drops below the maximum (up to that point) by more than a preset cutoff trigger. As soon as the peak search is complete, the algorithm reverts to waiting for the next trigger.

In order to have a reference for comparison, a discrete-time version of the digital section of the BETA chip was used, which was previously developed at NOVA. In the BETA chip, the analog signals from each channel are sent to five comparators set to different thresholds, and the output pulses from each comparator are counted for preset time periods, resulting in a coarse spectrum of the x-rays hitting the detector. To avoid spurious counts due to noise fluctuations that are superimposed on the actual signals, the comparators have a (fixed) hysteresis. This scheme is approximated by incrementing the appropriate bin of a histogram whenever $V_o$ 186 increases between two successive sampling points and crosses the threshold associated with that histogram bin in the process. At the same time, any further increments to the affected bin are disabled until $V_o$ 186 falls below the threshold by a predetermined amount. At photon rates that are low enough to neglect pile-up each pulse starts at the signal baseline and crosses all thresholds up to its pulse height. As a result, each histogram bin represents the integral of the photon spectrum above the respective threshold. The actual (measured) spectrum is obtained by subtracting from each bin the contents of the next higher bin. In the presence of pile-up, the spectrum gets distorted not only due to the fact that the piled-up pulses trigger higher thresholds than they would by themselves, but also because the assumption that a signal of a given height will trigger all comparators below that height is no longer valid. As a result, the low-energy photons tend to get undercounted; in extreme cases, the spectrum may have bins with negative counts.

The main emphasis of the work has been on the peak search algorithm described at the beginning of this section. Its main advantages over the comparator-based method are a better response to pile-up, slightly improved energy resolution, and, most importantly, its potential for significant improvement through simple modifications, as discussed below.

The improvement in resolution is not straight forward. By using the slower signals, the ability to recognize closely spaced pulses as separate photons is reduced. In the data, this manifests itself as a reduction in the photon detection efficiency from 87% to 81%. This efficiency, however, can be modeled reliably, provided the pulse shape and the time structure of the x-ray source are known. As long as the measured photon rate is a monotonic function of the true rate, the latter can be deduced from the data. Data shows that the function is increasing for photon rates up to at least 2.1 MHz. With the current parameters, though, it is not expected that the increase to continue to much higher rates; between 2 and 2.1 MHz, the marginal efficiency (i.e., the change in the measured rate divided by the change in the true rate) is already down to approximately 25%. There is good agreement between the shape of the rate dependence and the data.

The analysis procedure used to obtain the results has been modified from the model discussed at the beginning of this section in one additional point not mentioned so far. The initial simulations showed that subtracting the last pre-trigger ADC value from the height of the subsequent peak actually decreases the energy resolution, compared to just using the maximum value without any baseline subtraction. This can be understood by considering that, for pulses that are added to the falling edge of a preceding signal, the last ADC value before the trigger significantly overestimates the baseline that needs to be subtracted from the peak, more than not subtracting it would skew the result. The only case in which this assertion is not true is when the two pulses are so close together that they are unlikely to be resolved in the first place. The data shows the effect of the baseline subtraction, which leads to a low-energy tail without causing significant improvement to the pile-up that is present on the high-energy side. It should be noted, though, that it will not be possible to just ignore any kind of baseline subtraction in the actual implementation of this processing scheme. Some amount of slow baseline drift is expected, for example due to varying leakage currents as well as a (rate-dependent) quasi-DC contribution caused by the low mobility of the holes. This drift will degrade the energy resolution if it is not taken into account. To do so, it is planned to modify the subtraction procedure by updating the baseline register only when sufficient time has elapsed since the last trigger to ensure that the signal has returned to its quiescent level.

Data also compares the two ADC alternatives that are considered, using six and eight bits respectively. The resolutions seen with the six-bit ADC are not noticeably worse than the corresponding values for eight bits, indicating that quantization error is not yet a significant factor. In fact, given that the six-bit results shown are binned in increments of two ADC counts, it is expected to have some safety margin here.

While the results discussed above are promising, it is important to note that in this system we have to plan for independent processing of several hundred to a thousand channels. Using a 60 ns sampling interval, and a 6-bit ADC, a module with 128 channels will continuously process 1.6 Gbytes/s of data. The output energy and channel number data going to the multichannel analyzer for histogramming will reach a peak sustained rate of 320 Mbytes/sec, assuming 8 independent buses are used, covering 16 channels each. Data processing at these rates is certainly one of the critical risk areas in the design, and requires careful attention. For preliminary study, the algorithm described above is implemented, watching for upward steps greater that a certain threshold, noting the immediately prior ADC value, finding the peak within a window after the threshold crossing, and reporting the peak minus the prior value as representing the energy of the pulse. Sixteen such signal processing channels, together with the necessary output buffering and merging FIFOs and channel number encoding, were designed into a Xilinx XC4020XLA field-programmable gate array. In a BGA package, this is 27 mm square. Resources used were 584 of 784 CLBs, 446 of 1569 flip-flops, 746 of 2352 elementary logic gates. Performance at a 70 ns sampling interval was achieved using only basic optimizations, and it certainly can be improved to 60 ns. Input data was generated by the preamplifier/ADC simulation code described above, and then fed into the Xilinx development system simulator for simulation of the physical FPGA design. The pulse energy output data was in agreement with the C code implementation of the algorithm described above. There are sufficient resources free in the FPGA to add a small FIR filter to the front end of the signal processing chain, a refinement which will be explored and which may yield improvements in the energy resolution, by making it less critical to hit the real peak value with one of the sample points. These results demonstrate the feasibility of processing the signals at the planned rates. After the algorithm has been explored further, it is planned to study various implementations in field-programmable gate arrays and software DSP chips, to evaluate performance and also the flexibility in accommodating more refined algorithms. One such refinement that was considered would monitor the signal rise time, i.e., the number of samples between the trigger and the peak. This parameter could then be used to reject from the spectrum (but not necessarily from the total signal count) those pulses for which a long rise time suggests that this is unresolved pile-up.

Hyperspectral X-ray Detection and Imaging

The discussed hyperspectral detector and sensor systems naturally and simultaneously produces spectral information for the imaged x-rays. Since only two physical processes are involved in obtaining information about the material imaged, it may be not necessary to produce detailed energy spectra with a very large number of energy levels for some applications. In the typical x-ray imaging application, such as package inspection or quality assurance, the principal advantage of having an energy resolution of 10% or better is not so much the ability to obtain images simultaneously at ten or more energy levels. The data obtained in this manner may not be fully used and only serve to elongate the task of extracting the relevant information (i.e., the presence and location of contraband or material defects), particularly if that information is needed in real time. Rather, the benefits of having a good energy resolution lie in two other areas. One is the ability to adjust the energy bins to the specific requirements of the application under consideration—i.e., the atomic number, density, and thickness of the material(s) of interest—without major hardware adjustments that might even require a complete redesign of the system. The resulting versatility, which will be enhanced by a modular design, will reduce overall cost and enhance the market potential of the detector system. The other advantage of a good energy resolution is the improved ability to resolve even small differences in the effective atomic number of the material traversed. This is expected to be particularly useful in the detection of contraband that is chemically similar to any legitimate contents of the packages under inspection, for example, explosives, drugs, or illegally imported agricultural products that are hidden among other organic materials. Here again, the energy resolution will not so much be used to obtain information at all available energies, but rather to precisely tune the boundaries between a small number of particularly relevant bands.

The Design of the CdZnTe Detector for Higher Energies

Detecting x-ray photons at energies up to 180 keV and beyond with reasonable efficiency requires a detector thickness of at least 5 mm, preferably significantly more. On the other hand, that thickness is limited by considerations such as the need to fully deplete the detector, maintain a homogeneous electric field throughout the material, and obtain a good charge collection efficiency. The anticipated improvements in the material quality will help the achievement of these goals.

Another consequence of a large detector thickness is the deterioration in spatial resolution that invariably results, just from geometrical considerations, when the pixels have a large aspect ratio. This effect will be of particular importance in systems that consist of a single x-ray source illuminating a long detector array, due to the angle at which the photons hit the extreme pixels. To compensate for this angle effect, we can take advantage of the modular design of our system by placing the outer modules at an angle themselves, if space constraints do not prohibit this solution. The large aspect ratio, as well as the resolution limitations coming from the increasing probability for Compton scattering at high photon energies, also suggest that it would not require the reduction of the pixel size below the specification of 1 mm$^2$ for this type of applications. However, other applications may require much smaller pixel size.

In order to further improve the detector quality and yield, the design will contain a guard ring that completely surrounds the pixels, as shown in FIG. 13 (bottom figure). This will reduce field inhomogeneities in the outer pixel and the effect of material defects that are introduced in the cutting and polishing of the crystals and other processing steps. Combined with the requirement for a contiguous pixel coverage of the detector system, such a guard ring implies that the crystals will have to be arranged in a staggered array. Although this staggering increases the complexity of the overall design, as well as the requirements that will have to be placed on the data analysis, we believe that this is a price worth paying for the improvement in detector quality and yield that a guard ring will afford us.

The overall size of the individual detector crystals is again subject to competing considerations. The use of small crystals would improve the detector yield as the range of grain sizes that are suitable for producing detectors of the requisite dimensions is extended to lower values. On the other hand, the amount of material required for the guard rings increases as the crystals get smaller, as does the complexity of mounting and aligning the detectors and connecting them to the readout electronics. A "natural" compromise is suggested by the number of channels per readout chip. Consequently, it is planned to design the detector with 16 pixels per crystal.

The final consideration concerns the mounting of the detectors. From the point of view of noise reduction, the ideal solution would seem to be to combine the detector and readout chip, along with the necessary bypass capacitors, bias resistors, etc., on one common hybrid, minimizing parasitic capacitances. This, however, would require procedures for testing both the detectors and the readout ASICs before mounting, unless we can establish that the yields of both components are sufficiently high to still result in an acceptable yield of the combined hybrids. This is an area where improving the component yields not only reduces cost, but may directly lead to an improved product. The next best option will be to equip the detector and chip hybrids with matching, low-capacitance connectors.

Design of the Readout IC and Digitization System

The design of the readout system for the hyperspectral imaging, from the integration and amplification of the detector pulses to their digitization and the processing of the digital signals to extract the energy and rate information is discussed here. In designing the readout electronics for the detector system, the main challenge comes from the requirement that the system should be able to detect photons at rates above 2 MHz with minimal dead time, while achieving an energy resolution much better than 10%. This resolution needs to be maintained in the presence of the noise and significant pile-up resulting at the maximum rate, and without overtaxing the data processing resources that can be brought close enough to the detectors.

Such a concept was obtained by starting with the design of the BETA chip that had previously been developed by NOVA, evaluating each of its components for its suitability in meeting the required applications specifications, and applying quantitative improvements as well as qualitatively new ideas as needed to achieve the goals. BETA is a 32-channel mixed-signal ASIC that was designed for reading out x-ray detectors at photon rates up to about 1 MHz and provide some very basic information about the photon energy. Each channel consists of a charge-sensitive input amplifier followed by two gain stages with gain and offset adjustments. The output from the second gain stage is sent to five comparators with different (externally supplied) thresholds that span the relevant range of pulse heights. Each comparator is followed by an eighteen-bit counter. At intervals determined by external support electronics, the 160 counters on a chip are read out sequentially and reset. The new chip will be different slightly as the detector input will go into a charge sensitive preamplifier. The output of the preamplifier will be amplified by another amplifier before it goes into a ADC. The digital output of the ADC will be processed by a digital processing system such as an FPGA (Field Programmable Gate Array) or a microprocessor.

Another important consideration in the design of the readout system is the type of process to be used in fabricating the chips. Previous ASIC designs developed at NOVA have used CMOS processes, and this type of process has also been assumed in the simulations used to establish the feasibility of our design concept. However, the option of using a BiCMOS process can be considered, to take advantage of the improved performance, especially speed, that a bipolar design could offer for several circuits on the discussed fast new ASIC.

System Integration

Our current plan for the overall system design calls for independent modules with eight 16-pixel detectors each, for a total of 128 data channels per module. These modules can be combined to form larger contiguous detector arrays whose length will be limited only by such considerations as the overall data rate that can be processed by the data acquisition system and the loss of resolution as the photons hit the detector pixels at increasingly oblique angles. The modules will be configured and read out by a separate control board, using a suitable bus architecture. This approach has been used by NOVA, with good results, in developing readout electronics for other projects such as a prototype Compton scattering camera for a SPECT (Single Photon Emission Computed Tomography) system. Extremely large arrays may require multiple control boards in cases where the bandwidth of the data bus would otherwise be exceeded.

As mentioned above, successive crystals on a detector module will have to be staggered relative to one another in order to maintain complete detector coverage even with the dead area that the guard rings around each crystal will introduce. To preserve this staggered arrangement even more than one module, the boards will be designed to allow the overlap of a few millimeters at each end that is needed to account for the space taken up by the guard rings.

The result of the modular design will be a highly versatile system that can easily be adapted for a wide range of applications just by combining the desired number of modules to form the overall system. In the long run, this versatility will lead to a significant reduction in development cost, which in turn will greatly enhance the system's market potential.

Two-Dimensional Sensor Array

In a new embodiment two-dimensional hybrid sensor arrays are developed with a new readout ASIC based on the RENA-2 IC. The hybrid pixel detector design and the solid state detectors will be discussed first then the ASIC will be described.

Hybrid Pixel Detector System

Figure 26:
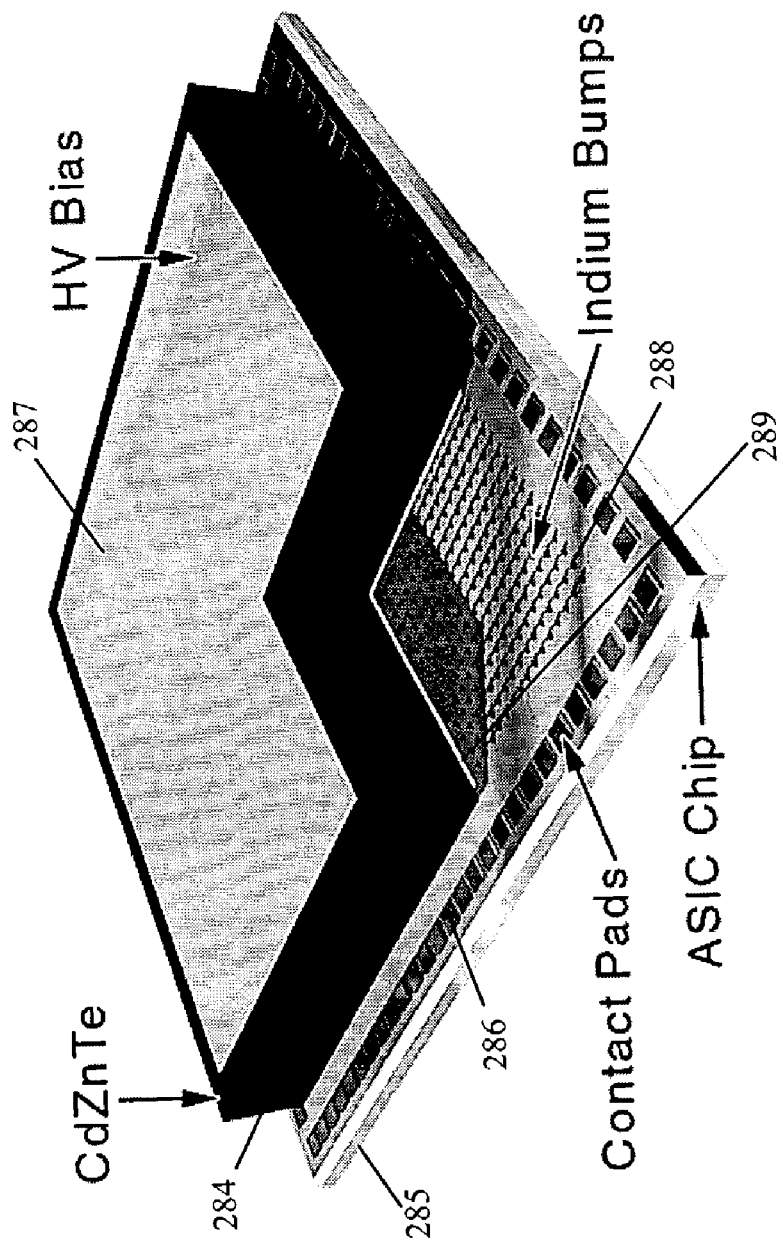
FIG. 26 is a drawing of a hybrid pixel detector indium bump bonded onto the readout ASIC.
Figure 29:
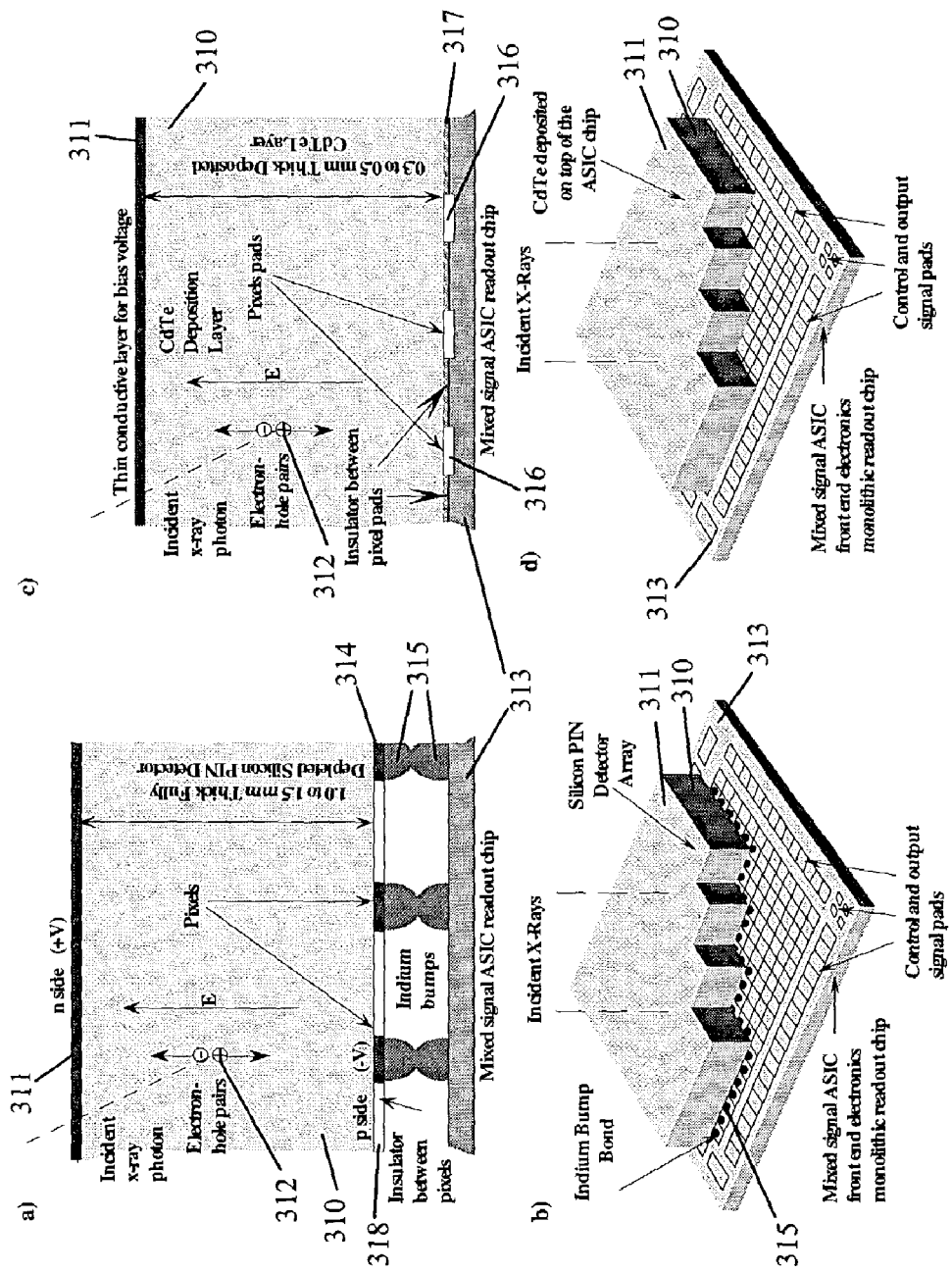
FIG. 29 is a drawing of hybrid pixel detectors where the two-dimensional detector array is mounted using (a) indium bump bonding and (b) direct deposition methods.

FIG. 26 and FIG. 29 (*a* & *b*) show a concept drawing of the hybrid pixel detector and its structure. It shows the pixilated solid state detector such as CdZnTe detector 284 and 310. On its top is the gold or platinum HV bias electrode 287 and 311. Under the solid state detector there are pixel electrodes 289, 292 and 314 made from gold or platinum. The pixilated readout ASIC 285 and 313 is shown under the solid state detector. The detector 284 and 310 and ASIC 285 and 313 have identical pixel size and geometry so that they will match when bonded together. Normally both the detector and ASIC pixels have indium bumps 288, 293 and 315 on them. The detector pixel array and the ASIC are aligned and pressed together so that the indium bumps join and produce the contact between the detector pixel and the ASIC input circuit. Solder and other bonding systems such an asymmetric conductive medium may also be used to produce a contact between the detector pixel and the ASIC pixel input. The electron-hole pairs 312 produced by an x-ray photon is also shown. The ASIC also have contact pads 286 on the perimeter, one, two, three or four sides, so that it can be connected to external circuitry, control system, power supplies, ground, I/O, etc. The detector and ASIC may have all shapes, physical dimensions, thicknesses, sizes, array dimensions, pixel pitch, pixel geometry, etc. depending on the application.

Two-Dimensional Pixel Detectors

Figure 27:
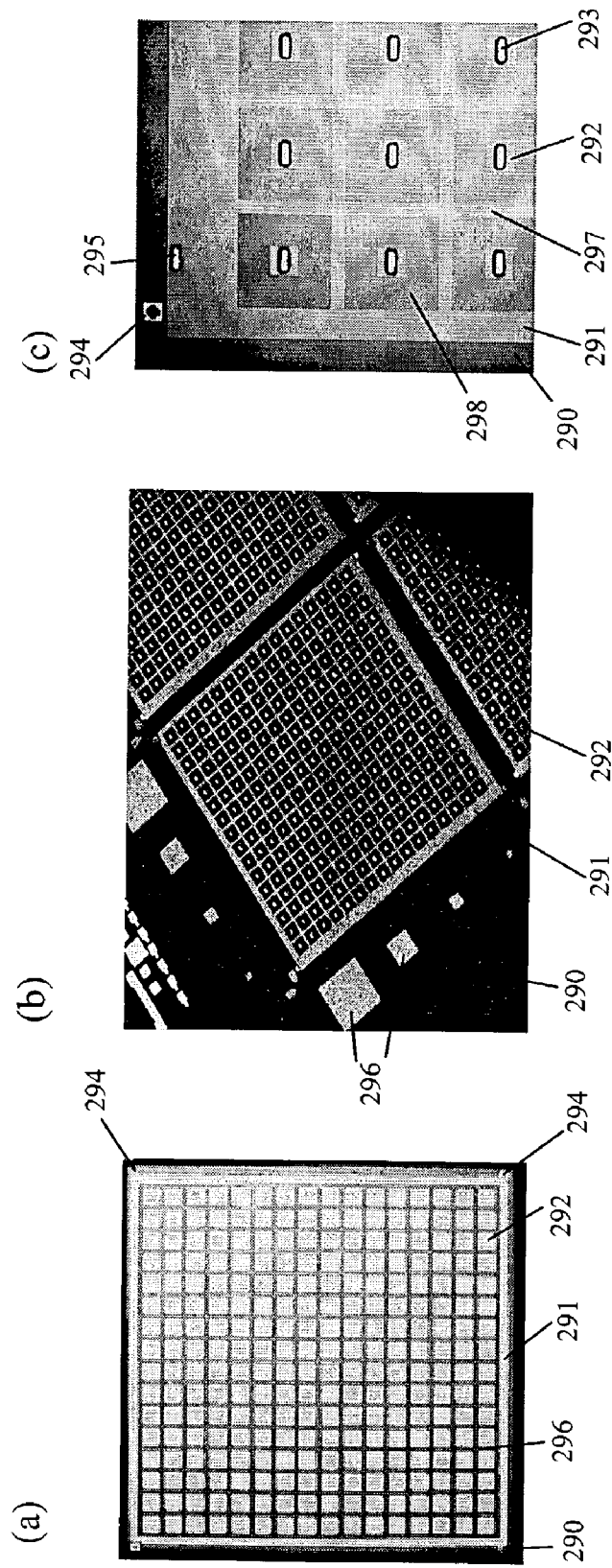
FIG. 27 is a design of the two-dimensional CdZnTe pixel detectors with varying pixel geometries.

FIG. 27 shows fabricated CdZnTe detectors 290. These CdZnTe detectors 290 with pixel electrodes 292 are fabricated and the indium bump 293 bonding is carried out as described above. This process needs high quality solid state detector material such as single or polycrystaline CdZnTe, GaAs, Si, Se, Ge, $HgI_2$ and $PbI_2$ material; fabrication of high-quality gold or platinum or other type of electrodes 292 for the pixels 292 and the HV bias pad(s) 287. The indium bump bonding is an important technique for producing low-capacitance, high-quality uniform bonds between detector arrays and ASICs. The pixel array consists of 16×16 array of 300× 300-micron pitch (250×250-micron pixel pad area) gold pixels (FIG. 27).

Figure 33:
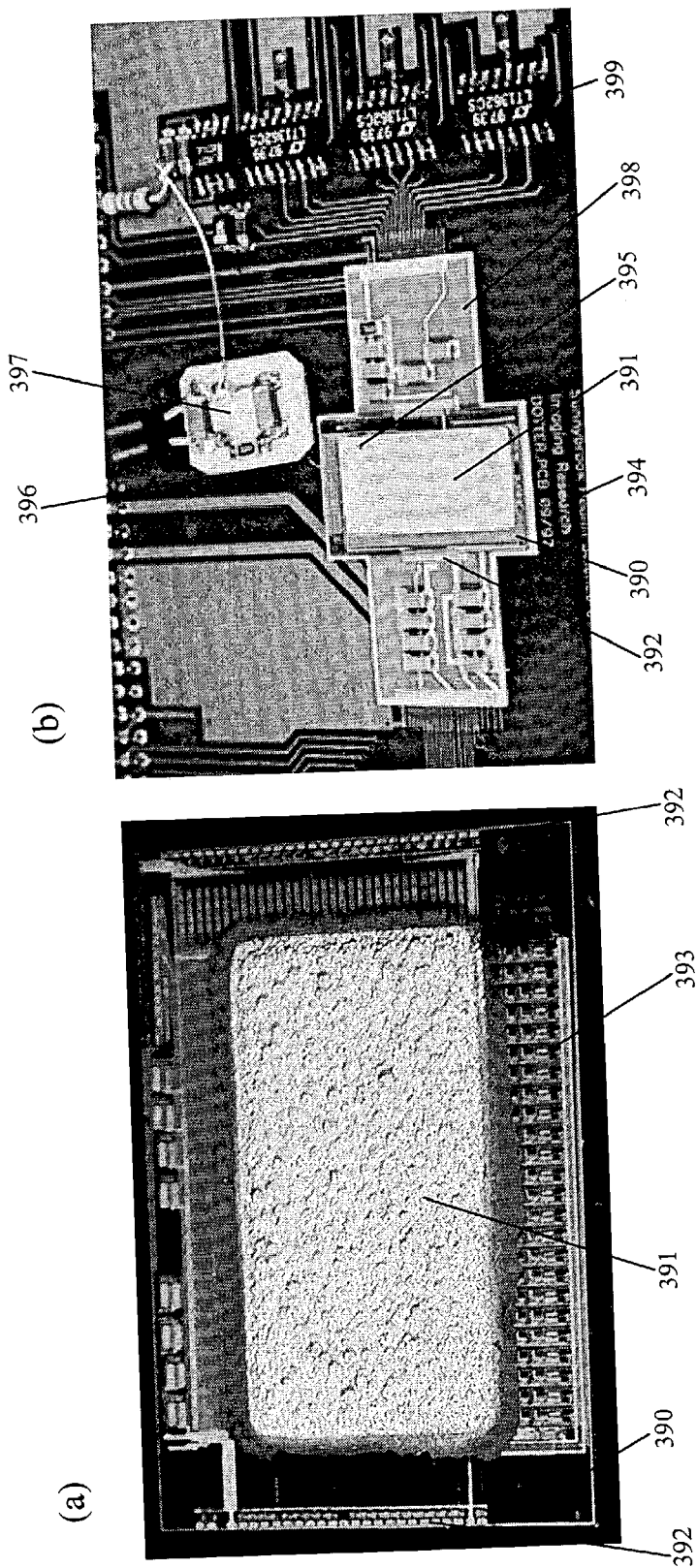
FIG. 33 is a drawing of high spatial resolution two-dimensional hybrid pixel detectors with TDI.

After the crystals had been prepared, rectangular indium bumps 293 were deposited both on the crystal readout pads and on the corresponding ASIC pads. Using alignment marks 294, the two were then aligned on top of each other, the pixilated indium bump sides facing each other, and pressed together to fuse the bumps, a process which takes place at room temperature. If necessary, an underfill of insulating epoxy can be used between the ASIC and the CdZnTe to provide additional support and provide a more robust assembly. It is also possible to epoxy the sides or just the corners. In practice, with a large number of small pixels, this is not usually necessary. The IIV Bias (see FIG. 33 wire 397) connection to the HV pad 287 is made through a wire (see FIG. 33 wire 396), which is connected to the HV pad 287 through a conductive epoxy (see FIG. 33 connection 395) or other means. The other side of the wire goes to the HV connection on the carrier substrate and then to the detector board (see FIG. 33 wire 397). A guard ring 291 is also fabricated around the periphery of the pixel array to protect pixels from edge effects and allow also a more uniform response throughout the two-dimensional array.

The guard ring is also connected to the readout ASIC using one or more indium bumps 295. This will allow the biasing of the guard ring with respect to the pixels. For example, the guard ring 291 can be biased to ground, or any other negative or positive voltage, which produces the best results. The biasing of the guard ring 291 is done through the ASIC by external circuitry. Other novel guard ring structures can be also designed such as the grid type guard ring 297 shown in FIG. 27 (*b* & *c*).

The design of the CdZnTe pixel array is normally drawn on a computer using special program and then it is transferred onto high-resolution quartz masks, which is used to fabricate the electrode structure on the solid state detector. The high quality gold pixel structure 292 is deposited onto the CdZnTe substrate as shown in FIG. 27. Then the indium bumps 293 are deposited on both the CdZnTe and the ASIC pixels, the CdZnTe array is bump bonded onto the ASIC and the ASIC is wire bonded with the detector onto the supplied ceramic carrier 303.

Many different pad geometries can be utilized. In FIG. 27 two different pad geometries are shown FIGS. 27(*a*) and (*b* & *c*). They are both designed to have 300-μm pitch to match the ASIC. The first of these, FIG. 27(*a*), has a standard array of 250-μm square pads 292 with a 50-μm interpad gap 296. The second as shown in FIG. 27 (*b* & *c*), which is produced recently, has smaller pads, 80-μm square 292 in FIG. 27(*c*), with an interleaved steering electrode grid 297 designed to modify the field in the region of the readout pixel and thereby decrease tailing due to the hole trapping. This technique is also resembles to the Frisch Grid Effect. FIG. 27 (*b* & *c*) details an enlarged area of a single array with the new pixel geometry showing the readout anode pads 292 and the steering grid 297. FIG. 27(*c*) shows an enlargement of the pixel structure and the actual indium bumps 293 deposited onto each pixel pad. On top of the photographs the indium bump 295 for connecting the guard ring and the steering grid to the ASIC is also shown. The new steering grid with guard ring structure (FIG. 27 (b & c)) is an improved pixel array compared to the standard guard ring structure (FIG. 27(a)).

Many different ways of implementing the new steering grid structure is possible. In another embodiment a double or triple steering grid array(s) can be used. In this case, there are concentric squares or circles of steering electrodes around the pixel pad 292. These steering squares or rings (not shown) can be made touching to each other or not touching each other or the steering grid array 297. In this embodiment the connection to these steering electrode(s) can be made on the readout ASIC through indium bump bonds. Using this connection, the internal steering electrodes can be powered or connected to ground. If necessary the steering grid 297 can be disconnected from each other and/or from the guard ring 291. Therefore, this new technology can open the way to reduce or eliminate tailing effect in the spectrum due to hole and electron trapping and improve the energy resolution significantly.

Figure 21:
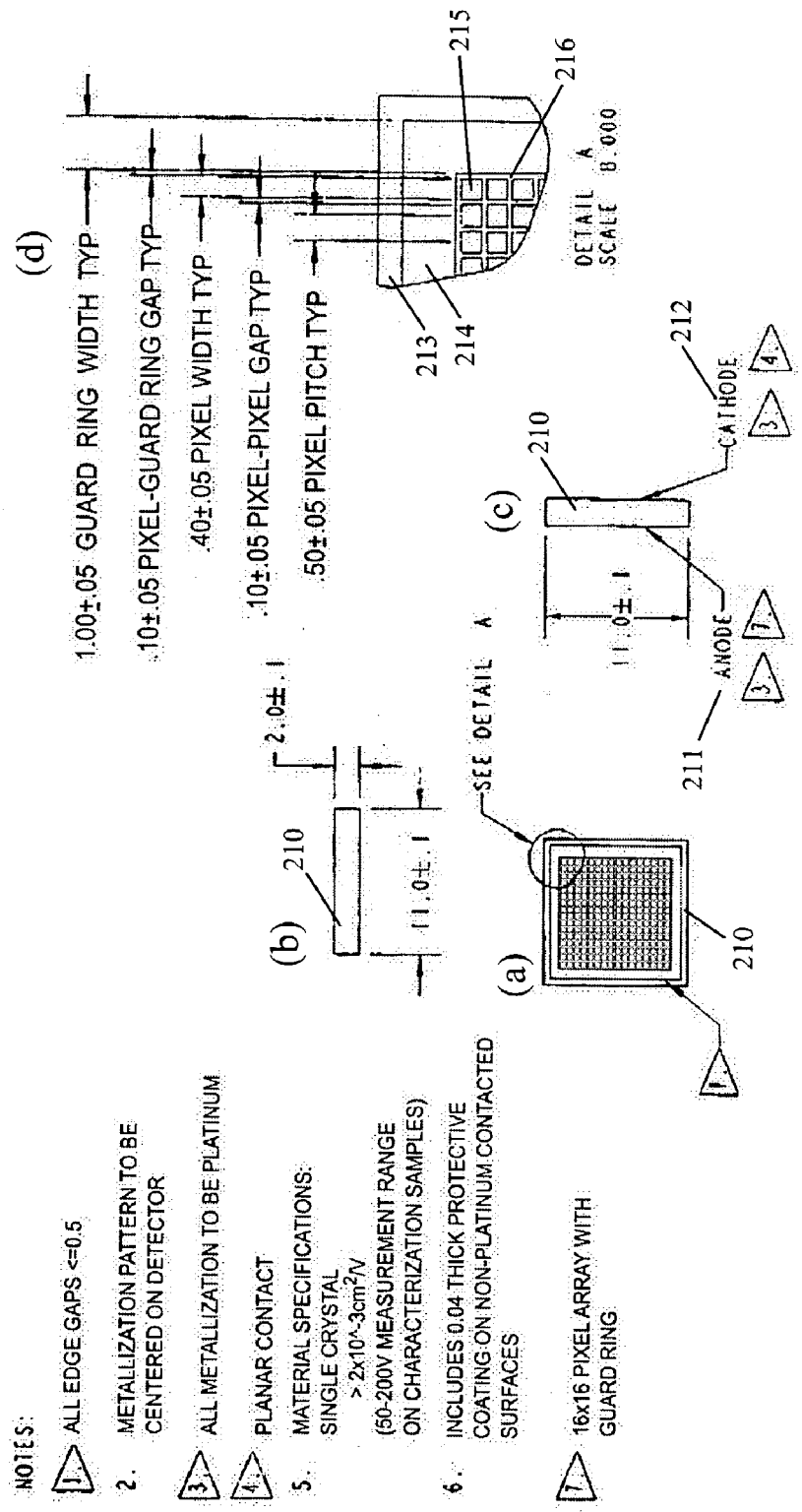
FIG. 21 is a two-dimensional pixel detector array with guard ring.

FIG. 21 shows another similar two-dimensional pixel array 210 with a standard guard ring 213 and pixel pads 215 and inter pixel gaps 216. The anode 21 land cathode 212 are also shown.

Two-Dimensional Sensor Array Readout ASIC Design

A custom 16×16 pixel array ASIC with 300-µm pitch is designed using the RENA-2 electronic circuitry. This ASIC can use identical analog processing chains of both RENA and RENA-2 ASICs (FIG. 2 & FIG. 12) inside every pixel of the total 256 pixels. It is also designed to be compatible with all kinds of solid state detectors and sensor arrays such as CdZnTe and silicon. It will be also externally configurable for detection of positive or negative charges for the whole chip or at each pixel. The identical shaping time constant for each chain can be selected from about 10 ns to 100 µs to accommodate different charge collection times. The functionality of each pixel will be same as a RENA or a RENA-2 ASIC. However, it will be different in the sense that the sensor array will be a two-dimensional pixel array and the detector will be connected on top of the readout ASIC using special bonding such as the indium bump bonding as described above. The digital electronics developed for the RENA and RENA-2 chips such as sparse readout mode, I/O, reset, circuitry, etc. are also modified and used in the new two-dimensional ASIC.

The chip has several parallel logic inputs that select one of many functional modes. In one of its normal operations, the chip waits in Mode 0 for an x-ray event to occur. When this occurs, a trigger flag is set in each pixel where the peak-detector voltage exceeds the threshold voltage. When one or more trigger flags is set the ASIC's trigger output is raised, alerting the processor controlling the chip. To read out the event the chip is put in Mode 1, where the pixel number and held analog peak voltage are output for each triggered pixel, in an order determined by the chip, with the readout timing controlled by a clock input to the chip. After the last triggered pixel is read out, the trigger output is lowered. The ASIC may then be put in Mode 2, where the peak voltage for additional pixels may be read out by inputting the pixel number on the ASIC's address bus, and pulsing the chip's clock input. After the readout is complete, the ASIC is put in Mode 3, where capacitors in the analog electronics are discharged, and digital signal paths reset. This refresh cycle, which requires 50 µs, is followed by a return to Mode 0, to await another trigger. In the absence of any triggers the refresh cycle may be preformed periodically (for example, about every 100 ms) because of charge build-up resulting from a large detector leakage current. The chip using the RENA-2 circuitry will be tolerant to leakage current and will not need refresh reset cycles. A chip using RENA circuitry may need periodic refresh cycles as it is not as tolerant to the detector leakage current.

Mode 4 and 5 are used for disabling and enabling the triggering in individual pixels, allowing any noisy pixels to be masked. Mode 6 and 7 are for enabling and disabling for individual pixels the input of an external calibration pulse into the front end of the pixel analog electronics. There are other modes are used which are similar to the modes in RENA-2 ASIC. An important factor is the new sparse readout capability built into the RENA-2 readout ASIC. The new technique using a hit register 22 can be used with ease for reading out nearest neighbor pixels in a two-dimensional pixel array. This will be useful if the pixels are small and charge sharing can become significant between adjacent pixels.

Figure 24:
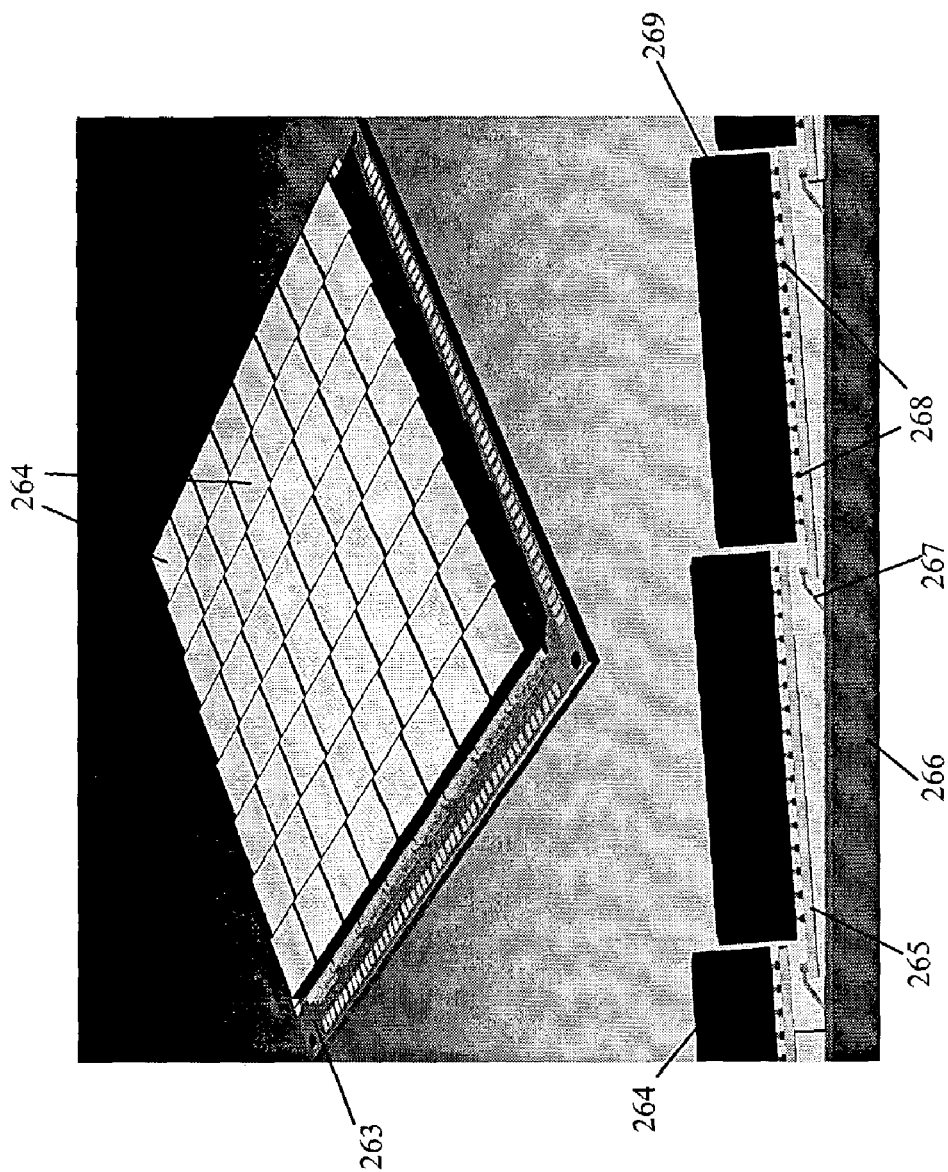
FIG. 24 is an abutted two-dimensional sensor array of pixel detectors.

This circuit can be made abutable on one, two or three sides to facilitate tiling to form larger arrays. This means that all the I/O and power pads must be on three, two and one side of the ASIC, respectively. For example if the connection pads are on two adjacent sides, then 4 sensor arrays can be abutted to each other using the two adjacent sides with no connection pads to form an array with effectively 4 times the active area. An array with all the connection pads are on one side of the ASIC can be abutted to form a uniform array of any size as shown in FIG. 24. Where the individual pixel detectors 264 are mounted as shown at the bottom section of the figure onto a printed circuit board (PCB) 263 and 266. The solid state detector such as CdZnTe 269 is indium bump 268 bonded onto the ASIC 265. The ASIC is wire bonded 267 onto the PCB 266. The ASICs rest on wedge shaped supports under them (not shown) so that they clear the ASIC connection pads and the wire bonds 267 of the ASIC behind them. The HV bias is applied to the top surface 264.

Two-Dimensional ASIC Performance

For optimum energy resolution and to ensure a low energy threshold, it is vital that the electronic noise be minimized. This noise is a combination of chip noise coupled with the capacitance of the CdZnTe pixel, its leakage current and noise injected from peripheral circuits such as power supplies, voltage references and noise pickup. Fortunately the CdZnTe pixel capacitance and its leakage current are proportional to the area and the volume of the pixel, so that the fine 300×300 $\mu m^2$, pixel pitch reduces both the leakage current and the pixel capacitance. The ASIC's input MOSFET transistor for the charge sensitive amplifier has been optimized through SPICE simulations to achieve minimum noise. In addition, the transistor gate size is designed to match the detector input capacitance.

The input charge sensitive amplifier, is designed for ultra low noise operation. Therefore, a pure integrating charge sensitive amplifier can achieve such low noise. However, pure integrating type amplifier requires low detector leakage current because the leakage current is continuously integrated and the baseline increases requiring periodic resetting of the whole chip to keep the energy resolution high. This can become a major problem if detector has significant leakage current. The SPICE simulations showed that the design of the input amplifier would only produce about 22 electrons rms noise at each pixel. This is excellent.

The ASIC noise is found to be about 27 electrons RMS at room temperature with a shaping time constant of 2.5 µs, in good agreement with simulation results. Linearity measurements on the analog section are also very good, about 6% over the dynamic range. The power consumption is approximately 80 µW per channel.

A possible different embodiment of the pixel detector system for higher energy photons about 50 keV and above is described below:

1. The complete readout system, including the pixel anode, cathode and non-collecting grid signal acquisition, is integrated onto a single ASIC with 32×32 pixels. Sparse readout is built in with near neighbor readout capability to add all the signal shared around a pixel which has produced a trigger. The trigger for each event will be also produced from the pixels where the signal is the strongest and best quality. This allows a low threshold response to collect all the charges produced by multiple Compton scatters inside the CdZnTe pixel detector. The rest of the electronics is performed by dedicated FPGA(s) and a fast microprocessor or DSP chip. Therefore, the whole data acquisition system for an array of detectors, such a 3×3 or 4×4 (FIG. 28 (*a* & *b*)), is contained inside the complete module. An extra board is used under the PCB (FIG. 28(*a*)) to house the FPGA(s) and the Microprocessor.
2. The time, energy and position information on each Compton scatter or photo electric absorption for each incident photon inside the detector substrate is very accurately measured and recorded. This information is used to determine accurately the incoming photons energy, position on the detector and direction. Such a detector may use a collimator to limit the direction of the incident photon or may not use a collimator depending on the application.
3. The time information is used to determine the correct energy of each interaction as the pulse height variation and difference between the cathode and the anode can be determined by determining the depth of the interaction. The energy and position information can be used with the Compton scatter formula to determine the direction of incident photon. Summation of all the energies deposited at each interaction point gives the total energy of the incident photon.
4. The charge collection times is determined by using the pixel anode signals instead of using the non-collecting grid. This will mean again low thresholds and much higher quality and faster signal. The time difference between each interaction for the same event is determined similar to the technique developed for the RENA-2 ASIC. In this technique the phase difference between two out of phase periodic signals such as sine waves is recorded and analyzed using the trigger output of each triggered pixel.
5. The pixel sizes is reduced to about 500×500 µm. This reduces the leakage current by about a factor of 4 to ≈250 pA/pixel. This also improves the small pixel effect.
6. A new front end electronics circuit is developed using the circuitry of the RENA-2 ASIC in each pixel as described above. The new circuit has a resistive feedback on the charge sensitive amplifier which increases the chip's tolerance for leakage current. This new circuit also designed for low noise, it has larger dynamic range above 1 MeV, special fast trigger output with low jitter, 16 selectable peaking times from 0.4 µs to 10 µs and polarity is individually selectable at each channel.
7. The cathode can be divided to several sections to improve the cathode signal quality by reducing capacitance. The circuitry required to read the cathode(s) and the non-collecting grid can be placed onto the new ASIC. Benefits of using the proposed hybrid CdZnTe pixel detectors.
8. The data analysis process is computationally intensive. However, data rates can be low for detecting nuclear material from a distance, which can help to carry out the data analysis on line and in real time. The availability of fast and sophisticated micro processors and DSPs will also help in this regard.

There are the following benefits for this pixel sensor system:

1. The energy resolutions same or close to HPGE detectors can be reached at room temperature by improving electronic readout and the detector configuration. All the charge from the pixel produced a trigger on the ASIC will be summed and also from the near neighbor pixels to achieve full charge collection capability to achieve high energy resolution.
2. The ASIC will do all electronics functions, aided by FPGA(s).
3. The higher Z and density of CdZnTe will allow smaller detector size, produce lower Compton scatter background and increase signal to background ratio.
4. Due to compact size it will be possible to make an array of detectors using a modular sub units such as 3×3 or 4×4 arrays of CdZnTe pixel detectors as shown in FIG. 29, to increase sensitivity to the required level.
5. Hand held and portable operation can be achieved. It may even be possible to carry it on a belt and the unit warns the operator when detects signal. The unit will also have a LCD screen giving all the information operator will need.
6. An on board microprocessor or DSP will be used to carry out online and real time data analysis for detecting and identifying nuclear materials, contraband, illegal substances, fissionable nuclear material, drugs, etc.

Two-Dimensional Very Fast ASIC Design

The two dimensional ASIC described above for two-dimensional sensor arrays uses the high energy resolution RENA-2 ASIC design with reasonably fast data acquisition rate. If a very fast two-dimensional ASIC is required, then we can use the circuitry described for the fast RENA-2, which was called BETA chip, in each pixel of the two-dimensional ASIC instead of the RENA-2 ASIC circuitry. The new ASIC is called Hyperspectral Imaging with Large Detector Arrays (HILDA) chip. It is a full custom ASIC designed for the imaging of x-ray events across a two-dimensional pixel array solid state detector. HILDA is conceived to be a two-dimensional array of "cells" that each has a detector preamp followed by many comparator and counter circuits similar to the BETA ASIC. Each cell also contains circuits for readout and reset functions to interface with external system components. The two-dimensional solid state pixel array detector will be attached directly to this chip, each detector pixel bonded to an ASIC cell. A custom two-dimensional solid state detector array such as a CdZnTe detector array as described above is designed and fabricated for use with HILDA as shown in FIG. 21.

Figure 22:
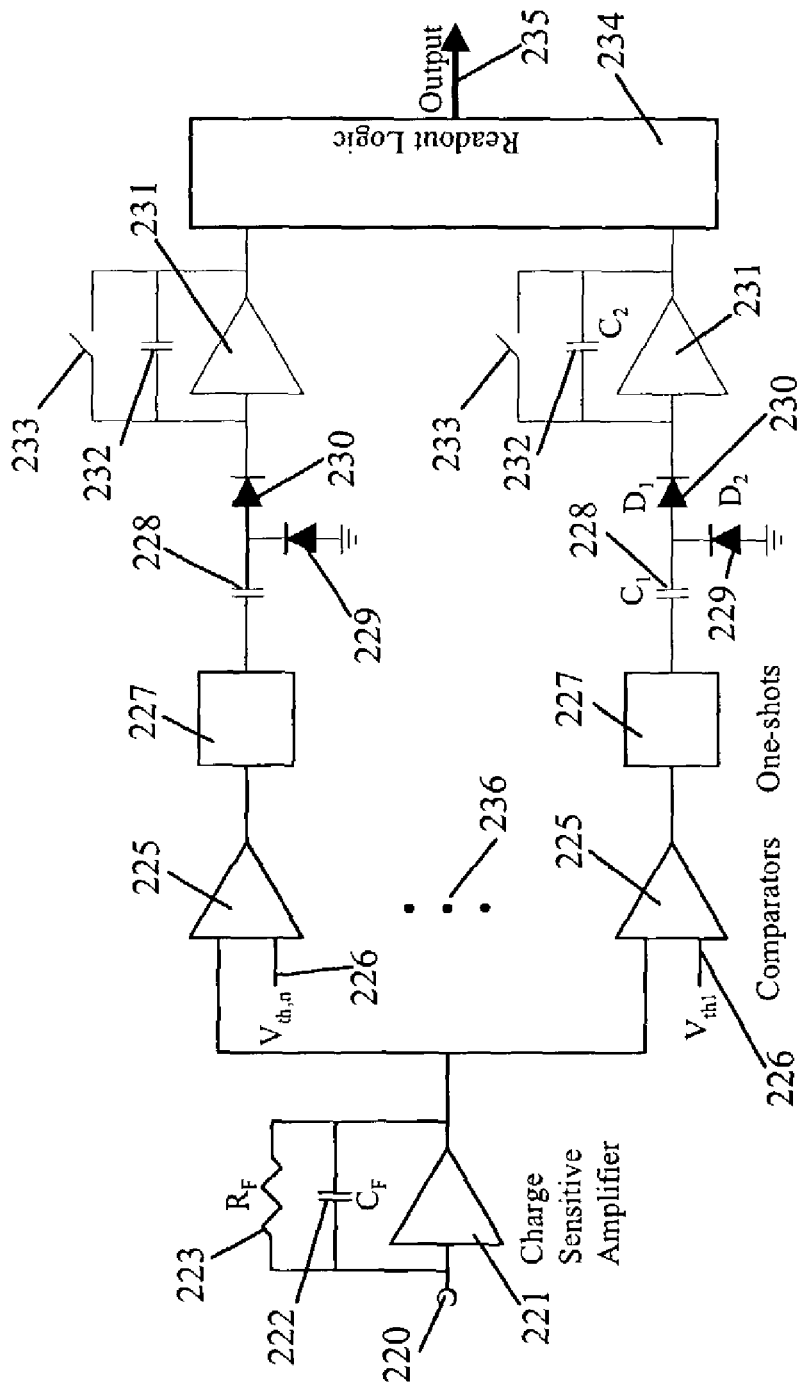
FIG. 22 is an analog counter circuit developed for the fast two-dimensional sensor array IC.

When a gamma ray is captured by a detector pixel, a charge pulse is presented to the corresponding cell 220 of the HILDA IC. A block diagram of the cell is shown in FIG. 22. The charge-sensitive input amplifier 221 of the cell must properly shape this pulse with the right frequency response and low noise in order to successfully detect the charge packet. This amplifier has the capacitor feedback element 222 and resistive feedback element 223. This amplifier is followed by an optional gain stage (not shown in FIG. 22 but shown in FIG. 16 151 and 152). This gain stage 151 and 152 can be reduced to one gain stage, increased to many or completely omitted. In order to determine the energy deposited by the photon, the charge pulse is then discriminated by a number of comparators 225, each of which is set to a different threshold 226 and has associated with it counter circuitry to determine the number of photons that exceed the threshold 226 in a given time.

What makes this chip highly innovative is that, in order to achieve a compact unit cell whose area does not exceed that of the corresponding detector pixel, we can use analog counters instead of the customary digital counters. When the comparator output goes high a one shot circuit 227 produces a small positive pulse which is used by the analog counter circuit proper. This circuit consists of a single stage amplifier with a large capacitive feedback. On the rising edge of the comparator pulse, charge flows through the diode D1 230 and is integrated on the capacitor C2 232. The capacitor current generated by the falling edge of the comparator pulse is blocked by D1230 and instead flows to ground through D2 229, allowing C2 232 to accumulate a charge that is proportional to the number of pulses counted. The integrating amplifier 231 has the integrating capacitor C2 232 and a switch 233 to discharge the capacitor so that a new counting cycle is started. Readout logic 234 allows the counts to be read out by the external circuitry and/or computer through output 235. There need to be other circuitry in the system so that while reading the counts accumulated the integrating capacitor can be protected from the accumulation of further counts. Periodically, the system will poll the results of the ASIC. After readout, the array is reset 233 and the timing is repeated. Note that the external controller can read the counter data in ever increasing complexity in order to reduce data bandwidth requirements. For example, after reading the lowest threshold counter result to find a very small value present, it may be decided that there is no need to read the rest of the counters in that cell.

The unit cell at each pixel such as FIG. 22 performs five basic functions which correspond to the major blocks seen in FIG. 22. These functions consist of:

1. Low noise charge pulse conversion to voltage pulse
2. Amplification of voltage pulse
3. Pulse discrimination with an externally supplied and adjustable threshold voltage
4. Pulse counting
5. Readout The input amplifier consists of a common cascode single ended preamplifier stage with a continuous-reset capacitive feedback. DC feedback current proportional to the output pulse height is provided by a linearized transconductor circuit. A control current is used to control the ratio of feedback current and thus the input amplifier time constant. The preamplifier is followed by a gain stage with programmable gain and offset.

The earlier ASICs developed at NOVA utilize a high-speed high-resolution comparator consisting of a differential gain amplifier with offset adjustment and a level-shifter stage to convert to CMOS output. This circuit, while of high performance, has for the present studies been replaced with a CMOS-inverter based high-speed comparator, pioneered in BETA chip. The threshold of a CMOS-inverter based comparator needs to be set dynamically, but this can be accommodated by inserting a small gap between the count gate intervals used for successive image frames. The benefit is a comparator of very high speed and very little circuit area. When the comparator output goes high the one shot circuit produces a small positive pulse which is used by the analog counter circuit.

Figure 23:
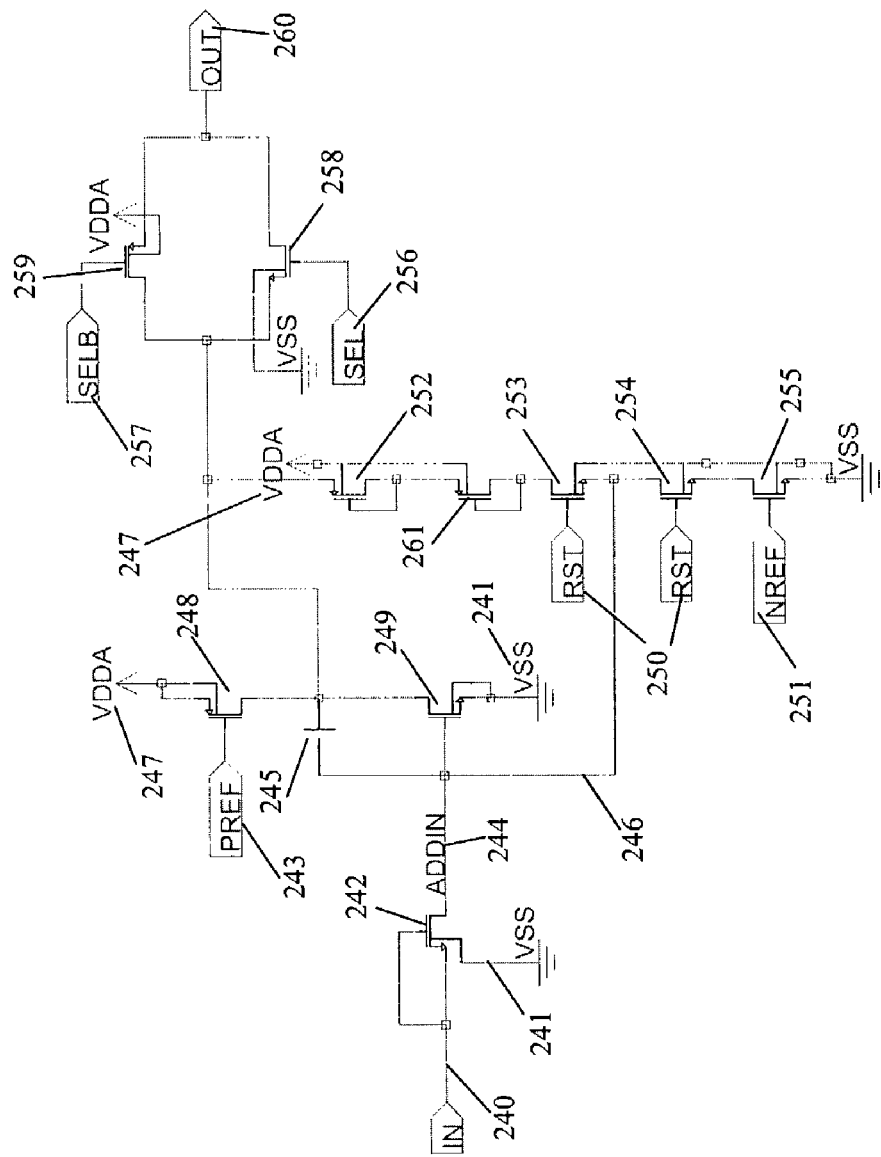
FIG. 23 is a transistor level diagram of the integration section of the analog counter.

The analog counter circuit shown in FIG. 23 has an input 240 where the output of the charge pump signal comes in. The analog uses a single stage amplifier with a large capacitive feedback. When the pulse is input from the one-shot 227, charge flows through the diode connected FET and is integrated on the capacitor. It is intended that the charge integrated is identical from one detected event to the next. A new complex reset circuit, which maximizes the useable voltage range is designed. A selection multiplexer (MUX) is also used, which is enabled when this channel is to be read out.

As indicated in several other places, the limitations imposed by the spatial and energy resolution requirements for the detector system make it imperative to use innovative concepts in designing the readout chip. Efforts to develop a compact design will concentrate preferably on the multi-channel analyzer (MCA); any gains made in this area are typically multiplied by the number of MCA bins and thus tend to carry more weight than size reductions of the preamplifier. The high-speed MCA architecture used in existing ASIC designs, such as the FESA and BETA ICs, is based on the combination of comparators and digital counters. Essentially this forms a flash A/D converter, except that no encoding logic is needed to produce an encoded output, since the MCA counters directly utilize the raw comparator outputs. Logic may be inserted to produce "one-hot" encoding from the thermometer code which results from the comparator array, but such logic is unnecessary—the counter data may be subtracted offline to produce the equivalent results. Error correction logic that would normally be present in a flash A/D is also omitted, in recognition of the fact that MCA errors are unimportant as long as they are dominated by the errors due to counting statistics and detector energy resolution.

The FESA and BETA ICs utilize a high-speed high-resolution comparator consisting of a differential gain amplifier with offset adjustment and a level-shifter stage to convert to CMOS output. This circuit, while of high performance, will for the present work be replaced with a CMOS-inverter based high-speed comparator 225. The threshold 226 of a CMOS-inverter based comparator needs to be set dynamically, but this can be accomodated by inserting a small gap between the count gate intervals used for successive image frames. The benefit is a comparator of very high speed and very little circuit area.

Figure 32:
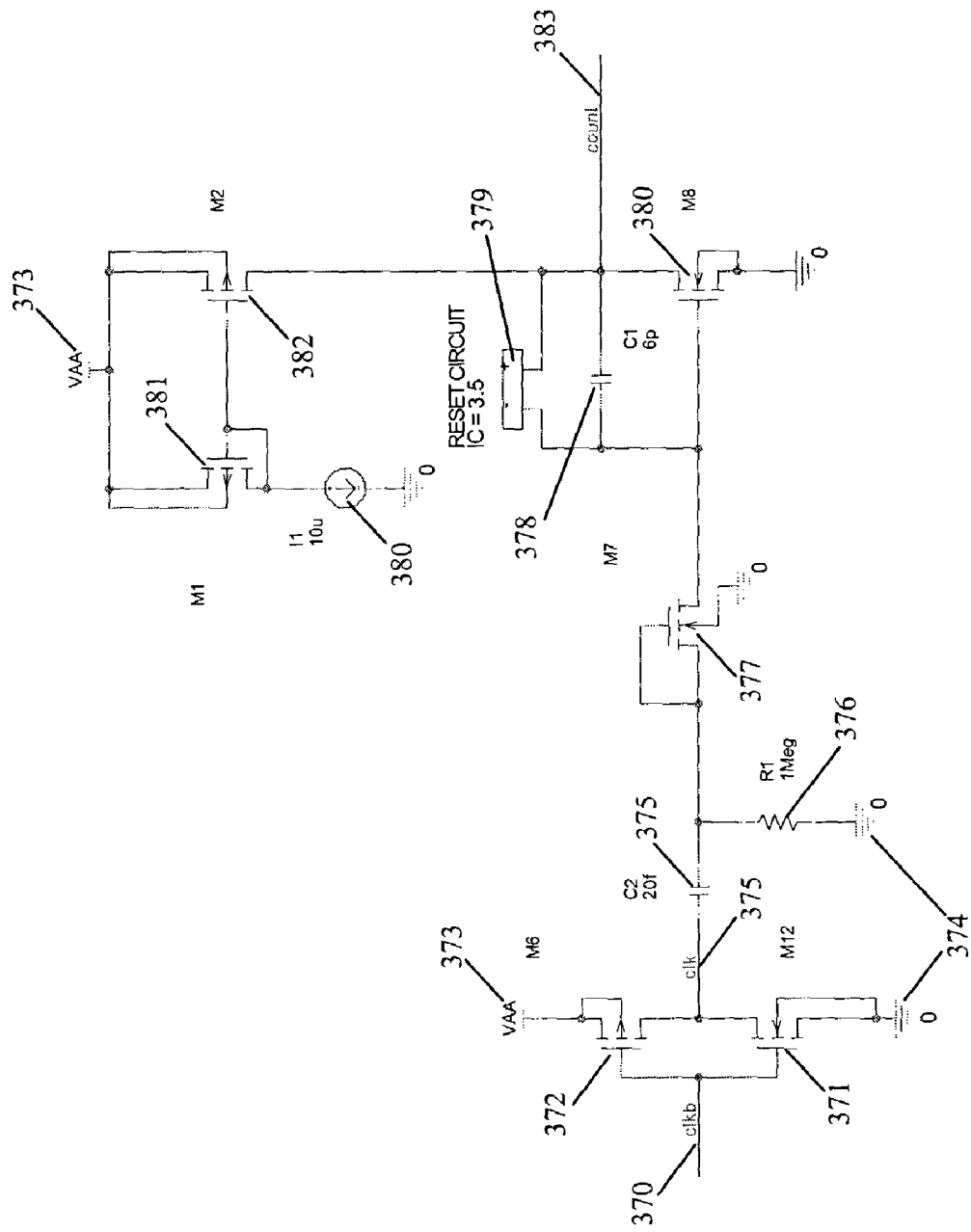
FIG. 32 is an analog counter circuit with a charge pump section developed for the fast two-dimensional sensor array IC.

As discussed above, further area will be saved by replacing the digital counters of the MCA (implemented as binary ripple counters in CMOS logic in the present FESA and BETA ICs) with "analog counters" 227, 228, 229, 230, 231, 232, 233 and FIG. 32—circuits which generate an output voltage proportional to the number of input clock pulses. Generating a charge pulse in response to each input pulse requires only a CMOS gate (an inverter 371 and 372 is shown here by way of example—in fact it can be the very inverter which makes up the comparator as described above), connected to a capacitor 228 and 375 and a diode-connected MOSFET 377. The charge pulses are accumulated by a conventional charge-sensitive amplifier 380, similar to the detector preamplifier 221. The noise and linearity specification for this charge-sensitive amplifier is not very stringent, and in fact, sufficient performance can be achieved using a single-transistor amplifier. The complete circuit is shown in FIG. 32, except that the reset circuit 379 is not shown.

The analog counter circuit also has the advantage of generating far smaller switching transients (in the counter itself there is in fact no CMOS logic switching), which is a significant advantage particularly in comparison with binary ripple counters. Instead of the analog counter a digital counter can be used. For the digital counter approach Grey code counters may be used to reduce switching transients (and to make them more uniform), but the extra logic increases the required circuit area considerably.

There are two modes of operation, which may be applied to the analog counter circuit. The most straightforward mode of operation for imaging is to count pulses (in each of the energy bins) during an externally determined gate interval, then to stop counting, read out that data and prepare for the next cycle. This mode is used in the FESA and BETA ICs, and can be applied to the proposed readout system by using a switched reset circuit in the analog counter. On the other hand, it is also quite feasible to use a resistive feedback around the integration capacitor of the analog counter, which will allow for continuous imaging application. This turns the analog counter into a ratemeter—the voltage out is continuously proportional to the rate of pulses (again, in each of the energy bins). In this case imaging can be done with zero deadtime.

The turning of the counting so that the data can be readout can be done many ways. For example, the one-shot can be stopped injecting charge into the integrator, or a switch turns of the input to the integrator, etc.

The optimal number of energy bins can have any value as long as the analog channel electronics and the number of counters fits into the single pixel area. This number of counters or energy bins is expected to be in the range 1-256. The comparator thresholds will be set sequentially during the refresh interval, saving power that would otherwise be used on a threshold resistor divider string, and providing flexibility to set the energy bins independently in applications.

A more advance version of the analog counter is shown in FIG. 23. Here the charge pump circuit 370, 371, 372, 373, 374, 375, 376, and 377 are not shown. The basic idea of these circuits is to combine a small "charge pump" which makes some few fC of charge in response to each "clock" pulse input 370, with a charge-integrator circuit. The NFET 249, the PFET 248 and its bias circuit, and the capacitor 245 form the charge-integrating amplifier. The "reset circuit" 253 and 254 is used to clear off the accumulated charge and set the charge-integrating amplifier output at the top end of its linear range. It will then "count down" in response to the input pulses. Simulations indicate very good linearity for the range of counts needed, and errors smaller than the errors of counting statistics. The reset circuit consists of diode-connected NFETS 252 and 261 (the one just below 252), which provide the voltage offset, pulldown current source NFET 255, and switch NFETS 253, 254. A single NFET for the switch and also a source follower to watch the integrator output voltage can be used. The output of the charge integrating amplifier is multiplexed (from the different channels) onto the readout ADC using the switch formed from NFET 258 and PFET 259. The output 260 goes to the readout ADC circuit (not shown). ADC then digitizes the voltage level and turns into a digital count. The counts may require calibration to reflect actual count rate from the number of x-ray photons interacting in the detector.

Figure 28:
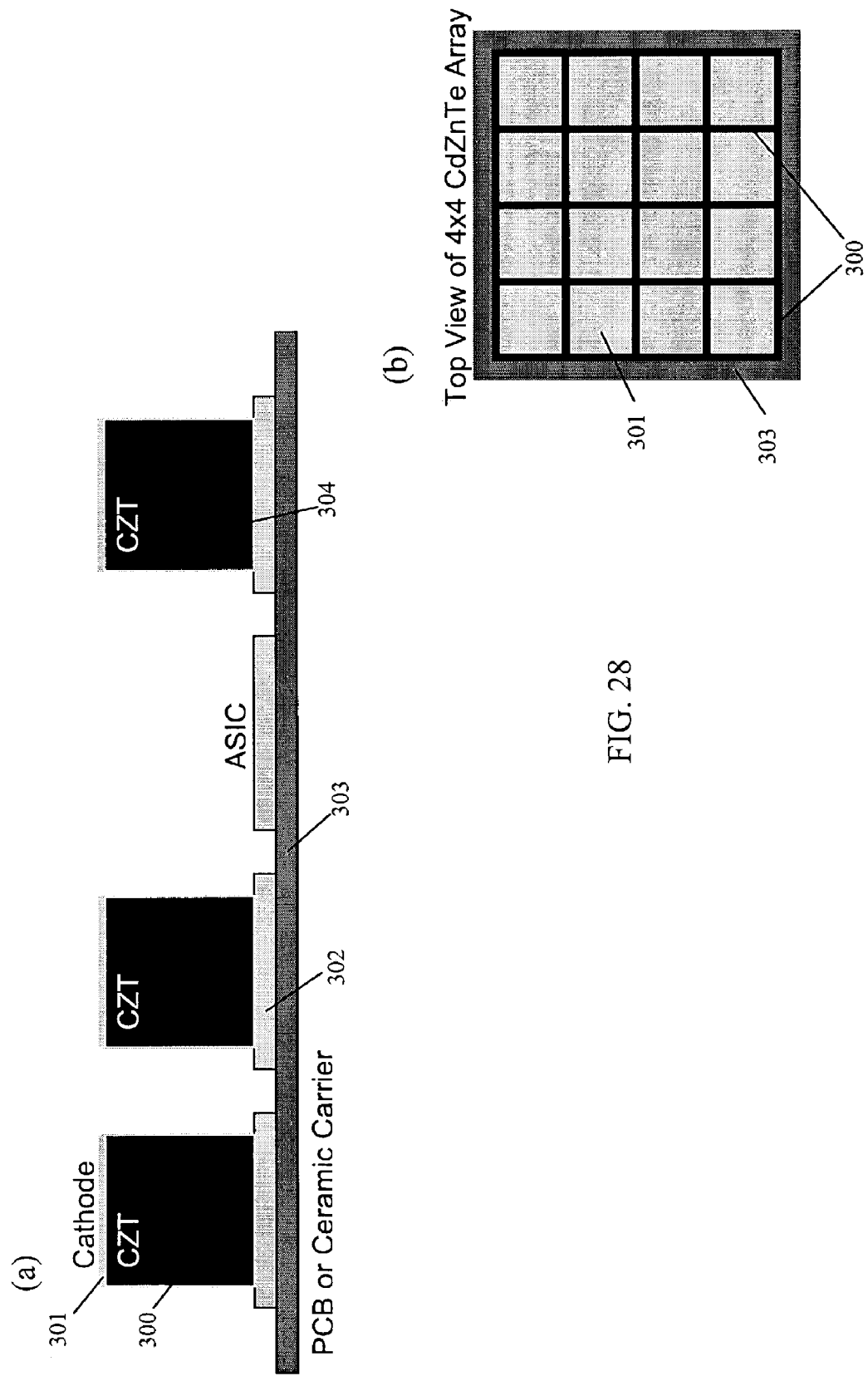
FIG. 28 is a drawing of large thickness CdZnTe pixel detectors mounted together to form an array.

FIG. 28 is showing another way of mounting the pixel detectors, especially the thick detectors. For the solid state detector, CdZnTe 300 detectors are used. These are thick detector with thicknesses of the order of 5 mm to 50 mm. The HV bias is applied to the cathode 301. The detector is bonded 304 to the ASIC 302. The ASIC 302 is then mounted and bonded onto the PCB 303. FIG. 28(b) shows the top view of a small 4×4 array. However, each sensor array may have many pixels. Therefore the imaging capability is very high. Unfortunately this design has gaps between detectors. To counter this the detector can be displaced to take images where there were gaps before, or can be used at an angle to the x-ray source. Or one or more arrays which covers the gaps can be placed under the first one.

This very fast two-dimensional HILDA ASIC has many high resolution imaging applications in medical and industrial imaging, security such as baggage and container inspection, NDI and NDE, astrophysics and nuclear physics and medicine. This chip may also be used for scanning type imaging. In this mode it can be used in the standard way as described above or it can be used in the TDI (Time Delayed Integration) mode used in medical imaging. In the later mode the rows (defined perpendicular to the scanning direction) of counters will be read out in time sequence at the same speed as the scanning motion but in reverse direction opposite to the scanning direction. When this is achieved each voxel inside the imaged object is integrated continuously until the column of pixels viewing that voxel is completely read out. This technique has many advantages. The statistics of imaging is higher. Bad pixels are averaged out and it is easy to calibrate for uniform imaging by using flood images, that is images are taken with no object and the output is calibrated to produce a uniform image. The scattered x-ray background radiation does not enter the detectors as the detector array is very narrow. The number and the cost of sensor arrays are much less. There are also other benefits, especially in medical imaging where the scatter grid can be eliminated, dose to the patient reduced and the strain on the x-ray tube is relaxed. RENA-2 ASIC can also lead to another type of two-dimensional imaging sensor arrays with and ASIC specifically designed for TDI type imaging.

Two-Dimensional TDI ASIC Design

A two-dimensional TDI imaging detector has been developed. The ASIC developed for this application is called MARY (MAmmogRaphY) chip. FIG. 33(a) shows a MARY chip coated by CdTe. MARY chip has also been used with other detectors such as CdZnTe, silicon, selenium, GaAs and CdTe where the detector material is indium bump bonded onto the MARY IC as described above. In this figure a new technique of mounting a detector onto MARY IC 390 and 393 is shown. In this new technique the detector material is not bonded using a process such as indium or solder bump bonding but the detector material is actually deposited 391 or grown on the ASIC. In this figure CdTe material 391 is shown deposited onto the active pixilated area of the MARY IC 390 and 393. It produces a crystalline substrate where the photons or particles produces electron-hole pairs and detected at the pixels of the readout MARY ASIC. Other materials such as $PbI_2$ has also been deposited onto the ASIC using a similar technique. The MARY chip has on board control and I/O circuitry 393 at the sides of the pixilated active area. The MARY chip 390 with the deposited CdTe is mounted onto a ceramic carrier 398 and wire bonded 392 onto the pads on the carrier. The carrier is then mounted onto a PCB 394. PCB has the peripheral circuits 399 to run the MARY ASIC 390. The top surface of the deposited CdTe 391 is coated with thin layer of gold to produce the cathode electrode for biasing. High Voltage bias is applied from a filter circuit 397 through a wire 396. The wire is bonded 395 on to the gold layer on top of the CdTe 391 using a conductive compound such as silver epoxy.

The technique of depositing detector material onto a pixel readout chip and its difference between bump bonding is demonstrated in FIG. 29. FIG. 29(a & b) show the bump bonding technique which described above. The FIG. 29(c & d) shows the new deposition technique. In this case the solid state detector material such as CdTe 310 is deposited directly on the pixels pads 316. The pixel pads 316 is fabricated differently than the pads 314 for bump bonding so that the deposited solid state detector material can make good electrical and mechanical contact. This is essential for achieving a high quality and functioning detector. The interpixel gaps 316 are also important as there should be no electrical contact in these regions and also the chemical compounds in the detector material must not be allowed to diffuse into the ASIC substrate and cause loss of function or performance.

The MOCVD (metal-organic chemical vapor depostion) process is employed in order to deposit a thick layer of CdTe directly onto a fully-configured, qualified, small MARY readout chip. Small MARY IC contains a 128×192 pixel array, each square pixel being 50 microns in edge length. These new gold pads were specifically deposited by thermal evaporation onto the MARY IC specifically for depositing CdTe detector material. It also enlarges the pixel pad area to 35×35 micron gold contact pads on each pixel.

The New ASIC Design for TDI Sensor Arrays

Figure 30:
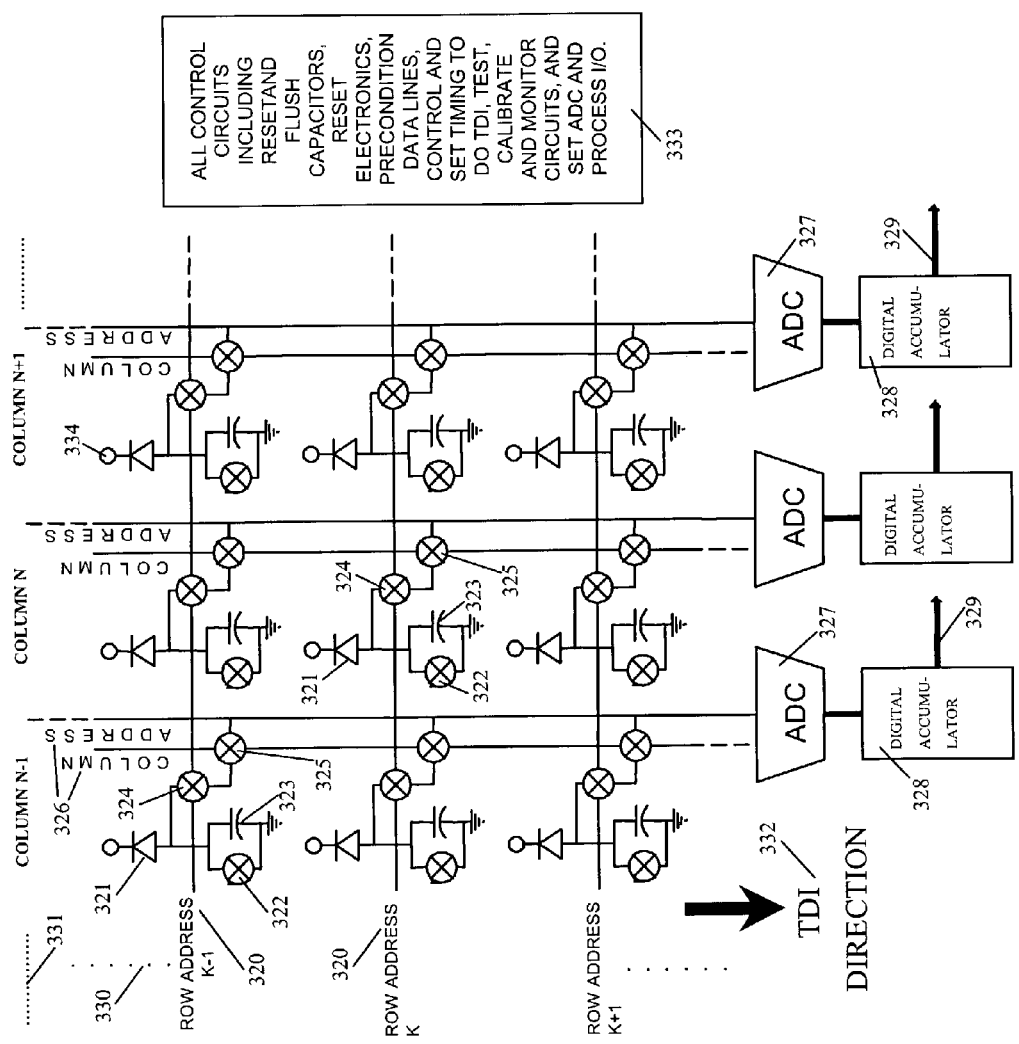
FIG. 30 is a block circuit diagram of a TDI based two-dimensional readout ASIC design.

A new ASIC design for these pixel detectors is developed using a CMOS process instead of the CCD process used in the MARY IC. The CMOS process is readily available and lower cost than the CCD process. FIG. 30 shows the new circuit consisting of a matrix of pixel circuits arranged in rows 320 and columns 331, and an Analog-to-Digital Converter (ADC) (327) and a Digital Accumulator (328) associated with each column. Each pixel circuit contains a detector pixel (321), a charge-integrating capacitor (323) and transmission-gate switches 322, 324, and 325.

In operation, the detectors 321 injects charge onto integrating capacitor 323 as long as t-gate switches 322, 324, and 325 are open (off). In some sequence, the charge that has been accumulated in each pixel is gated onto the input of the ADC 327 by activating the column address 326 and row address 320 of that pixel, closing the row and column t-gate switches 324 and 325. The ADC converts the charge to a digital number, which is stored in the accumulator 328. The pixel just read is then reset by opening the row or column t-gate and closing the reset t-gate 322, dumping the accumulated charge. The reset t-gate is then opened and charge from the detector again begins to accumulate.

In this fashion, digital numbers representing the charge accumulated in the pixels are stored in the digital accumulator 328. Upon command of external control circuitry not shown, these numbers can be placed on the data bus 329 and passed to computational circuits and/or computer(s) for interpretation.

In another embodiment, a different circuit can be used. In this embodiment, first, the integrating capacitors 345 are discharged by causing the r and s transmission gates (348 and 347) to conduct. Next, while holding the bottom end of the integrating capacitor 345 at a positive voltage (359) with the s-transmission gate 347, the detector pixels, represented by diodes 340, inject charge from their respective parts of the image, which is routed to one capacitor for each detector by the a, b, c, and d-transmission gates (341, 342, 343, and 344). As the image moves from one column to the next, the control signals a, b, c, and d are sequenced (360) so that the charge associated with each part of the image continues to be accumulated on the same capacitor.

At the end of the integration interval, The a, b, c, and d transmission gates are opened, as are the s-transmission gates 347. The charge on each integration capacitor 345 is then flushed to the analog output 357 by connecting the bottom of each capacitor, in turn, to a negative voltage 358, using transmission gates 346, 349, 350, and 351, and at the same time connecting the top of that capacitor to the output by causing transmission gates 353, 354, 355, and 356 to conduct in the same sequence. After the charge has been flushed, the whole process repeats, beginning with the discharge of the integrating capacitors 345.

Although only four columns are shown in this diagram, any number of rows and columns could be used by extending the sequence of operations. The rows and columns can also be grouped together into groups and each group than treated separately. Also the column groups can be also used in the TDI mode to extend TDI to the whole ASIC. Grouping helps image large fluxes of photons as it reduces the need for a very large size storage capacitor 345.

Figure 31:
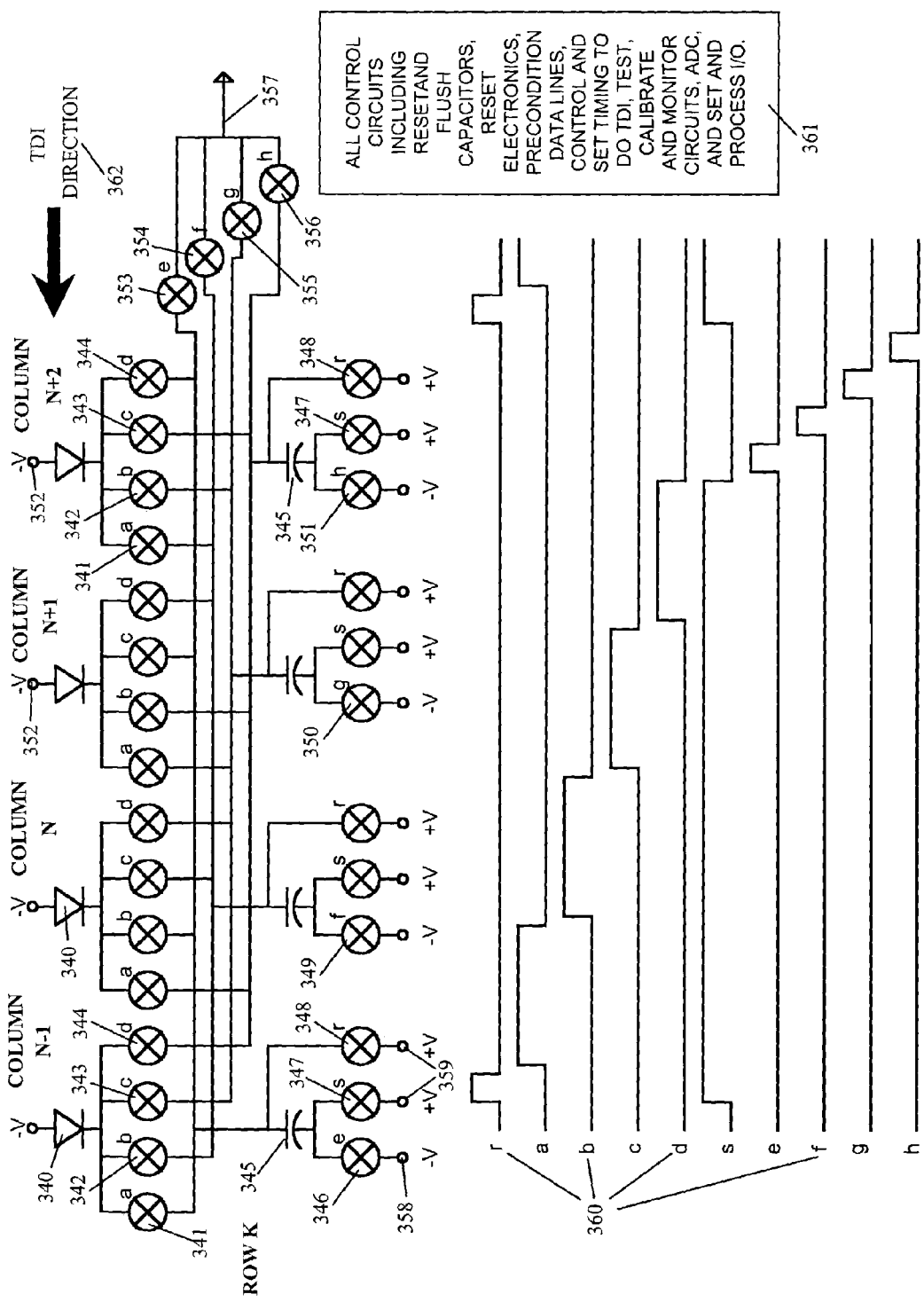
FIG. 31 is a block circuit diagram of a TDI based two-dimensional readout ASIC design using a different technique.

The sequence described is not the only one possible. One alternative would be to flush the charge on one capacitor to the output at the end of each integration phase a, b, c, d, . . . followed by discharging that capacitor. This would implement a continuous scheme of integration in contrast to the lumped scheme described in FIG. 31. The same circuit is employed, but the timing signals 360 are different in this case. In this embodiment, the grouping of rows and columns can also be done as described above.

In another embodiment, an analog shift register or an integrating analog shift register can be used instead of the switches a, b, c, . . . and the storage capacitors 345 to move the charge in the TDI direction.

The New ASIC Design for a TDI Sensor Array Using Photon Counting

The MARY ASIC and the new ASIC integrates the total charge comes from interaction of many photons and does not detect individual photons. However, as described above several times the RENA-2 ASIC and its other embodiments can do fast and excellent photon counting, measure energy of the photon accurately and produce excellent spectral, hyperspectral or MCA type information. Therefore, it is possible to apply these photon counting type circuits for the TDI ASIC. In this case the photons are counted one by one and their energy recorded and/or discriminated into counts (energy bins) and these counts are then formed into TDI imaging now with spectral information using the energy of each photon individually. Now the difference is that the TDI images can be made into spectra or divided into energy bins. The new hyperspectral imaging can help implementation of these images in different applications. For example, they help diagnostics in medical imaging, improve explosive detection in security applications, etc. The time delayed integration (TDI) of the hyperspectral, MCA or spectral data supplied by the new ASIC and the pixel sensor array can be performed external to the ASIC in a data acquisition and analysis computer, or it can be carried out on the ASIC using accumulators such as 328 or it can be performed external to the ASIC on the data acquisition electronics board with FPGA(s) (Field Programmable Gate Array(s)) or microprocessors. This kind of chip can be made in one-or two-dimensional configuration depending on the application. The chips architecture stays mostly similar to what is described above for one-dimensional and two-dimensional ASICs.

If the energy of each photon or particle is digitized such as the fast BETA IC and/or the MCA system discussed above the new chip can be called a digital TDI IC. That is, the TDI is performed on digital numbers obtained from each channel or pixel. This digital information can contain the data rate or number of counts of each photon detected at each channel and also the energy information of the detected photon. The count and energy information can be provided, processed or used individually for each photon or in count rates or in energy bins. This chip digital TDI chip can be made both in one-dimensional or two-dimensional configurations. The TDI function can be performed by circuitry on the digital TDI chip, by external FPGA(s), or by microprocessors or by an external computer. The chips architecture stays mostly similar to what is described above for one-dimensional and two-dimensional ASICs.

What is claimed is:

1. A hybrid pixel detector comprising:
   at least one integrated circuit with a plurality of channels arranged in a plurality of rows and a plurality of columns; and
   at least one detector comprising a plurality of pixels arranged in a plurality of rows and a plurality of columns, wherein said plurality of pixels is directly connected to said plurality of channels, and wherein at least one channel of said plurality of channels further comprises:
   at least one input that receives at least one signal from at least one pixel of said at least one detector, wherein said at least one input is adjacent to at least two other inputs;
   at least one amplifier to amplify said at least one signal;
   at least one gain control circuit, and at least one offset control circuit connected to at least one of said at least one amplifier;
   at least one comparator circuit connected to at least one of said at least one amplifier to produce at least one digital signal from said at least one signal, wherein said at least one digital signal is produced when said at least one signal is above at least one threshold of said at least one comparator circuit;
   at least one threshold control circuit connected to said at least one comparator circuit;
   at least one counter connected to said at least one comparator for counting said at least one digital signal; and
   at least one output circuit to output at least one of said at least one counter.

2. The hybrid pixel detector of claim 1, wherein a supply current for an input transistor of said at least one amplifier is adjusted to control noise level.

3. The hybrid pixel detector of claim 1, wherein a gate size of an input transistor of said at least one amplifier is configured to match a capacitance of said at least one input.

4. The hybrid pixel detector of claim 1, further comprising at least one shaper circuit connected to said at least one amplifier.

5. The hybrid pixel detector of claim 1, further comprising at least one register circuit coupled to said at least one counter.

6. The hybrid pixel detector of claim 1, wherein said at least one threshold control circuit includes at least one digital-to-analog converter (DAC).

7. The hybrid pixel detector of claim 1, wherein at least one of said at least one comparator circuit is set to a different threshold than at least one other of said at least one comparator circuit to produce at least one output for a range of said at least one signal.

8. The hybrid pixel detector of claim 1, wherein at least two of said at least one threshold of at least one comparator circuit are set to different values from one another, and wherein at least two of said at least one counter produces data corresponding to at least one energy window between said at least two of said at least one threshold.

9. The hybrid pixel detector claim 1, wherein at least one multiplex circuit is used to multiplex output of said at least one output circuit.

10. The hybrid pixel detector of claim 1, wherein said at least one comparator circuit produces at least one trigger signal and said at least one output circuit outputs data from said at least one counter when said at least one trigger signal is received.

11. The hybrid pixel detector of claim 1, wherein said at least one amplifier includes at least one resistive feedback.

12. The hybrid pixel detector integrated circuit of claim 11, wherein at least one of said at least one resistive feedback includes at least one MOSFET transistor.

13. A hybrid pixel detector comprising:
   at least one integrated circuit with a plurality of channels arranged in a plurality of rows and a plurality of columns; and
   at least one detector comprising a plurality of pixels arranged in a plurality of rows and a plurality of columns, wherein said plurality of pixels is directly connected to said plurality channels, and wherein each channel of said plurality of channels further comprises:
   at least one input that receives at least one signal from at least one pixel of said at least one detector, wherein said at least one input is adjacent to at least two other inputs;
   at least one amplifier connected to said at least one input to amplify said at least one signal;
   at least one comparator circuit connected to said at least one amplifier to produce at least one digital signal from said at least one signal when said at least one signal is above at least one threshold of said at least one comparator circuit;
   at least one counter connected to said at least one comparator circuit for counting said at least one digital signal; and
   at least one output circuit to output at least one of said at least one counter.

14. The hybrid pixel detector of claim 13, wherein a gate size of an input transistor of said at least one amplifier is configured to match a capacitance of said at least one input.

15. The hybrid pixel detector of claim 13, further comprising a circuit that selectively reads out said at least one output circuit of said at least one channel.

16. The hybrid pixel detector of claim 13, wherein said at least one amplifier includes at least one resistive feedback.

17. The hybrid pixel detector of claim 13, wherein at least one digital-to-analog converter (DAC) is used to adjust a threshold of said at least one comparator.

18. A hybrid pixel detector comprising:
   an integrated circuit with a plurality of channels arranged in a plurality of rows and a plurality of columns; and
   at least one detector comprising a plurality of pixels arranged in a plurality of rows and a plurality of columns, wherein said plurality of pixels is directly connected to said plurality of channels, and wherein each channel of said plurality of channels further comprises:
   at least one input that receives at least one signal from at least one pixel of said at least one detector, wherein said at least one input is adjacent to at least two other inputs;
   at least one amplifier connected to said at least one input to amplify said at least one signal;
   at least one offset control circuit connected to said at least one amplifier;
   at least one shaping circuit shapes said at least one signal;
   at least one comparator circuit connected to said at least one shaping circuit to produce at least one trigger signal;
   at least one of at least one peak hold circuit, at least one track and hold circuit, and at least one sample and hold circuit connected to said at least one shaping circuit to detect at least one peak of said at least one signal; and
   at least one output circuit that outputs at least one of at least one peak of said at least one signal, said at least one trigger signal, and at least one shaped said at least one signal.

19. The hybrid pixel detector claim 18, wherein said at least one trigger signal initiates a readout cycle of said integrated circuit.

20. The hybrid pixel detector claim 18, wherein said at least one amplifier includes at least one resistive feedback.

21. The hybrid pixel detector of claim 18, further comprising at least one register connected to said plurality of channels to store at least one channel number corresponding at least one channel that received said at least one signal.

22. A method of constructing a hybrid pixel detector, comprising:
    providing an integrated circuit with a plurality of channels arranged in a two-dimensional array, wherein each of said plurality of channels comprises a channel input adjacent to at least two other inputs, and wherein a signal is received by said channel input,
    providing a detector comprising a plurality of pixels arranged in a plurality of rows and a plurality of columns;
    directly connecting said plurality of pixels to said plurality of channels;
    coupling an amplifier to said plurality of channels to process said signal to produce a processed signal;
    controlling at least one of a gain and an offset of said amplifier;
    comparing said processed signal with a threshold of a comparator circuit to produce a digital signal;
    adjusting said threshold using a threshold control circuit;
    counting said digital signal using a counter to produce a count; and
    outputting said count.

23. The method of claim 22, wherein a supply current for an input transistor of at least one of said at least one amplifier is adjustable.

24. The method of claim 22, further comprising controlling at least one of said at least one threshold.

25. The method of claim 22, wherein at least one of said at least one threshold is set to a different value than at least one other of said at least one threshold.

26. The method of claim 22, wherein at least two of said at least one threshold set to different values from one another, and wherein at least two of said at least one counter produces data corresponding to at least one energy window.

27. The method of claim 22, further comprising producing at least one trigger signal to initiate a readout cycle.

28. A method of constructing a hybrid pixel detector comprising:
    providing an integrated circuit with a plurality of channels arranged in a two-dimensional array, wherein each of said plurality of channels comprises a channel input adjacent to at least two other inputs, and wherein a signal is received by said channel input;
    providing a detector comprising a plurality of pixels arranged in a plurality of rows and a plurality of columns;
    directly connecting said plurality of pixels to said plurality of channels;
    coupling an amplifier to said plurality of channels to process said signal to produce a processed signal;
    comparing said processed signal with a threshold of a comparator circuit to produce a digital signal;
    counting said digital signal using a counter to produce a count; and
    outputting said count.

29. The method of claim 28, further comprising controlling the supply current for the input transistor of at least one of said at least one amplifier.

30. The method of claim 28, further comprising controlling at least one of said at least one threshold.

31. The method of claim 28, wherein at least one of said at least one threshold is set to a different value than at least one other of said at least one threshold.

32. The method of claim 28, wherein at least two of said at least one threshold set to different values from one another, and wherein at least two of said at least one counter produces data corresponding to at least one energy window.

33. The method of claim 28, further comprising producing at least one trigger signal to initiate a readout cycle.

34. A method of constructing a hybrid pixel detector comprising:
    providing an integrated circuit with a plurality of channels arranged in a two-dimensional array, wherein each of said plurality of channels comprises a channel input adjacent to at least two other inputs, and wherein a signal is received by said channel input;
    providing a detector comprising a plurality of pixels arranged in a plurality of rows and a plurality of columns;
    directly connecting said plurality of pixels to said plurality of channels;
    coupling an amplifier to said plurality of channels to process said signal to produce a processed signal;
    controlling at least one of a gain and an offset of said amplifier;
    processing said processed signal to produce a shaped processed signal;
    comparing said shaped processed signal with a threshold of a comparator to produce a trigger signal;
    detecting a peak of said shaped processed signal by using at least one of a peak hold circuit, a track and hold circuit, and a sample and hold circuit; and
    outputting at least one of said peak of said shaped processed signal, said trigger signal, and said shaped processed signal.

35. The method of claim 34, further comprising adjusting a resistance of a feedback resistor for the input transistor of said at least one amplifier.

36. A hybrid pixel detector comprising:
    at least one integrated circuit with a plurality of channels arranged in a two-dimensional array; and
    at least one detector comprising a plurality of pixels arranged in a plurality of rows and a plurality of columns, wherein said plurality of pixels is directly connected to said plurality channels, and wherein at least one channel of said plurality of channels further comprises:
        at least one input that receives at least one signal from at least one pixel of said at least one detector, wherein said at least one input is adjacent to at least two other inputs;
        at least one amplifier connected to said at least one input to amplify said at least one signal;
        at least one shaping circuit shapes said at least one signal;
        at least one comparator circuit connected to said at least one shaping circuit to produce at least one trigger signal;
        at least one of at least one peak hold circuit, at least one track and hold circuit, and at least one sample and hold circuit connected to said at least one shaping circuit to detect at least one peak of said at least one signal; and
        at least one output circuit that outputs at least one of at least one peak of said at least one signal, said at least one trigger signal, and at least one shaped said at least one signal.

* * * * *